United States Patent
Klubek et al.

(10) Patent No.: US 9,620,721 B2
(45) Date of Patent: *Apr. 11, 2017

(54) OLEDS HAVING HIGH EFFICIENCY AND EXCELLENT LIFETIME

(71) Applicant: Global OLED Technology LLC, Herndon, VA (US)

(72) Inventors: Kevin P. Klubek, West Henrietta, NY (US); Liang-Sheng Liao, Rochester, NY (US); Viktor V. Jarikov, Rocester, NY (US); Denis Y. Kondakov, Rochester, NY (US); William J. Begley, Webster, NY (US); Michele L. Ricks, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 87 days.

This patent is subject to a terminal disclaimer.

(21) Appl. No.: 14/175,242

(22) Filed: Feb. 7, 2014

(65) Prior Publication Data

US 2014/0151676 A1 Jun. 5, 2014

Related U.S. Application Data

(63) Continuation of application No. 11/668,515, filed on Jan. 30, 2007, now Pat. No. 8,795,855.

(51) Int. Cl.
*H01L 29/08* (2006.01)
*H01L 35/24* (2006.01)
(Continued)

(52) U.S. Cl.
CPC ........ *H01L 51/0058* (2013.01); *H01L 51/006* (2013.01); *H01L 51/0052* (2013.01);
(Continued)

(58) Field of Classification Search
USPC ........... 257/40, 103, E51.001; 313/504, 506; 428/690, 704, 917
See application file for complete search history.

(56) References Cited

U.S. PATENT DOCUMENTS 3,172,862 A 3/1965 Gurnee et al.
3,173,050 A 3/1965 Gurnee
(Continued)

FOREIGN PATENT DOCUMENTS

EP 0732868 A1 9/1996
EP 0786925 A2 7/1997
(Continued)

OTHER PUBLICATIONS

"Double Injection Electroluminescence in Anthracene", RCA Review, vol. 30, pp. 322-334, 1969.
(Continued)

*Primary Examiner* — Bijan Ahvazi
(74) *Attorney, Agent, or Firm* — Global OLED Technology LLC

(57) ABSTRACT

An OLED device comprises a cathode, an anode, and has therebetween a light-emitting layer wherein the light-emitting layer comprises (a) a 2-arylanthracene compound and (b) a light-emitting second anthracene compound having amino substitution at a minimum of two positions, wherein at least one amine is substituted at the 2 position of the second anthracene compound.

9 Claims, 1 Drawing Sheet

(51) Int. Cl.
  *H01L 51/00* (2006.01)
  *B32B 9/04* (2006.01)
  *B32B 9/00* (2006.01)
  *B32B 15/00* (2006.01)
  *H01L 51/50* (2006.01)

(52) U.S. Cl.
  CPC ...... *H01L 51/0059* (2013.01); *H01L 51/0081* (2013.01); *H01L 51/5012* (2013.01); *H01L 2251/308* (2013.01)

(56) References Cited

U.S. PATENT DOCUMENTS

| | | | |
|---|---|---|---|
| 3,180,730 A | 4/1965 | Klupfel et al. | |
| 3,567,450 A | 3/1971 | Brantly et al. | |
| 3,658,520 A | 4/1972 | Brantly et al. | |
| 3,710,167 A | 1/1973 | Dresner | |
| 4,341,852 A | 7/1982 | Mattes et al. | |
| 4,356,429 A | 10/1982 | Tang | |
| 4,539,507 A | 9/1985 | VanSlyke et al. | |
| 4,720,432 A | 1/1988 | VanSlyke et al. | |
| 4,769,292 A | 9/1988 | Tang et al. | |
| 4,885,211 A | 12/1989 | Tang et al. | |
| 4,885,221 A | 12/1989 | Tsuneeda | |
| 5,059,861 A | 10/1991 | Littman et al. | |
| 5,059,862 A | 10/1991 | Van Slyke et al. | |
| 5,061,569 A | 10/1991 | VanSlyke et al. | |
| 5,247,190 A | 9/1993 | Friend et al. | |
| 5,276,380 A | 1/1994 | Tang | |
| 5,283,182 A | 2/1994 | Powell et al. | |
| 5,294,870 A | 3/1994 | Tang et al. | |
| 5,405,709 A | 4/1995 | Littman et al. | |
| 5,503,910 A | 4/1996 | Matsuura et al. | |
| 5,552,678 A | 9/1996 | Tang et al. | |
| 5,593,788 A | 1/1997 | Shi et al. | |
| 5,608,287 A | 3/1997 | Hung et al. | |
| 5,677,572 A | 10/1997 | Hung et al. | |
| 5,683,823 A | 11/1997 | Shi et al. | |
| 5,688,551 A | 11/1997 | Littman et al. | |
| 5,703,436 A | 12/1997 | Forrest et al. | |
| 5,714,838 A | 2/1998 | Haight et al. | |
| 5,739,545 A | 4/1998 | Guha et al. | |
| 5,776,622 A | 7/1998 | Hung et al. | |
| 5,776,623 A | 7/1998 | Hung et al. | |
| 5,837,391 A | 11/1998 | Utsugi | |
| 5,851,709 A | 12/1998 | Grand et al. | |
| 5,969,474 A | 10/1999 | Arai | |
| 5,981,306 A | 11/1999 | Burrows et al. | |
| 6,020,078 A | 2/2000 | Chen et al. | |
| 6,066,357 A | 5/2000 | Tang et al. | |
| 6,137,223 A | 10/2000 | Hung et al. | |
| 6,140,763 A | 10/2000 | Hung et al. | |
| 6,172,459 B1 | 1/2001 | Hung et al. | |
| 6,208,075 B1 | 3/2001 | Hung et al. | |
| 6,226,890 B1 | 5/2001 | Boroson et al. | |
| 6,237,529 B1 | 5/2001 | Spahn | |
| 6,251,531 B1 | 6/2001 | Enokida et al. | |
| 6,278,236 B1 | 8/2001 | Madathil et al. | |
| 6,284,393 B1 | 9/2001 | Hosokawa et al. | |
| 6,337,492 B1 | 1/2002 | Jones et al. | |
| 6,396,209 B1 | 5/2002 | Kido et al. | |
| 6,468,676 B1 | 10/2002 | Ueda et al. | |
| 6,614,176 B2 | 9/2003 | Kim et al. | |
| 6,627,333 B2 | 9/2003 | Hatwar | |
| 6,696,177 B1 | 2/2004 | Hatwar | |
| 6,720,573 B2 | 4/2004 | Son et al. | |
| 6,914,269 B2 | 7/2005 | Nakamura | |
| 6,951,693 B2 | 10/2005 | Hosokawa et al. | |
| 7,037,601 B2 | 5/2006 | Hatwar | |
| 8,795,855 B2* | 8/2014 | Klubek ............... H01L 51/0052 257/103 |
| 2002/0015859 A1 | 2/2002 | Watanabe et al. | |
| 2002/0025419 A1 | 2/2002 | Lee et al. | |
| 2002/0086180 A1 | 7/2002 | Seo et al. | |
| 2003/0072966 A1 | 4/2003 | Hosokawa et al. | |
| 2004/0067387 A1 | 4/2004 | Kim et al. | |
| 2004/0076583 A1 | 4/2004 | Faeldt et al. | |
| 2004/0113547 A1 | 6/2004 | Son et al. | |
| 2004/0207318 A1 | 10/2004 | Lee et al. | |
| 2004/0255857 A1 | 12/2004 | Chow et al. | |
| 2005/0038296 A1 | 2/2005 | Hosokawa et al. | |
| 2005/0064233 A1 | 3/2005 | Matsuura et al. | |
| 2005/0106415 A1 | 5/2005 | Jarikov et al. | |
| 2005/0211958 A1* | 9/2005 | Conley ................... C09K 11/06 252/583 |
| 2005/0260442 A1* | 11/2005 | Yu ......................... C07C 211/61 428/690 |
| 2006/0033421 A1 | 2/2006 | Matsuura et al. | |
| 2006/0040131 A1 | 2/2006 | Klubek et al. | |
| 2006/0051615 A1 | 3/2006 | Kanno et al. | |
| 2006/0141287 A1 | 6/2006 | Klubek et al. | |
| 2006/0204783 A1* | 9/2006 | Conley ................... C09K 11/06 428/690 |
| 2007/0003786 A1 | 1/2007 | Royster, Jr. | |
| 2007/0092759 A1* | 4/2007 | Begley ................. H01L 51/0058 428/690 |

FOREIGN PATENT DOCUMENTS

| | | |
|---|---|---|
| EP | 0891121 A1 | 1/1999 |
| EP | 1009041 A2 | 6/2000 |
| EP | 1029909 A1 | 8/2000 |
| EP | 0176368 A2 | 2/2001 |
| EP | 1182244 A1 | 2/2002 |
| EP | 1187235 A2 | 3/2002 |
| EP | 1469533 A2 | 10/2004 |
| EP | 1478032 A2 | 11/2004 |
| EP | 1480280 A2 | 11/2004 |
| JP | 3-142378 | 6/1991 |
| JP | 2001-267080 | 9/2001 |
| JP | 2003-115387 | 4/2003 |
| JP | 2003-146951 | 5/2003 |
| JP | 2003-313156 | 11/2003 |
| JP | 2004-91334 | 3/2004 |
| JP | 2004-200162 | 7/2004 |
| JP | 2004-311184 | 11/2004 |
| WO | WO02/43449 A1 | 5/2002 |
| WO | WO2007/021117 A1 | 2/2007 |
| WO | WO2007/058503 A1 | 5/2007 |
| WO | WO2007/081179 A1 | 7/2007 |
| WO | WO2008/013399 A1 | 1/2008 |

OTHER PUBLICATIONS

Tang et al. [j. Appl. Phys. vol. 65, pp. 3610-3616, 1989].
P-1 and P-2 (eq. C) See J. Hassan, M. Sevignon, C. Gozzi, E. Schulz, M. Lemaire, Marc, Chem Rev, 102, 1359 (2002).
Hodge et al. (Chem. Commun. (Cambridge), 1, 73-74 1997).
Hartwig et al. (J. Org. Chem., 64, 5575-80 (1999)).
Smet et al. (Tetrahedron, 55, 7859-74 (1999)).
Lange's handbook of Chemistry, 12th ED., McGraw Hill, 1979, Table 3-12, pp. 3-134 to 3-138.

* cited by examiner

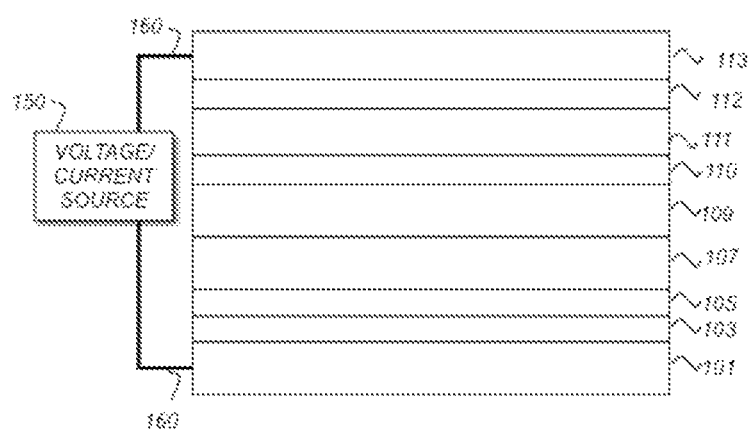

OLEDS HAVING HIGH EFFICIENCY AND EXCELLENT LIFETIME

CROSS-REFERENCE TO RELATED APPLICATIONS

This application is a continuation application of U.S. patent application Ser. No. 11/668,515, filed on Jan. 30, 2007, which is incorporated by reference for all purposes as if fully set forth herein.

FIELD OF INVENTION

This invention relates to organic electroluminescent (EL) devices. More specifically, this invention relates to highly efficient green devices having long lifetimes.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322-334, 1969; and Dresner U.S. Pat. No. 3,710,167, issued Jan. 9, 1973. The organic layers in these devices, usually composed of a polycyclic aromatic hydrocarbon, were very thick (much greater than 1 µm). Consequently, operating voltages were very high, often >100V.

More recent organic EL devices include an organic EL element consisting of extremely thin layers (e.g. <1.0 µm) between the anode and the cathode. Herein, the term "organic EL element" encompasses the layers between the anode and cathode electrodes. Reducing the thickness lowered the resistance of the organic layer and has enabled devices that operate at a much lower voltage. In a basic two-layer EL device structure, described first in U.S. Pat. No. 4,356,429, one organic layer of the EL element adjacent to the anode is specifically chosen to transport holes, therefore, it is referred to as the hole-transporting layer, and the other organic layer is specifically chosen to transport electrons, referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by Tang et al [*J. Appl. Phys. Vol.* 65, Pages 3610-3616, 1989]. Furthermore, in some preferred device structures, the LEL is constructed of a doped organic film comprising an organic material as the host and a small concentration of a fluorescent compound as the dopant. Improvements in EL efficiency, chromaticity, and lifetime have been obtained in these doped OLED devices by selecting an appropriate dopant-host composition. The dopant, being the dominant emissive center, is selected to produce the desirable EL colors. There are known examples of green dopants. Green emitting coumarin derivatives have been reported by Chen et al. in U.S. Pat. No. 6,020,078, Inoe et al. in JP 3142378, and Tang et al. in U.S. Pat. No. 4,769,292. While coumarin derivatives have been shown to provide OLED devices with high EL efficiencies, it has been found that a long device operational lifetime is lacking Green emitting quinacridone derivatives have been reported by Shi et al. in U.S. Pat. No. 5,593,788 and Tamano et al. in JP 3509383. While it has been shown that quinacridone derivatives provide a long operational life, use of these derivatives results in lower device efficiencies.

Aminoanthracene derivatives have been shown to be useful in OLEDs. Enokida et al., in U.S. Pat. No. 6,251,531, and Matsuura and co-workers in US2006/0033421 and US2005/0064233 describe certain 9,10 substituted aminoanthracenes for use as light-emitting materials, however these types of materials have generally been shown to have poor lifetimes, low efficiencies or they emit in the yellow-green to yellow regions of the visible spectrum, meaning that the CIE x coordinate is above 0.30.

Ichinosawa et al., in JP 2003/146951 and JP 2004/091334, describe anthracene materials substituted with phenylene diamine groups in the 2,6 positions that are useful as hole-transporting materials for EL devices and provide examples of their use in a layer adjacent to the LEL.

Toshio et al., in JP 1995/109449, provides examples of anthracene-type materials substituted with tertiary amine groups and their use as light-emitting materials without being incorporated into an LEL host material. It is known that having a single component LEL generally results in low efficiencies and short lifetimes.

Hosokawa and co-workers, in US 2003/0072966, US 2005/0038296, U.S. Pat. No. 6,951,693 and Ikeda et al., in JP 2003/313156 also describe certain tertiary amino-anthracene compounds for use in OLED devices. However, reported luminous efficiencies are low and device lifetimes are poor.

However, despite these advances in the research of green emitting materials, there is still a need for green OLED devices that combine high luminous efficiency with long operational lifetime while maintaining excellent color purity.

SUMMARY OF THE INVENTION

It is an object of this invention to make an OLED device having high luminous efficiency, excellent operational lifetime and also having excellent color purity.

These objects are achieved by an OLED device comprising a cathode, an anode, and having therebetween a light-emitting layer wherein the light-emitting layer comprises (a) a 2-arylanthracene compound and (b) a light-emitting second anthracene compound having amino substitution at a minimum of two positions, wherein at least one amine is substituted at the 2 position.

Advantageous Effect of the Invention

An advantage of the present invention is that OLED devices with long operational lifetime and excellent luminance efficiency can be achieved.

Another advantage of the present invention is that it provides OLED devices that have excellent green color purity.

Another advantage of the present invention is that it provides OLED devices that are suitable for display applications.

BRIEF DESCRIPTION OF THE DRAWINGS

FIG. 1 shows a cross-section of an OLED device of this invention.

DETAILED DESCRIPTION OF THE INVENTION

General Device Architecture

The present invention can be employed in many OLED device configurations using small molecule materials, oligomeric materials, polymeric materials, or combinations thereof. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. The essential requirements of an OLED are an anode, a cathode, and an organic light-emitting layer located between the anode and cathode. Additional layers may be employed as more fully described hereafter.

A typical structure, especially useful for of a small molecule device, is shown in the FIGURE and is comprised of a substrate 101, an anode 103, a hole-injecting layer 105, a hole-transporting layer 107, a light-emitting layer 109, an electron-transporting layer 110, an electron-injecting layer 111, an optional second electron-injecting layer 112 and a cathode 113. These layers are described in detail below. Note that the substrate may alternatively be located adjacent to the cathode, or the substrate may actually constitute the anode or cathode. The organic layers between the anode and cathode are conveniently referred to as the organic EL element. Also, the total combined thickness of the organic layers is desirably less than 500 nm.

The anode and cathode of the OLED are connected to a voltage/current source 150 through electrical conductors 160. The OLED is operated by applying a potential between the anode and cathode such that the anode is at a more positive potential than the cathode. Holes are injected into the organic EL element from the anode and electrons are injected into the organic EL element at the cathode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

Substrate

The OLED device of this invention is typically provided over a supporting substrate 101 where either the cathode or anode can be in contact with the substrate. The substrate can be a complex structure comprising multiple layers of materials. This is typically the case for active matrix substrates wherein TFTs are provided below the OLED layers. It is still necessary that the substrate, at least in the emissive pixilated areas, be comprised of largely transparent materials. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support can be light transmissive, light absorbing or light reflective. Substrates for use in this case include, but are not limited to, glass, plastic, metals, semiconductor materials, silicon, ceramics, and circuit board materials. It is necessary to provide in these device configurations a light-transparent top electrode.

Anode

The OLED device of this invention is typically provided over a supporting substrate where either the cathode or anode can be in contact with the substrate. The electrode in contact with the substrate is conveniently referred to as the bottom electrode. Conventionally, the bottom electrode is the anode, but this invention is not limited to that configuration.

The conductive anode layer 103 is formed over the substrate and, when EL emission is viewed through the anode, should be transparent or substantially transparent to the emission of interest. Common transparent anode materials used in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used. For applications where EL emission is viewed through the top electrode, the cathode, the transmissive characteristics of the anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes can be polished prior to application of other layers to reduce surface roughness so as to reduce short circuits or enhance reflectivity.

The anode surface is usually cleaned with water-based detergent and dried using a commercial glass scrubber tool. It is usually subsequently treated with an oxidative plasma or UV/ozone to further clean and condition the anode surface and adjust its work function.

Hole-Injecting Layer (HIL)

While not always necessary, it is often useful that a hole-injecting layer 105 be provided between anode 103 and hole-transporting layer 107. The hole-injecting layer can be formed of a single or a mixture of organic or inorganic materials. The hole-injecting layer may be divided into several layers, with each layer being composed of either the same or different materials. The hole-injecting material can serve to improve the film formation property of subsequent organic layers and to facilitate injection of holes into the hole-transporting layer. Suitable materials for use in the hole-injecting layer include, but are not limited to porphyrin and phthalocyanine compounds as described in U.S. Pat. No. 4,720,432, phosphazine compounds, and certain aromatic amine compounds which are stronger electron donors than conventional HTL materials, such as N,N,N,N-tetraarylbenzidine compounds. For example, materials useful in the first HTL can have their $E_{ox}$ be dominated by one of the following moieties:

para-phenylenediamine, such as those described in EP 0 891 121 A1 and EP 1,029,909 A1 or other di- and triaminobenzenes,
dihydrophenazine,
2,6-diaminonaphthalene and other polyaminated (di-, tri-, tetra-, etc. amino) naphthalene and their mixtures,
2,6-diaminoanthracene, 9,10-diaminoanthracene, and other polyaminated anthracenes,
2,6,9,10-tetraminoanthracene,
anilinoethylene,
N,N,N,N-tetraarylbenzidine,
mono- or polyaminated perylene and their mixtures,
mono- or polyaminated coronene and their mixtures,
polyaminated pyrene and their mixtures,
mono- or polyaminated fluoranthene and their mixtures,
mono- or polyaminated chrysene and their mixtures,
mono- or polyaminated anthanthrene and their mixtures,
mono- or polyaminated triphenylene and their mixtures, or
mono- or polyaminated tetracene and their mixtures.
Some of the exemplary amine compounds are:
Tris(p-aminophenyl)amine (CAS 5981-09-9),
4,4',4"-Tris(N,N-diphenylamino)-triphenylamine (CAS 105389-36-4);
4,4',4"-tris[(3-methylphenyl)phenylamino]triphenylamine (mTDATA) 4,4',4"-Tris(N-(2-naphthyl)-N-phenylamino)-triphenylamine (CAS 185690-41-9);
4,4',4"-Tris(N-(1-naphthyl)-N-phenylamino)triphenylamine (CAS 185690-39-5);
N,N,N',N'-Tetrakis(4-dibutylaminophenyl)-p-phenylenediamine (CAS 4182-80-3);
Tris[(4-diethylamino)phenyl]amine (CAS 47743-70-4);
4,4'-Bis[di(3,5-xylyl)amino]-4"-phenyltriphenylamine (CAS 249609-49-2);
5,10-Dihydro-5,10-dimethyl-phenazine;
9,14-Dihydro-9,14-dimethyl-dibenzo[a,c]phenazine;
9,14-Dihydro-9,14-dimethyl-phenanthro[4,5-abc]phenazine;
6,13-Dimethyldibenzo[b,i]phenazine;
5,10-Dihydro-5,10-diphenylphenazine;
Tetra(N,N-diphenyl-4-aminophenyl)ethylene;
Tetrakis [p-(dimethylamino)phenyl]ethylene;
N,N,N',N'-tetra-2-naphthalenyl-6,12-chrysenediamine;
N-[2-(diphenylamino)-6-naphthalenyl]-N-3-perylenyl-N',N'-diphenyl-2,6-naphthalenediamine;
N,N,N',N'-tetrakis([1,1'-biphenyl]-4-yl)-2,6-naphthalenediamine;
N,N,N',N'-tetrakis(4-methylphenyl)-dibenzo[def,mno]chrysene-6,12-diamine;
N,N,N',N'-tetraphenyl-9,10-diphenylanthracene-2,6-diamine;
N,N,N',N',N'',N'',N''',N'''-octaphenyl-anthracene-2,6,9,10-tetraamine;
N,N,N',N'-tetrakis(4-methoxyphenyl)-benzidine;
N,N,N',N'-tetraphenyl-perylene-3,9-diamine;
N,N,N',N',N'',N'',N''',N'''-octaphenyl-coronene-1,4,7,10-tetraamine;
N,N,N',N',N'',N'',N''',N'''-octaphenyl-pyrene-1,3,6,8-tetraamine;
N,N,N',N'-tetrakis(3-methylphenyl)-3,9-fluoranthenediamine;
10,10'-(3,9-fluoranthenediyl)bis-10H-phenoxazine;
N,N,N',N',N'',N''-hexaphenyl-2,6,11-triphenylenetriamine;
N,N,N',N',N'',N'',N''',N''',N'''',N'''',N''''',N'''''-dodecaphenyl-2,3,6,7,10,11-triphenylenehexamine;
N,N,N',N'-tetraphenyl-5,11-naphthacenediamine; or
N,N'-di-1-naphthalenyl-N,N'-diphenyl-5,12-naphthacenediamine.

In another useful embodiment, the HIL includes a compound incorporating a para-phenylenediamine, dihydrophenazine, 2,6-diaminonaphthalene, 2,6-diaminoanthracene, 2,6,9,10-tetraminoanthracene, anilinoethylene, N,N,N,N-tetraarylbenzidine, mono- or polyaminated perylene, mono- or polyaminated coronene, polyaminated pyrene, mono- or polyaminated fluoranthene, mono- or polyaminated chrysene, mono- or polyaminated tetracene moiety while the second material includes an amine compound that contains either a N,N,N,N-tetraarylbenzidine or a N-arylcarbazole moiety.

The HIL may include an inorganic compound(s), such as metal oxide, metal nitride, metal carbide, a complex of a metal ion and organic ligands, and a complex of a transition metal ion and organic ligands.

While not necessary, the HIL may also be composed of two components: for example, one of the organic materials mentioned above, such as an amine compound, doped with a strong oxidizing agent, such as dipyrazino[2,3-f:2',3'-h]quinoxalinehexacarbonitrile, $F_4TCNQ$, or $FeCl_3$.

Suitable materials for use in the HIL may also include plasma-deposited fluorocarbon polymers (CFx) as described in U.S. Pat. No. 6,208,075, a strong oxidizing agent such as dipyrazino[2,3-f:2',3'-h]quinoxalinehexacarbonitrile (DPQHC) as described in U.S. Pat. No. 6,720,573 B2 and in U.S. Published Application 2004/113547 A1, or another strong oxidizing agent, which can be organic, such as $F_4TCNQ$ or inorganic, such as molybdenum oxide, $FeCl_3$, or $FeF_3$.

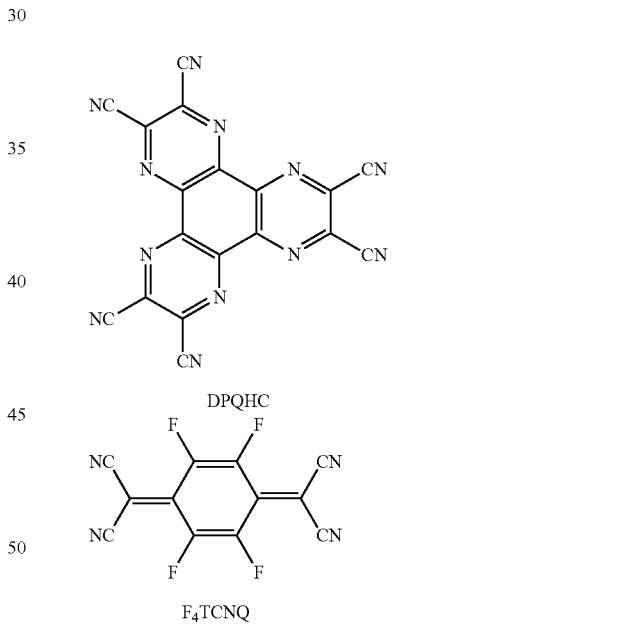

Hole-Transporting Layer (HTL)

The hole-transporting layer 107 of the organic EL device contains at least one hole-transporting compound, such as an aromatic tertiary amine, where the latter is understood to be a compound containing at least one trivalent nitrogen atom that is bonded only to carbon atoms, at least one of which is a member of an aromatic ring. The hole-transporting layer can be formed of a single or a mixture of organic or inorganic materials. The hole-transporting layer may be divided into several layers, with each layer being composed of either the same or different materials.

Suitable materials for use in the HTL include, but are not limited to amine compounds, that is, structures having an amine moiety. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al. U.S. Pat. No. 3,567,450 and U.S. Pat. No. 3,658,520. A more preferred class of aromatic tertiary amines are those which include at least two aromatic tertiary amine moieties as described in U.S. Pat. Nos. 4,720,432 and 5,061,569.

Exemplary of contemplated amine compounds are those satisfying the following structural formula:

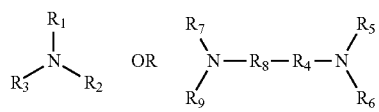

wherein:

substituents $R_4$ and $R_8$ are each individually aryl, or substituted aryl of from 5 to 30 carbon atoms, heterocycle containing at least one nitrogen atom, or at least one oxygen atom, or at least one sulfur atom, or at least one boron atom, or at least one phosphorus atom, or at least one silicon atom, or any combination thereof; substituents $R_4$ and $R_8$ each individually or together (as one unit denoted "$R_8$-$R_4$") representing an aryl group such as benzene, naphthalene, anthracene, tetracene, pyrene, perylene, chrysene, phenathrene, triphenylene, tetraphene, coronene, fluoranthene, pentaphene, ovalene, picene, anthanthrene and their homologs and also their 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP,

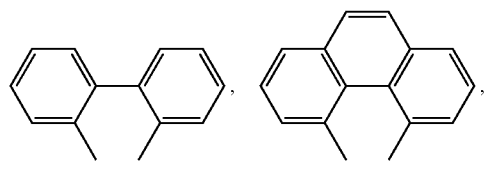

2,2'-BP, 4,5-PhAn

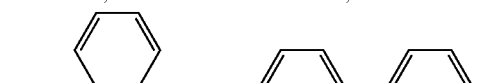

1,12-TriP, 1,12-Per

9,10-PhAn, 1,9-An

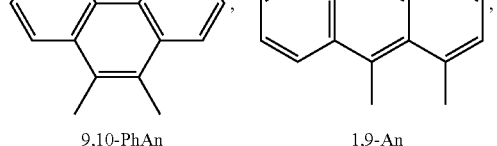

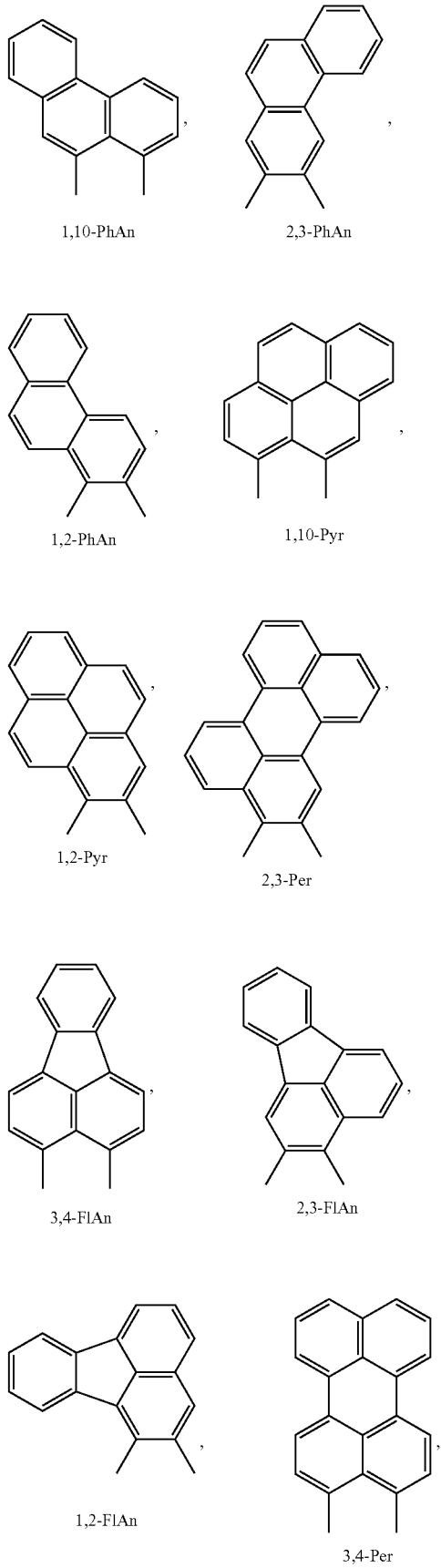

-continued

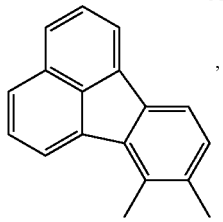
7,8-FlAn

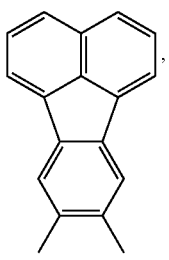
8,9-FlAn

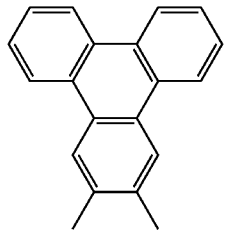
2,3-TriP

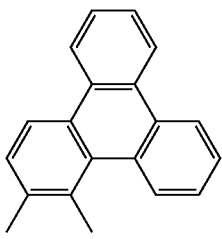
1,2-TriP (where bonds that do not form a cycle indicate points of attachment), or ace, or indeno substituted derivatives; and substituents $R_1$ through $R_9$ excluding $R_4$ and $R_8$ are each individually hydrogen, silyl, alkyl of from 1 to 24 carbon atoms, substituted alkyl, aryl of from 5 to 30 carbon atoms, substituted aryl, fluorine or chlorine, heterocycle containing at least one nitrogen atom, or at least one oxygen atom, or at least one sulfur atom, or at least one boron atom, or at least one phosphorus atom, or at least one silicon atom, or any combination thereof.

Illustrative of useful amine compounds and their abbreviated names are those listed above for the HIL and the following:
N,N'-bis(1-naphthalenyl)-N,N'-diphenylbenzidine (NPB);
N,N'-bis(1-naphthalenyl)-N,N'-bis(2-naphthalenyl)benzidine (TNB);
N,N'-bis(3-methylphenyl)-N,N'-diphenylbenzidine (TPD);
N,N'-Bis(N'',N''-diphenylaminonaphthalen-5-yl)-N,N'-diphenyl-1,5-diaminonaphthalene (CAS 503624-47-3);
N,N'-Bis(4-methylphenylamine)-N,N'-diphenyl-1,4-phenylenediamine;
N,N'-Diphenyl-N,N'-di(m-tolyl)benzidine (CAS 65181-78-4);
N,N-Diphenylbenzidine (CAS 531-91-9);
N,N,N',N'-Tetraphenylbenzidine (CAS 15546-43-7);
4-(2,2-Diphenylethen-1-yl)triphenylamine (CAS 89114-90-9);
N-(Biphenyl-4-yl)-N-(m-tolyl)aniline (CAS 154576-20-2);
N,N,N',N'-Tetrakis(4-methylphenyl)benzidine (CAS 161485-60-5);
N,N'-Bis(4-methylphenyl)-N,N'-bis(phenyl)benzidine (CAS 20441-06-9);
N,N',N'',N'''-Tetrakis(3-methylphenyl)-benzidine (CAS 106614-54-4);
N,N'-Di(naphthalene-1-yl)-N,N'-di(4-methylphenyl)-benzidine (CAS 214341-85-2);
N,N'-Di(naphthalene-2-yl)-N,N'-di(3-methylphenyl)benzidine (CAS 178924-17-9);
N,N'-Bis(4-methylphenyl)-N,N'-bis(phenyl)-1,4-phenylenediamine (CAS 138171-14-9);
1,1-Bis(4-bis(4-methylphenyl)aminophenyl)-cyclohexane (CAS 58473-78-2);
N,N,N',N'-Tetrakis(naphthyl-2-yl)benzidine (CAS 141752-82-1);
N,N'-Bis(phenanthren-9-yl)-N,N'-diphenylbenzidine (CAS 141752-82-1);
N,N'-Bis(2-naphthalenyl)-N,N'-diphenylbenzidine (CAS 123847-85-8);
4,4',4''-Tris(carbazol-9-yl)triphenylamine (CAS 139092-78-7);
N,N'-Bis(4-(2,2-diphenylethen-1-yl)phenyl)-N,N'-bis(phenyl)benzidine (CAS 218598-81-3);
N,N'-Bis(4-(2,2-diphenylethen-1-yl)phenyl)-N,N'-bis(4-methylphenyl)benzidine (CAS 263746-29-8);
N,N'-Bis(phenyl)-N,N'-bis(4'-(N,N-bis(naphth-1-yl)amino)biphenyl-4-yl)benzidine;
N,N'-Bis(phenyl)-N,N'-bis(4'-(N,N-bis(phenylamino)biphenyl-4-yl)benzidine (CAS 167218-46-4);
Alpha Naphthylphenylbenzidine;
1,1-Bis[4-[N,N-di(p-tolyl)amino]phenyl]cyclohexane (CAS 58473-78-2);
1,4-Bis[2-[4-[N,N-di(p-tolyl)amino]phenyl]vinyl]benzene (CAS 55035-43-3);
1,3,5-Tri(9H-carbazol-9-yl)benzene (CAS 148044-07-9);
Tris(4-biphenylyl)amine (CAS 6543-20-0);
1,1-Bis(4-di-p-tolylaminophenyl)-4-phenylcyclohexane;
4,4'-Bis(diphenylamino)quadriphenyl;
Bis(4-dimethylamino-2-methylphenyl)phenylmethane;
4-(Di-p-tolylamino)-4'-[4-(di-p-tolylamino)styryl]stilbene;
Poly(N-vinylcarbazole);
4,4'-Bis[N-(1-naphthyl)-N-phenylamino]-p-terphenyl;
4,4'-Bis[N-(3-acenaphthenyl)-N-phenylamino]biphenyl;
4,4'-Bis[N-(9-anthryl)-N-phenylamino]biphenyl;
4,4'-Bis[N-(1-anthryl)-N-phenylamino]biphenyl;
4,4'-Bis[N-(2-perylenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4'-diamino-p-terphenyl;
4,4'-Bis[N-phenyl-N-(2-pyrenyl)amino]biphenyl;
2,6-Bis[N,N-di(2-naphthyl)amine]fluorine;
1,5-Bis[N-(1-naphthyl)-N-phenylamino]naphthalene;
7-Phenyl-7H-benz[k,l]acridine;
2,3,6,7-Tetrahydronaphtho[1,2,3-ij]quinolizine;
2,3,5,6,7,11,12,14,15,16-Decahydro-1H,10H-anthra[1,2,3-ij:5,6,7-l',j']diquinolizine;
N,N,N',N'-Tetraphenylbenzo[x,y,z]heptaphene-6,9-diamine;
N,N'-Diphenylbenzo[x,y,z]heptaphene-6,9-diamine;
N,N'-Di-1-coronenyl-N,N'-diphenyl-[1,1'-biphenyl]-4,4'-diamine;
N,N',N''-Tris[4-[2,2-bis(4-methylphenyl)ethenyl]phenyl]-N,N',N''-tris(4-methylphenyl)-2,6,10-triphenylenetriamine;
4,4'-(6,12-Chrysenediyl)bis[N,N-bis(4-methylphenyl)]benzenamine;
N,N,N',N'-Tetra-2-naphthalenyl-6,12-chrysenediamine;
N,N'-Bis[4-(1,1-dimethylethyl)phenyl]-N,N'-diphenyl-6,12-chrysenediamine;
4,4'-(5,11-Chrysenediyldi-2,1-ethenediyl)bis[N,N-diphenylbenzenamine];
N-(7,10-Diphenyl-3-fluoranthenyl)-N,7,10-triphenyl-3-fluoranthenamine;
N,N'-Bis[4-[2,2-bis(4-methylphenyl)ethenyl]phenyl]-N,N'-bis(4-methylphenyl)-3,8-fluoranthenediamine;
8-(9H-Carbazol-9-yl)-N,N-diphenyl-3-fluoranthenamine;
N,N-Bis(4-methylphenyl)-2-pyrenamine;
3-(1-Pyrenyl)-N,N-bis[3-(1-pyrenyl)phenyl]-benzenamine;

N,N'-[(9,9-Dimethyl-9H-fluorene-2,7-diyl)di-4,1-phe-
nylene]bis[N-[4-(1,1-dimethylethyl)phenyl]-1-pyre-
namine;
N,N-Bis([1,1'-biphenyl]-4-yl)-6,12-bis(1,1-dimethylethyl)-
3-perylenamine;
N-[1,1'-Biphenyl]-3-yl-N-3-perylenyl-3-perylenamine;
N,N'-Di-2-naphthalenyl-N,N'-diphenyl-3,10-perylenedi-
amine;
N,N'-(1,4-Naphthalenediyl-di-4,1-phenylene)bis [N-phe-
nyl-3-perylenamine];
N-[4-(Diphenylamino)phenyl]-N-2-naphthacenyl-N',N'-di-
phenyl-1,4-benzenediamine;
N-1-Naphthacenyl-N'-1-naphthalenyl-N-[4-(1-naphthale-
nylphenylamino)phenyl]-N'-phenyl-1,4-benzenediamine;
N-5-Naphthacenyl-N'-1-naphthalenyl-N-[4-(1-naphthale-
nylphenyl-amino)phenyl]-N'-phenyl-1,4-benzenedi-
amine;
N,N'-Diphenyl-N,N'-di-1H-pyrrol-2-yl-[1',1'-biphenyl]-4,
4'-diamine;
Tris[4-(pyrrol-1-yl)phenyl]amine;
4,4'-[(1-Ethyl-1H-pyrrole-2,5-diyl)bis(4,1-phenylene-2,1-
ethenediyl)]bis[N,N-diphenyl-benzenamine];
4-[2-(4-Methylphenyl)-2-(1H-pyrrol-2-yl)ethenyl]-N,N-bis
[4-[2-(4-methylphenyl)-2-(1H-pyrrol-2-yl)ethenyl]phe-
nyl]benzenamine;
N,N,N',N'-Tetrakis(4-methoxyphenyl)-3,10-perylenedi-
amine,
N,N,N',N',N'',N'',N''',N'''-Octakis(4-methoxyphenyl)-1,4,7,
10-perylenetetramine;
N-1-Naphthalenyl-N-[4'-(trifluoromethoxy)[1,1'-biphenyl]-
2-yl]-3-perylenamine;
4,4'-(1,4-Naphthalenediyl-di-2,1-ethenediyl)bis[N-(4-
methoxyphenyl)-N-phenyl-benzenamine;
N,N'-(Oxydi-4,1-phenylene)bis[N-methyl-3-perylenamine];
N-[4-(Diphenylamino)phenyl]-N-(12-ethoxy-5-naphthace-
nyl)-N',N'-diphenyl-1,4-benzenediamine;
N,N-Bis(4-phenoxyphenyl)-1-naphthacenamine;
2,2'-(1,4-Phenylene)bis[3-methoxy-N-9-phenanthrenyl-N-
phenyl-6-benzofuranamine;
2,2'-(1,4-Phenylene)bis[N-1-naphthalenyl-N-phenyl-3-(trif-
luoromethyl)-6-benzofuranamine;
2,2'-(9,10-Anthracenediyl)bis[N-(3-methylphenyl)-N-phe-
nyl-6-benzofuranamine;
N,N'-Diphenyl-N,N'-bis[4-(3-phenyl-2-benzofuranyl)phe-
nyl]-[1,1'-biphenyl]-4,4'-diamine;
N,N'-bis[4'-[[8-[bis(2,4-dimethylphenyl)amino]-2-dibenzo-
furanyl](4-methylphenyl)amino][1,1'-biphenyl]-4-yl]-N,
N'-bis(4-methylphenyl)-2,8-dibenzofurandiamine;
2,2'-(1,4-Phenylene)bis[N,N-diphenyl-6-benzofuranamine;
N-2-Benzofuranyl-N'-[4-(2-benzofuranylphenylamino)phe-
nyl]-N'-3-perylenyl-N-phenyl-1,4-benzenediamine;
N,N-Bis[4-(dimethylphenylsilyl)phenyl]-3-perylenamine;
4-(Triphenylsilyl)-N,N-bis[4-(triphenylsilyl)phenyl]-benze-
namine;
4-(Dimethylphenylsilyl)-N,N-bis[4-(dimethylphenylsilyl)
phenyl]-benzenamine;
N,N-Bis[4-(dimethyl-2-naphthalenylsilyl)phenyl]-4-
ethoxy-benzenamine;
4,4'-(9,10-Anthracenediyl)bis[N,N-bis[4-(methyldiphenyl-
silyl)phenyl]-benzenamine;
N,N-Bis[4'-[bis[4-(methyldiphenylsilyl)phenyl]amino][1,
1'-biphenyl]-4-yl]-N',N'-bis[4-(methyldiphenylsilyl)phe-
nyl]-[1,1'-biphenyl]-4,4'-diamine;
N,N,N',N'-Tetrakis[4-(diphenylphosphino)phenyl]-[1,1'-bi-
phenyl]-4,4'-diamine;
4,4'-(9,10-Anthracenediyl)bis[N,N-bis[4-[bis(4-methylphe-
nyl)-phosphino]phenyl]-benzenamine;
4,4'-(9,10-anthracenediyl)bis[N,N-bis[4-(diphenylphosphi-
nyl)phenyl]-benzenamine; or
4,4'-(9,10-Anthracenediyl)bis[N,N-bis[4-(diphenylphos-
phino)phenyl]-benzenamine.

Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

According to the present invention, the light-emitting layer (LEL) of the organic EL element is primarily responsible for the electroluminescence emitted from the OLED device. One of the most commonly used formulations for this luminescent layer is an organic thin film including a host and one or more dopants. The host serves as the solid medium or matrix for the transport and recombination of charge carriers injected from the anode and the cathode. The dopant, usually homogeneously distributed in the host in small quantity, provides the emission centers where light is generated. An important relationship for choosing an emitting material is a comparison of the bandgap potential which is defined as the energy difference between the highest occupied molecular orbital and the lowest unoccupied molecular orbital of the molecule. For efficient energy transfer from the host to the emitting material, a necessary condition is that the band gap of the dopant is smaller than that of the host material.

Following the teaching of the prior art, the present invention uses a luminescent layer including a host and a dopant, but it distinguishes over the prior art in that the light-emitting layer comprises (a) a 2-arylanthracene compound and (b) a light-emitting second anthracene compound having amino substitution at a minimum of two positions, wherein at least one amine is substituted at the 2 position. The anthracene ring numbering system is shown below.

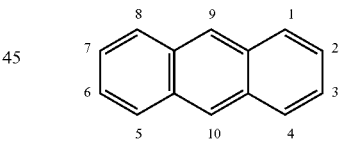

In one suitable embodiment, the 2-arylanthracene compound (a) is represented by formula [1],

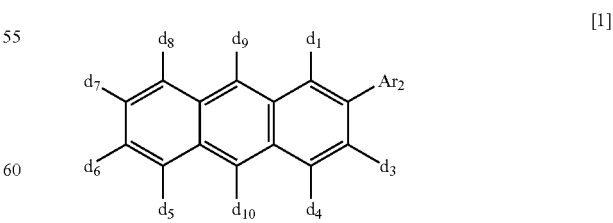

[1]

wherein $Ar_2$ represents an aryl group and $d_1$ and $d_3$-$d_{10}$ may be the same or different and each represents hydrogen or an independently selected substituent. In another suitable embodiment, $d_6$ of formula [1] represents an independently selected aryl group. In another suitable embodiment, $d_9$ and $d_{10}$ of formula [1] represent independently selected aryl groups.

In another suitable embodiment, the 2-arylanthracene compound (a) is represented by formula [2],

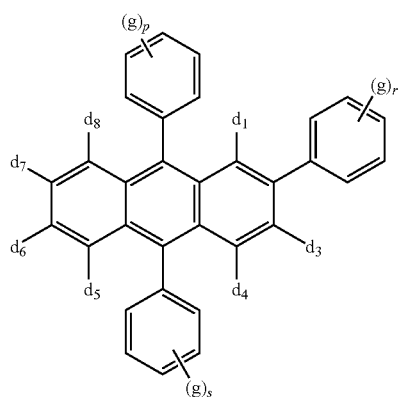

[2]

wherein $d_1$ and $d_3$-$d_8$ may be the same or different and each represents hydrogen or an independently selected substituent and each g may be the same or different and each represents an independently selected substituent, provided that two substituents may combine to form a ring group and p, r, and s are independently 0-5.

In another suitable embodiment, the 2-arylanthracene compound (a) is represented by formula [3],

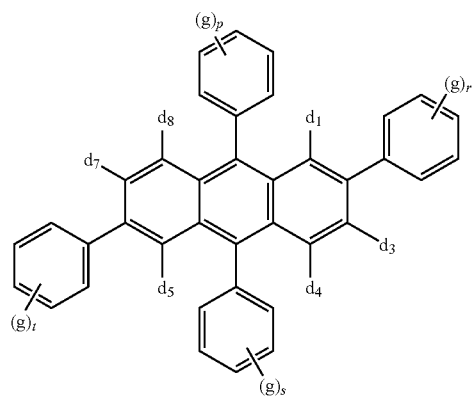

[3]

wherein $d_1$, $d_3$-$d_5$ and $d_7$-$d_8$ may be the same or different and each represents hydrogen or an independently selected substituent and each g may be the same or different and each represents an independently selected substituent, provided that two substituents may combine to form a ring group and p, r, s and t are independently 0-5.

In one suitable embodiment, the 2-arylanthracene compound (a) is present in an amount up to 50 volume %, preferably up to 80 volume % and more preferably up to 90 volume %.

Inventive 2-arylanthracene compounds (a) may be made by various methods. For example, by the method shown in scheme I. Reaction of a bromo-aryl compound ($Ar^1Br$) with a lithium reagent, for example t-butyllithium, forms the aryl-lithium salt, which then can react with compound Int-A, to form Int-B (eq. A). Dehydration of Int-B and aromatization with, for example, KI, $NaH_2PO_2$, and acetic acid, affords the anthracene Int-C (eq. B). Reaction of this anthracene with an aryl boronic acid ($Ar^2$—$B(OH)_2$) under Suzuki-type coupling conditions, for example, with tris(dibenzylideneacetone)dipalladium, tricyclohexylphosphine, and potassium phosphate base, affords the desired anthracene material, P-1 (eq. C). See J. Hassan, M. Sevignon, C. Gozzi, E. Schulz, M. Lemaire, Marc, *Chem. Rev,* 102, 1359 (2002) and references cited therein for a review of the Suzuki coupling reaction and similar reactions.

Scheme I:

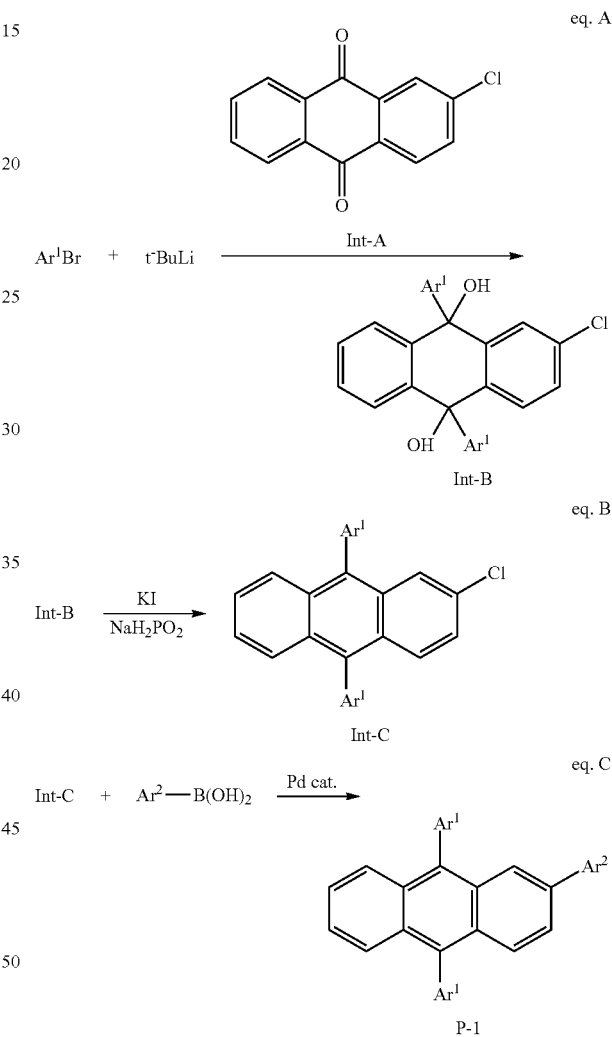

Using similar chemistry as discussed above, useful inventive 2-arylanthracene compounds (a) may also be made by the method shown in scheme II. Reaction of a bromo-aryl compound ($Ar^1Br$) with a lithium reagent, for example t-butyllithium, forms the aryl-lithium salt, which then can react with compound Int-D, to form Int-E (eq. A). Dehydration of Int-E and aromatization with, for example, KI, $NaH_2PO_2$, and acetic acid, affords the anthracene Int-F (eq. B). Reaction of this anthracene with an aryl boronic acid ($Ar^2$—$B(OH)_2$) under Suzuki-type coupling conditions, for example, with tris(dibenzylideneacetone)dipalladium, tricyclohexylphosphine, and potassium phosphate base, affords the desired anthracene material, P-2 (eq. C). See J. Hassan, M. Sevignon, C. Gozzi, E. Schulz, M. Lemaire, Marc, *Chem. Rev,* 102, 1359 (2002) and references cited therein for a review of the Suzuki coupling reaction and similar reactions.
Scheme II:
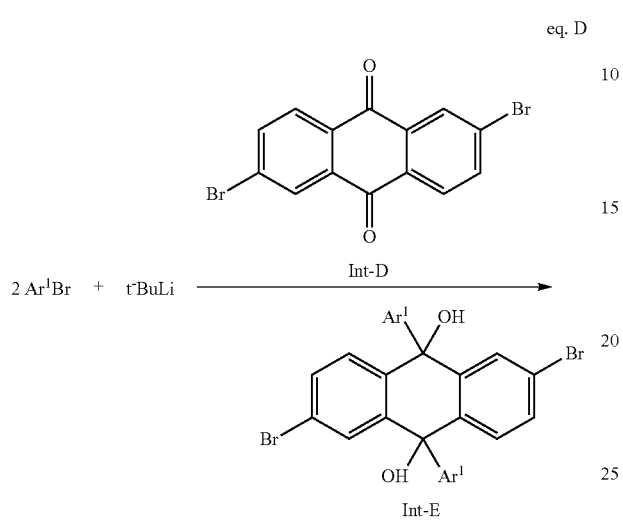
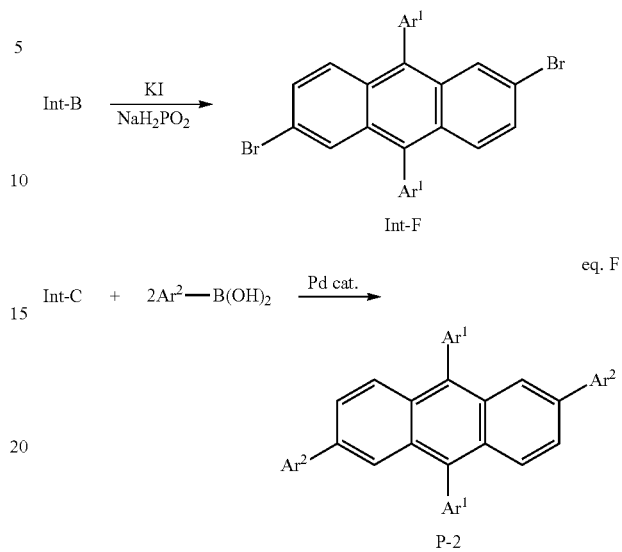
Illustrative, non-limiting examples of inventive 2-arylanthracene compound (a) materials are listed below.
Inv-A1
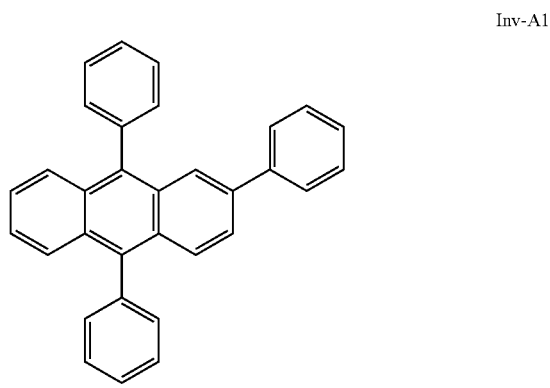
Inv-A2
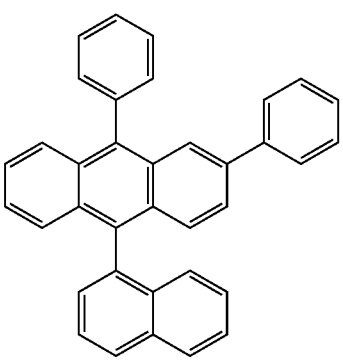
Inv-A3
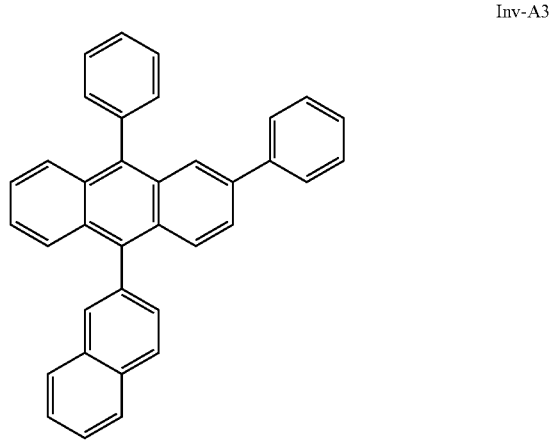
Inv-A4
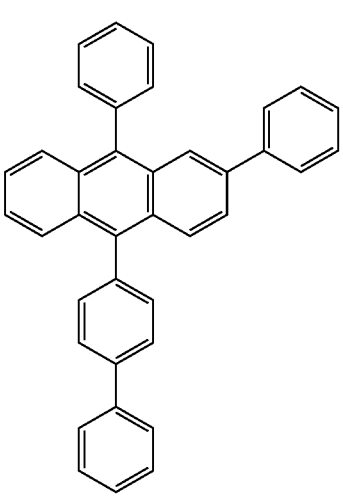

-continued
Inv-A5
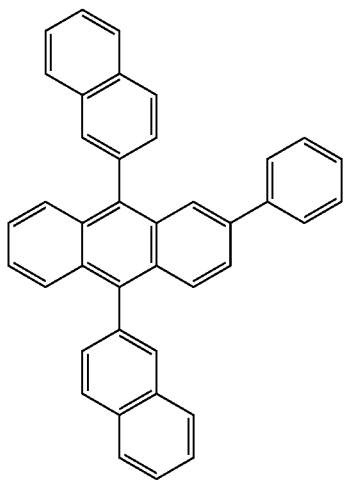
Inv-A6
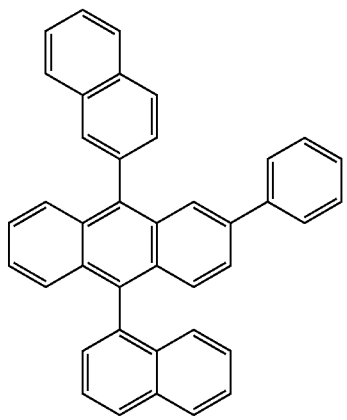
Inv-A7
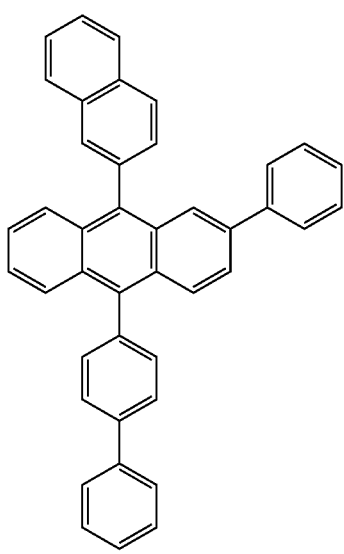
Inv-A8
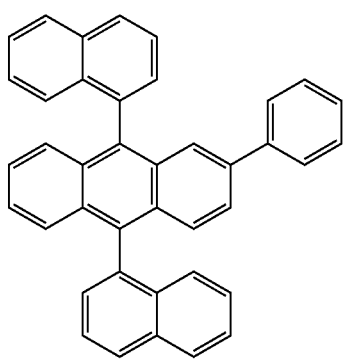
Inv-A9
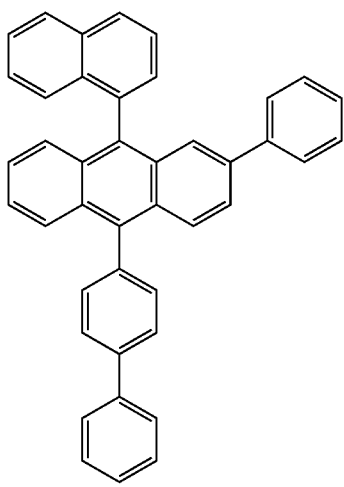
Inv-A10
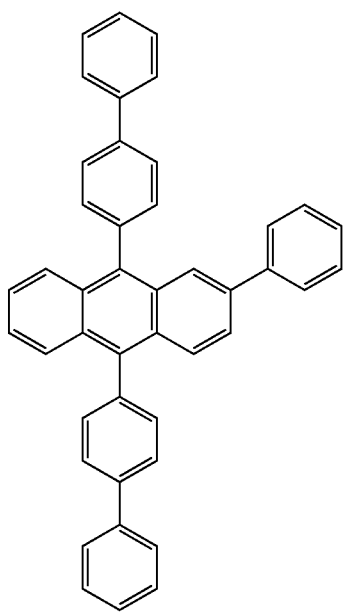

-continued
Inv-A11
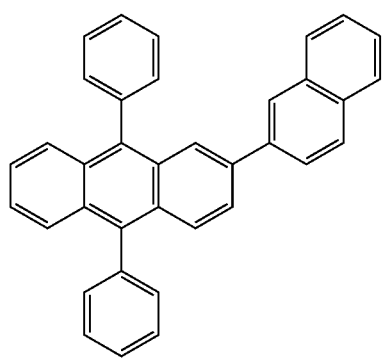
Inv-A12
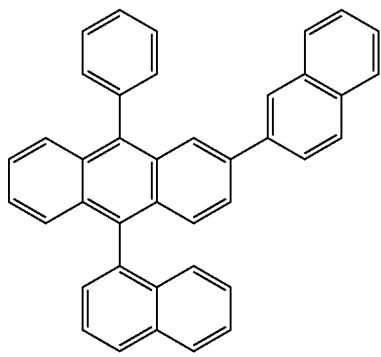
Inv-A13
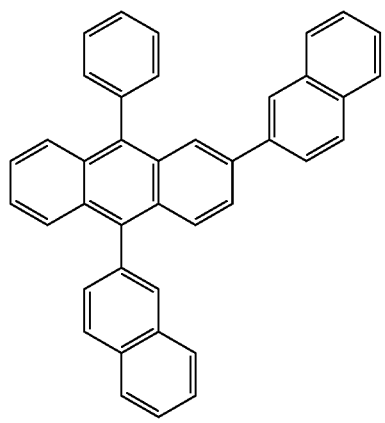
Inv-A14
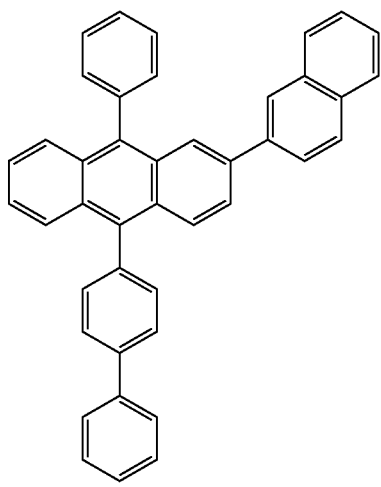
Inv-A15
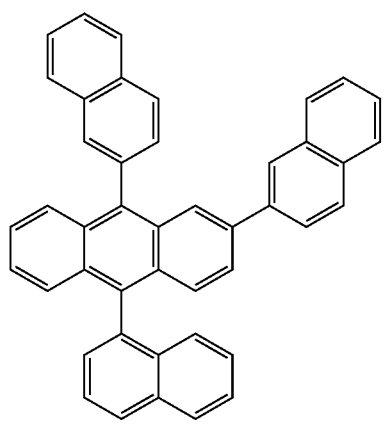
Inv-A16
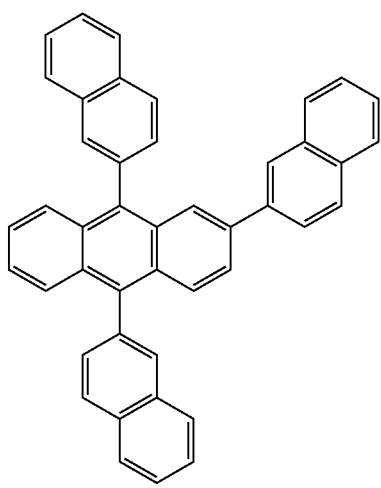

-continued
Inv-A17
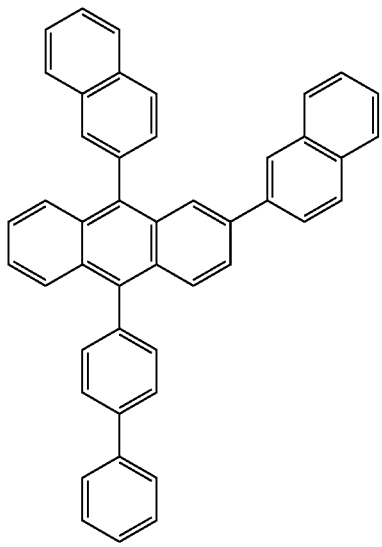
Inv-A18
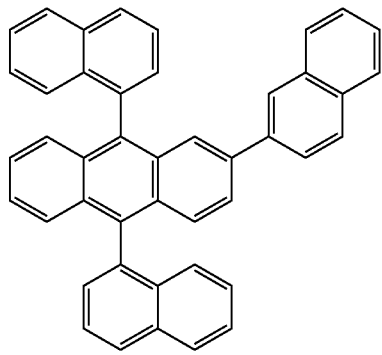
Inv-A19
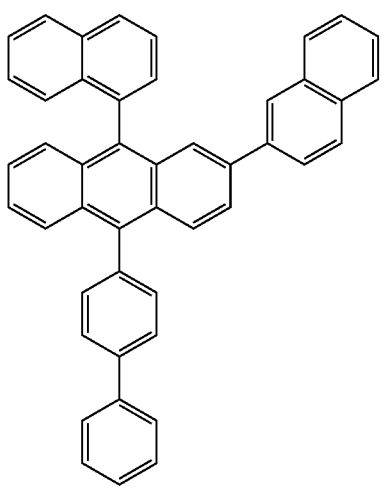
Inv-A20
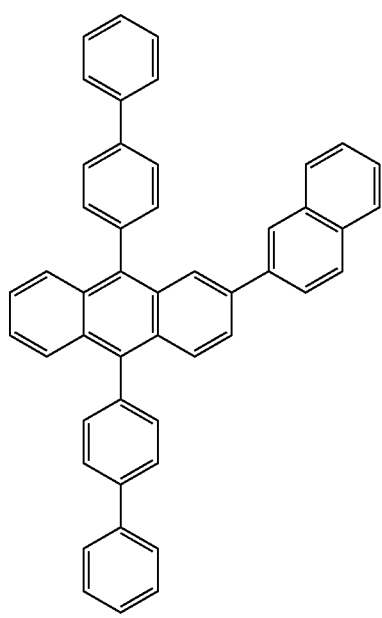
Inv-A21
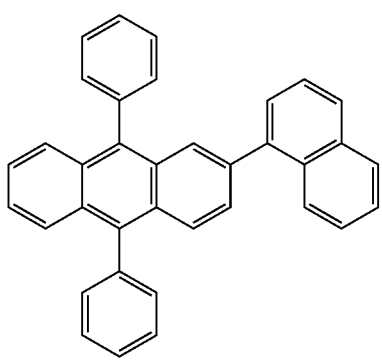
Inv-A22
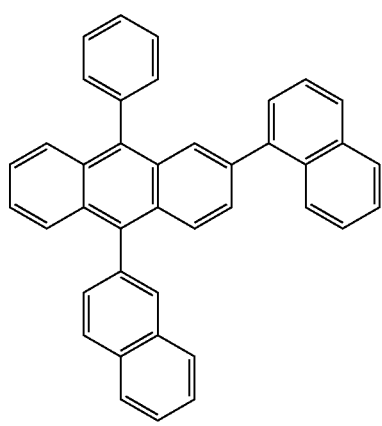

-continued
Inv-A23
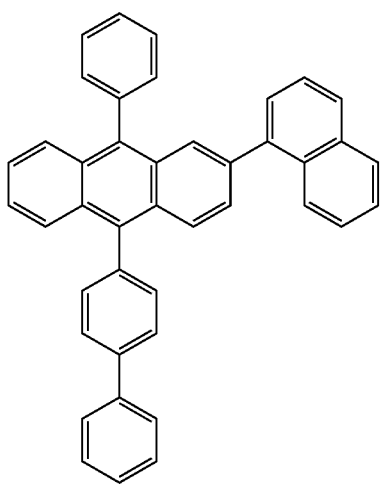
Inv-A24
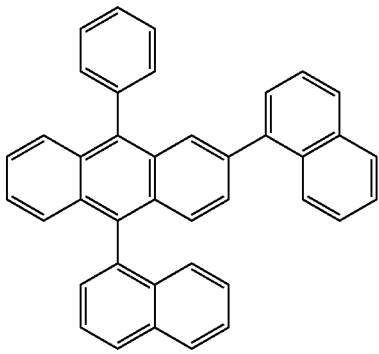
Inv-A25
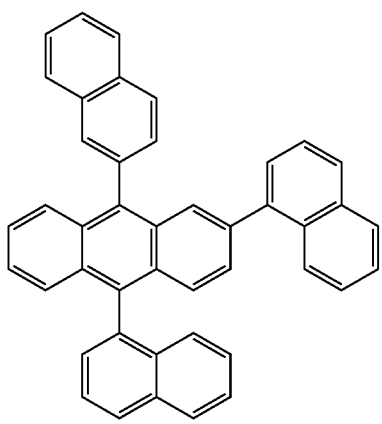
Inv-A26
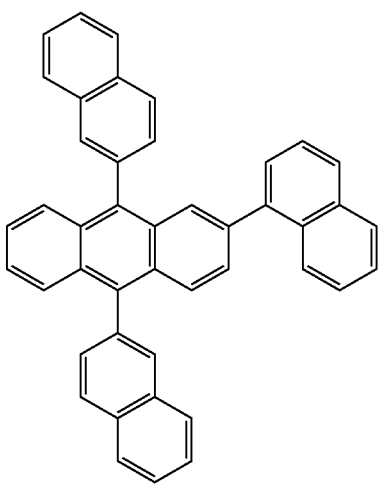
Inv-A27
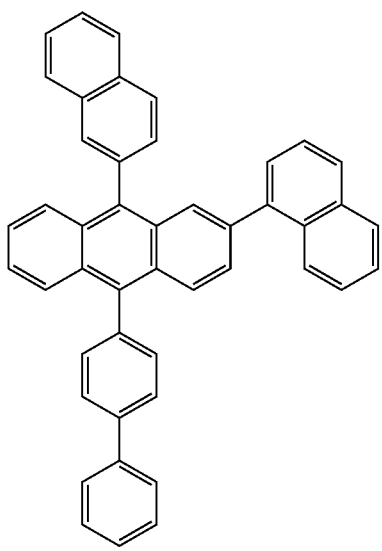
Inv-A28
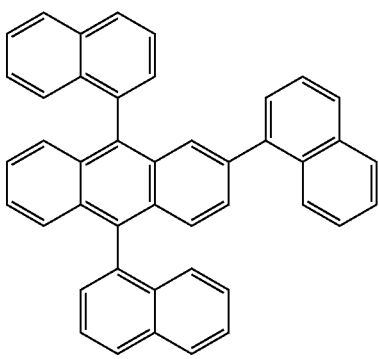

-continued
Inv-A29
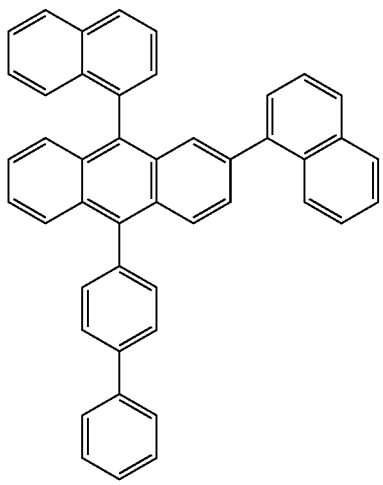
Inv-A30
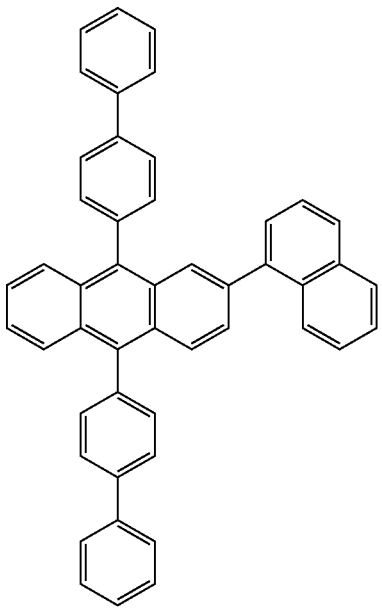
Inv-A31
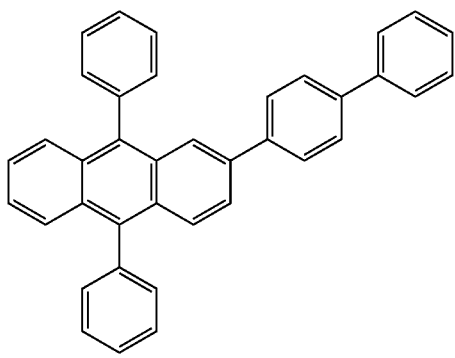
Inv-A32
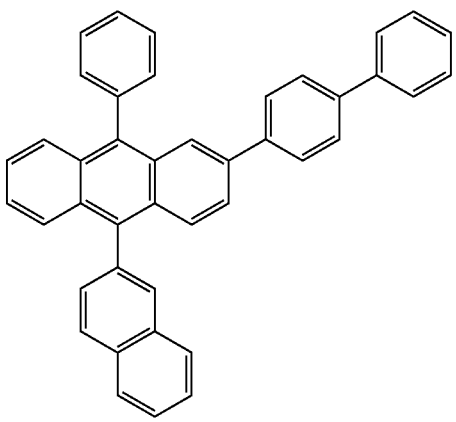
Inv-A33
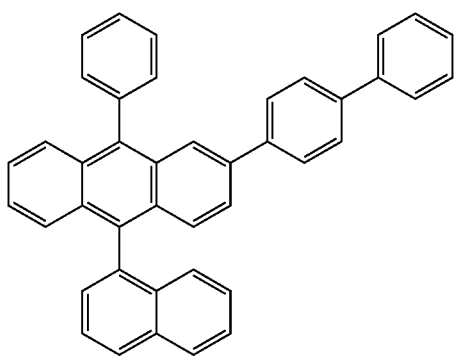
Inv-A34
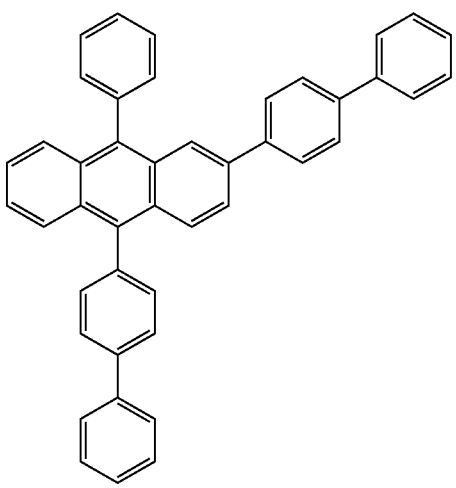

-continued
Inv-A35
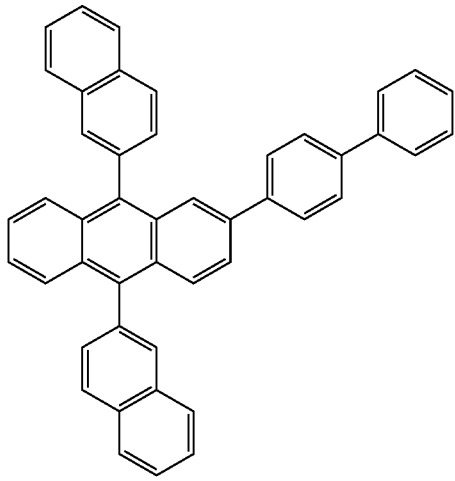
Inv-A36
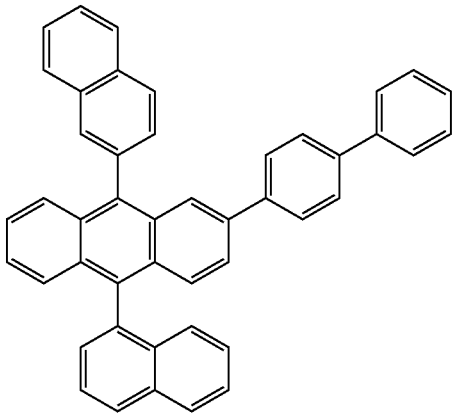
Inv-A37
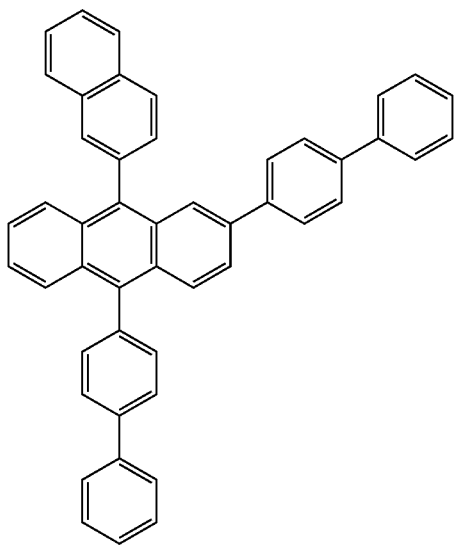
Inv-A38
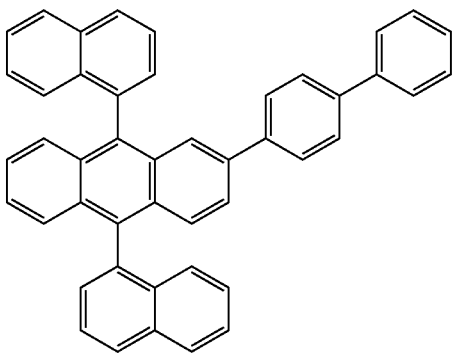
Inv-A39
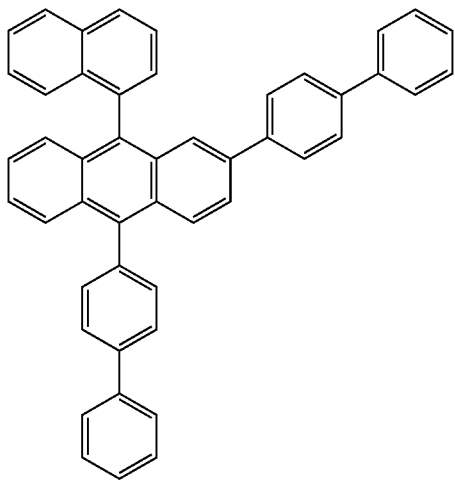
Inv-A40
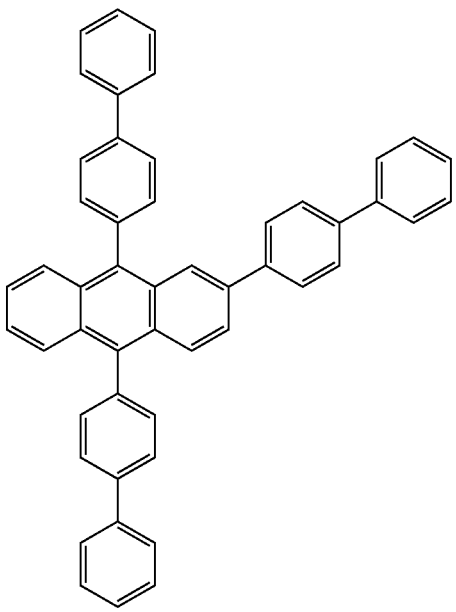

-continued
Inv-A41
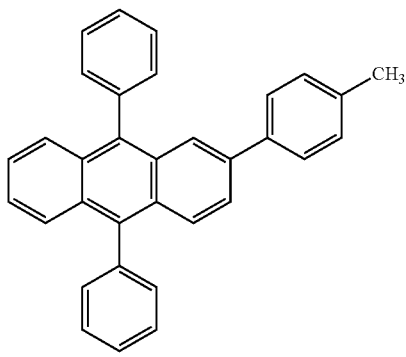
Inv-A42
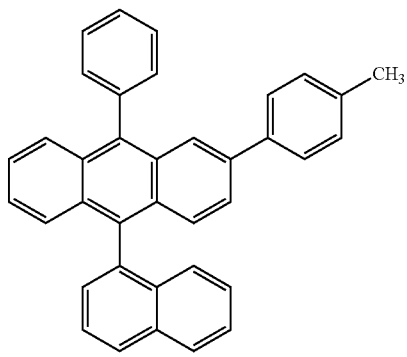
Inv-A43
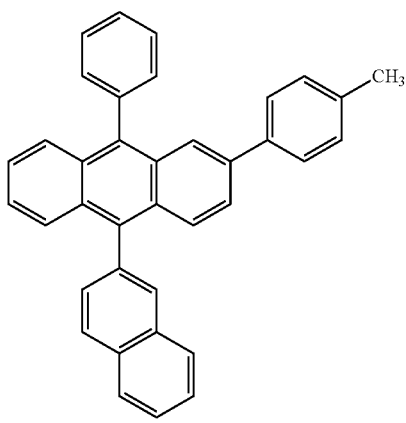
Inv-A44
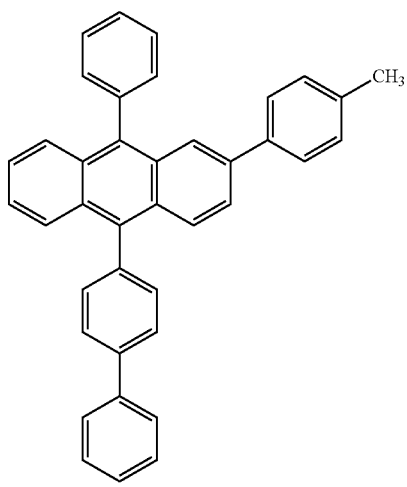
Inv-A45
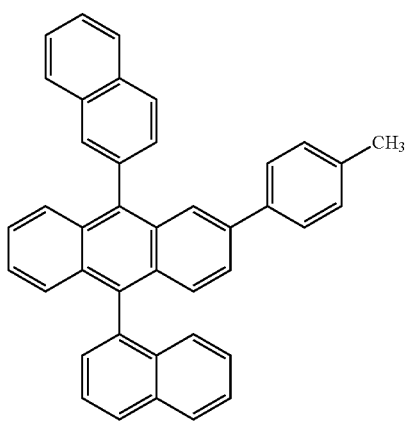
Inv-A46
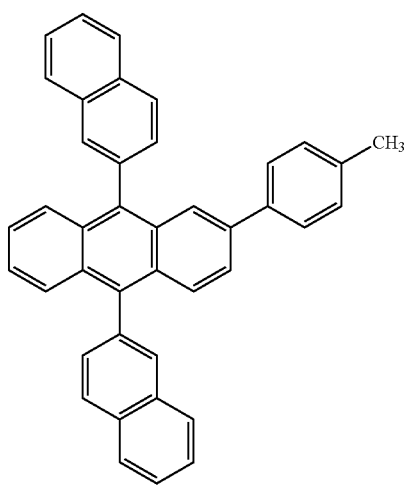

-continued
Inv-A47
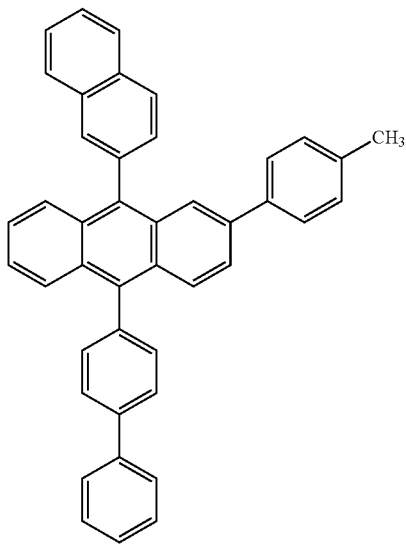
Inv-A48
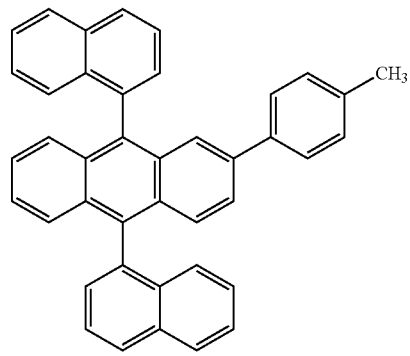
Inv-A49
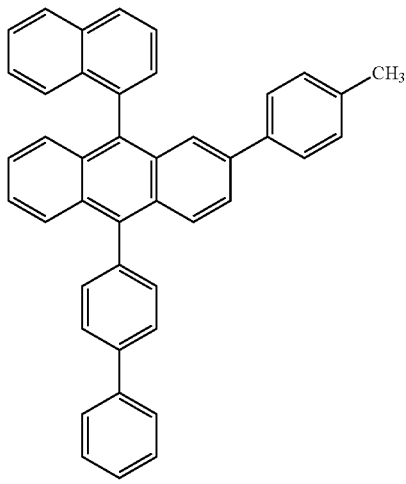
Inv-A50
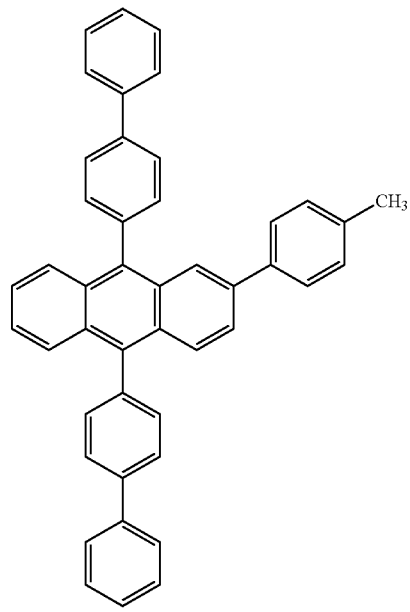
Inv-A51
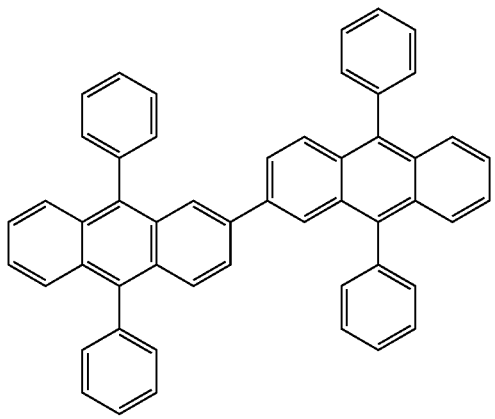
Inv-A52
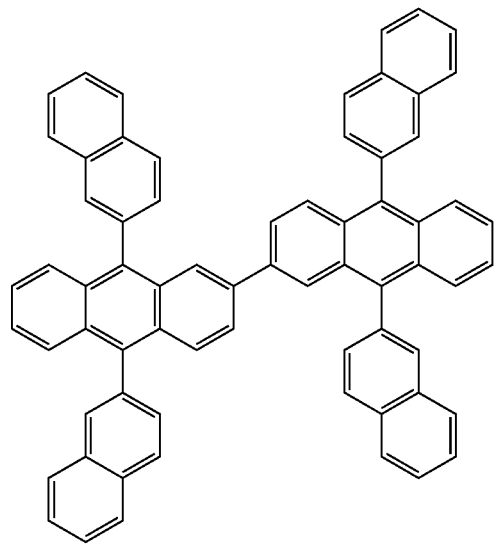

-continued
Inv-A53
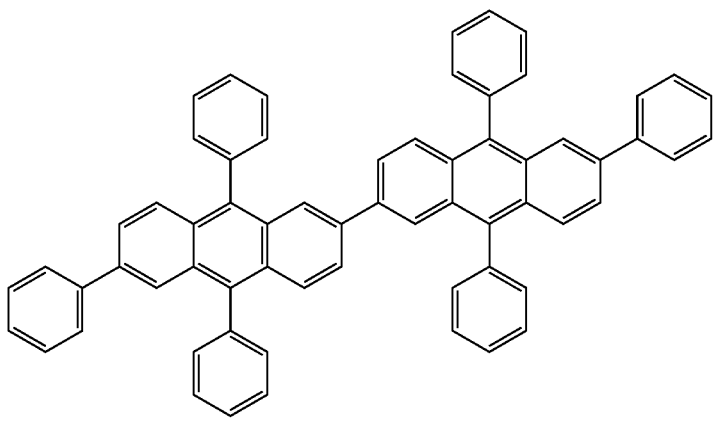
Inv-A54
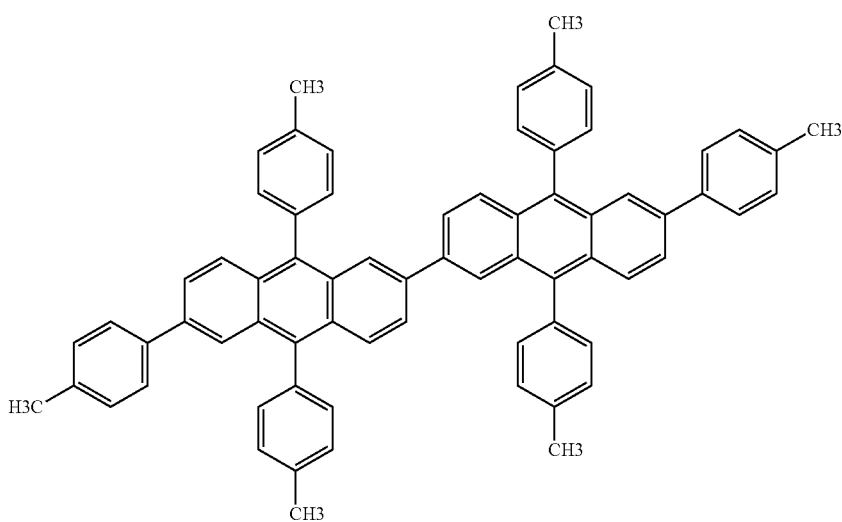
Inv-A55
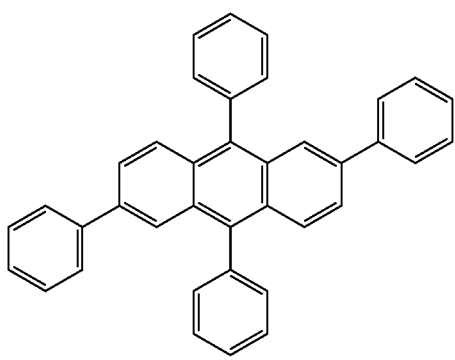
Inv-A56
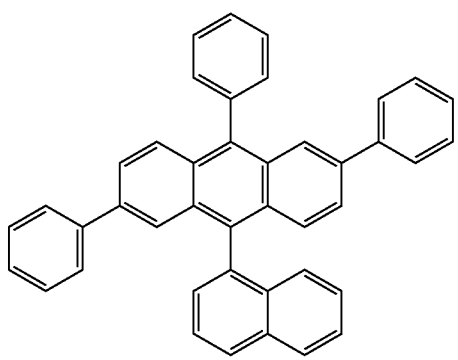

-continued
Inv-A57
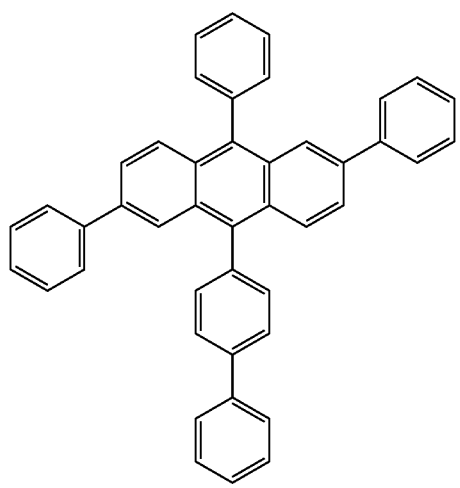
Inv-A58
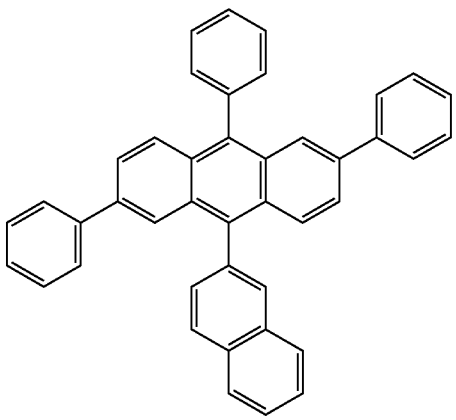
Inv-A59
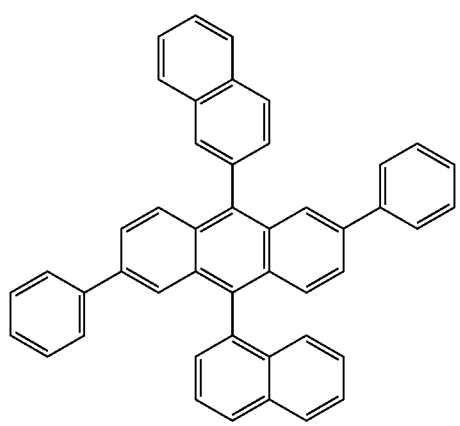
Inv-A60
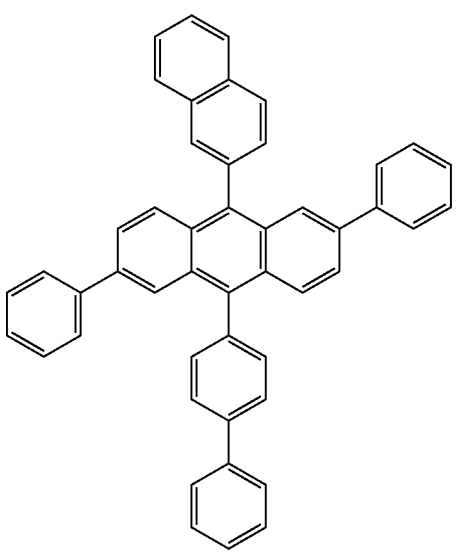
Inv-A61
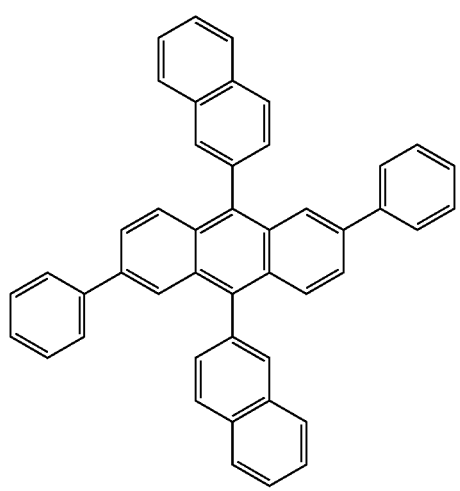
Inv-A62
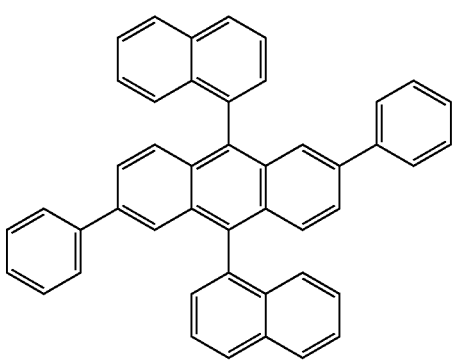

-continued
Inv-A63
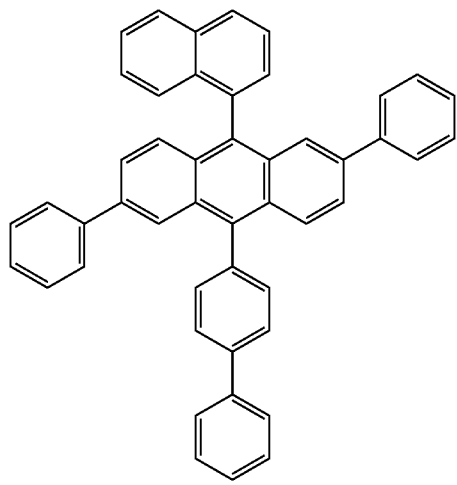
Inv-A64
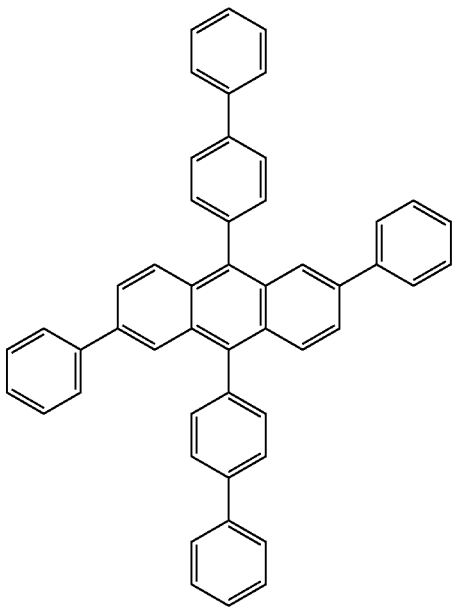
Inv-A65
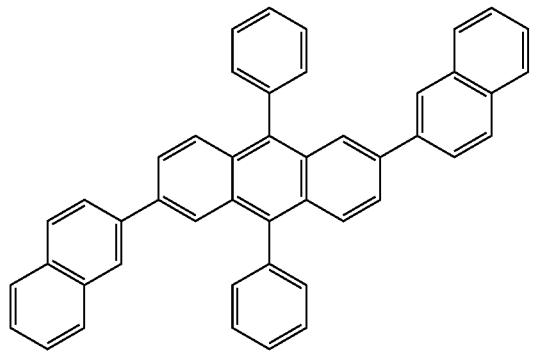
Inv-A66
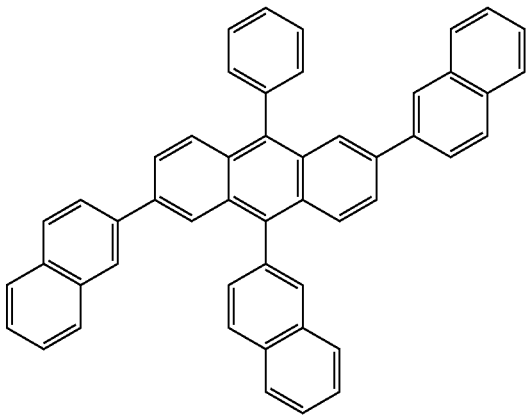
Inv-A67
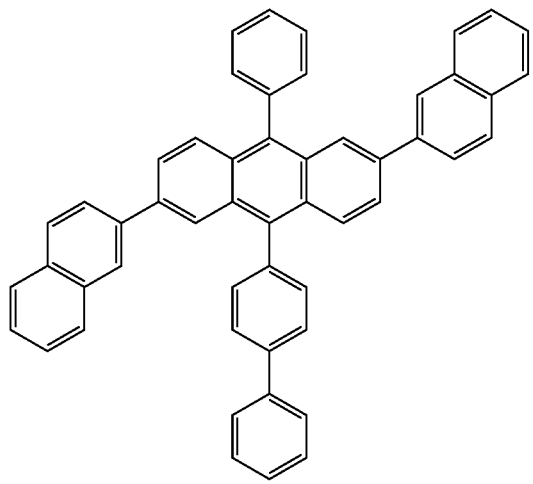
Inv-A68
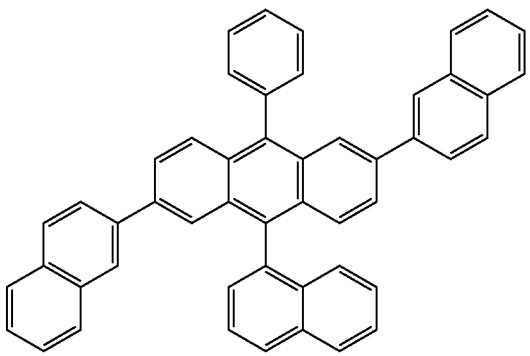

-continued
Inv-A69
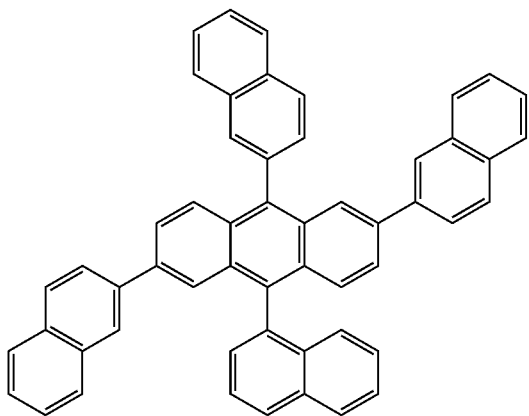
Inv-A70
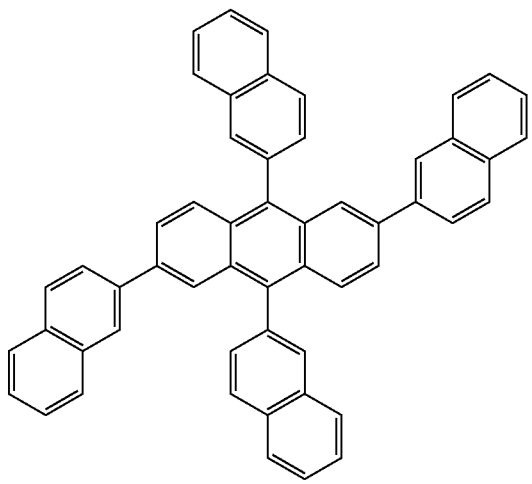
Inv-A71
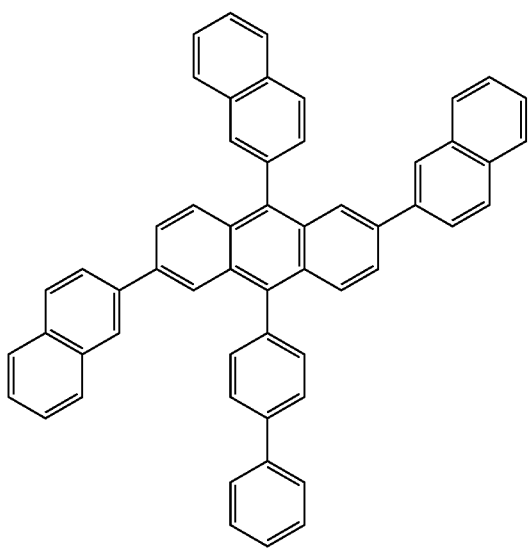
Inv-A72
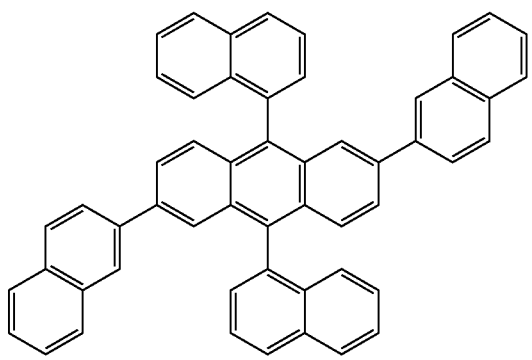
Inv-A73
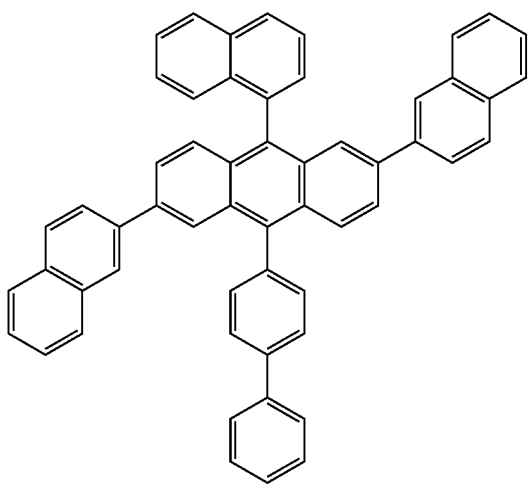
Inv-A74
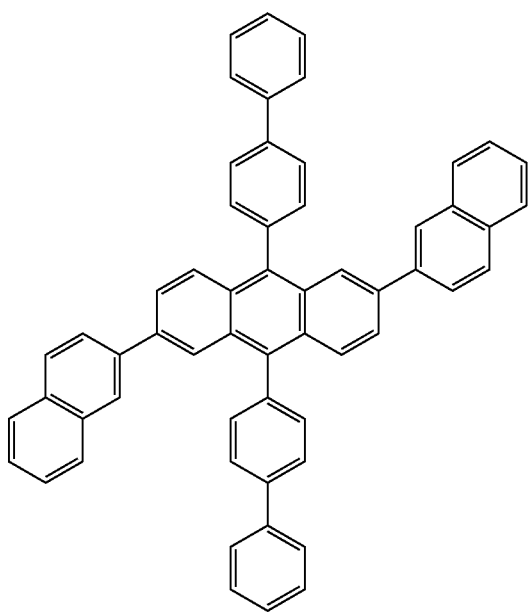

-continued
Inv-A75
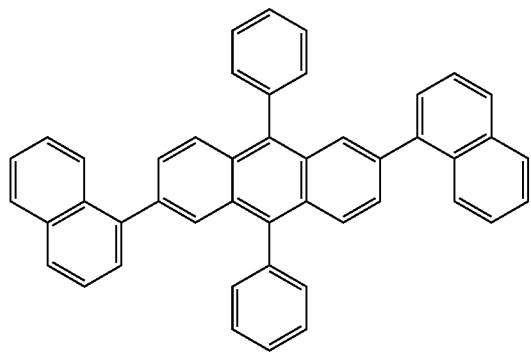
Inv-A76
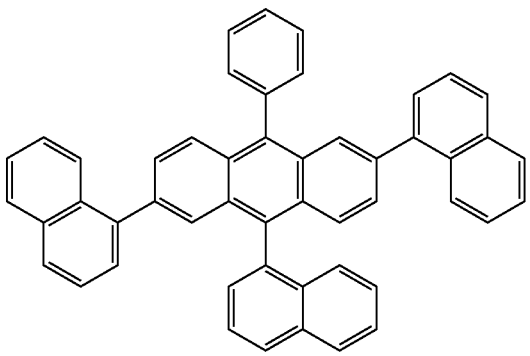
Inv-A77
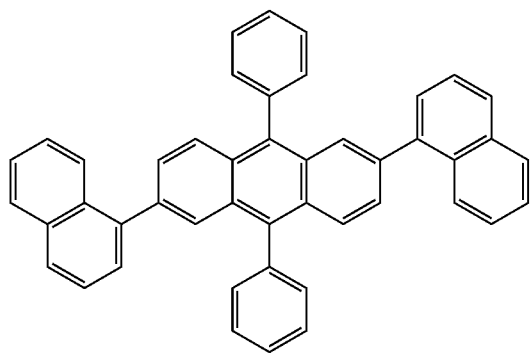
Inv-A78
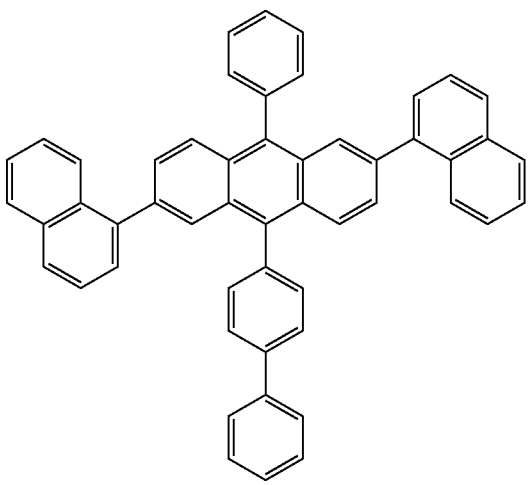
Inv-A79
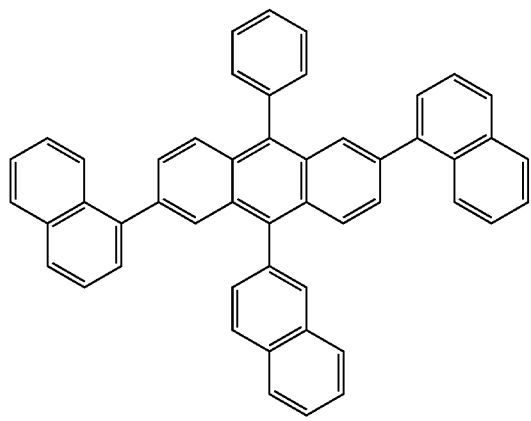
Inv-A80
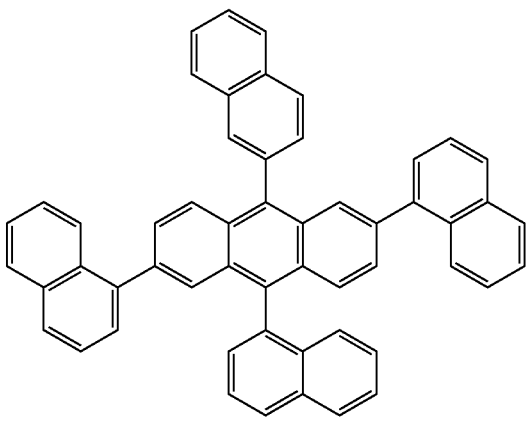

-continued
Inv-A81
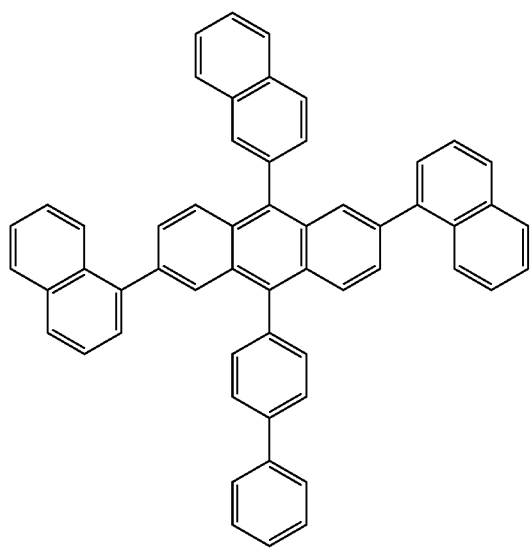
Inv-A82
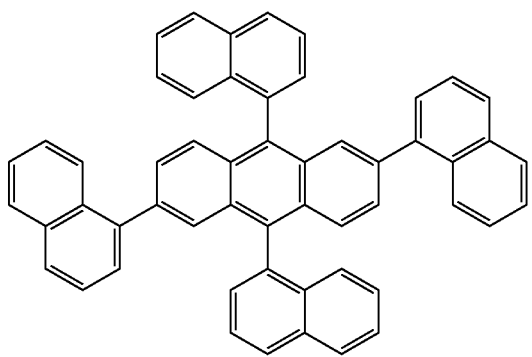
Inv-A83
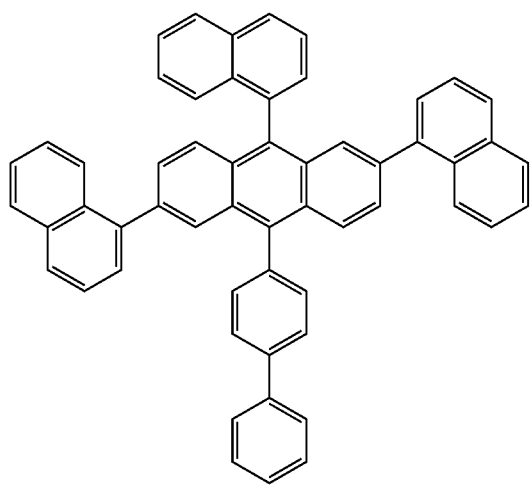
Inv-A84
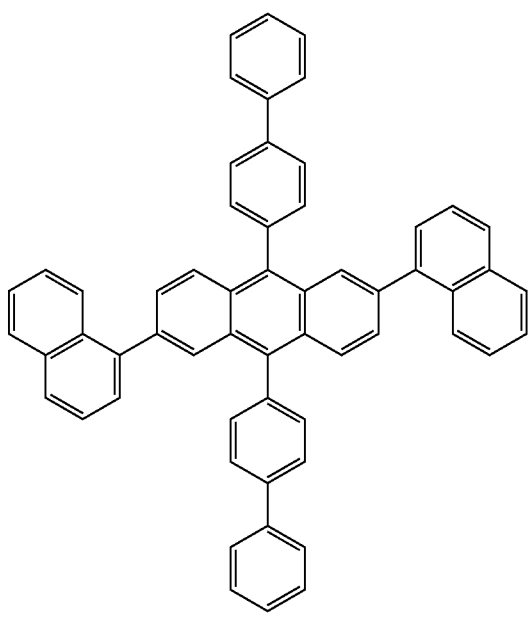
Inv-A85
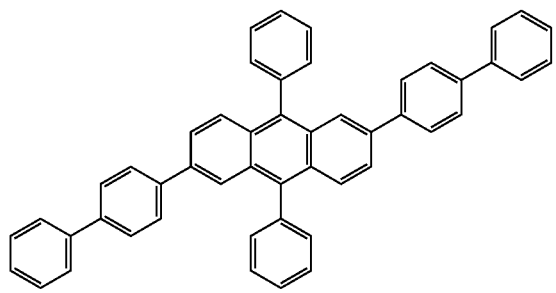
Inv-A86
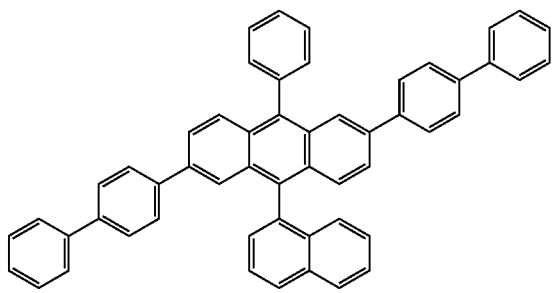

-continued
Inv-A87
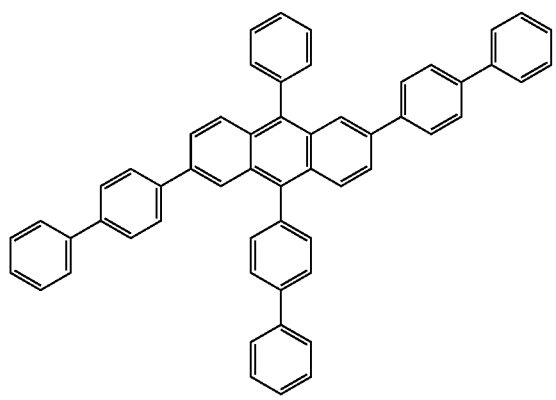
Inv-A88
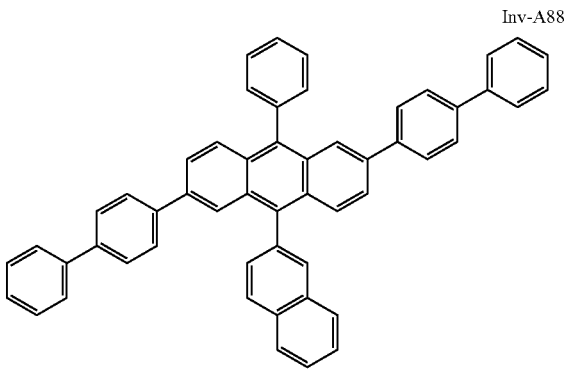
Inv-A89
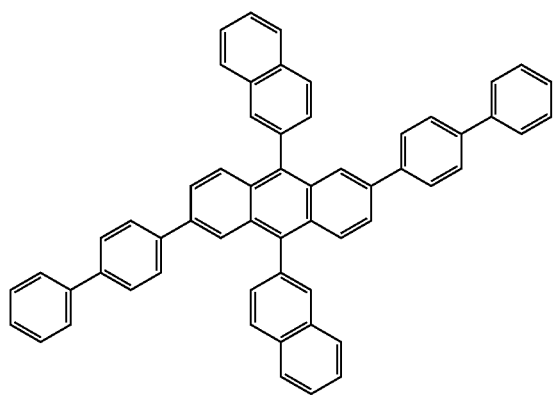
Inv-A90
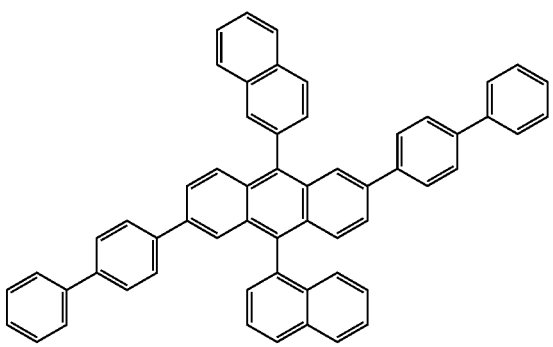
Inv-A91
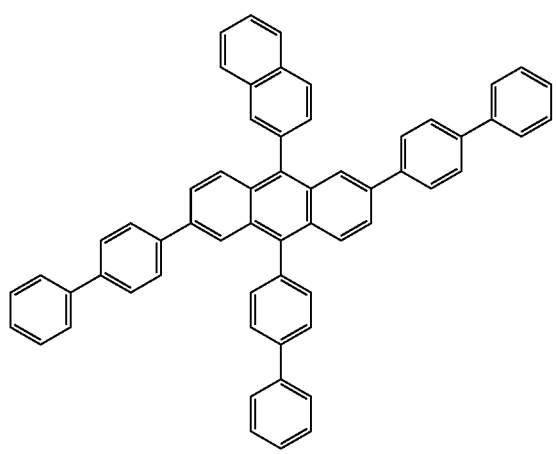
Inv-A92
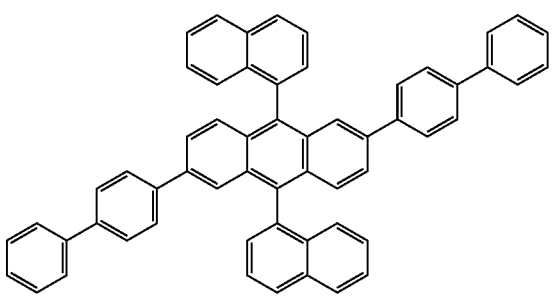

-continued
Inv-A93
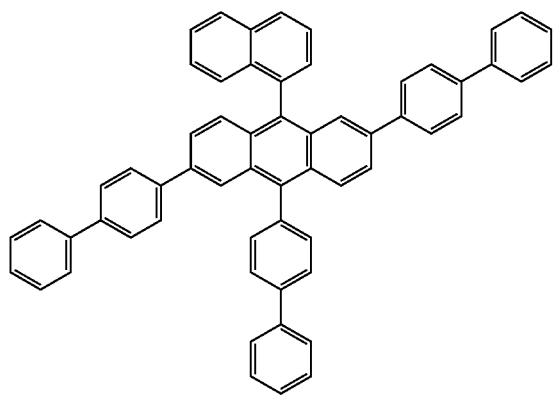
Inv-A94
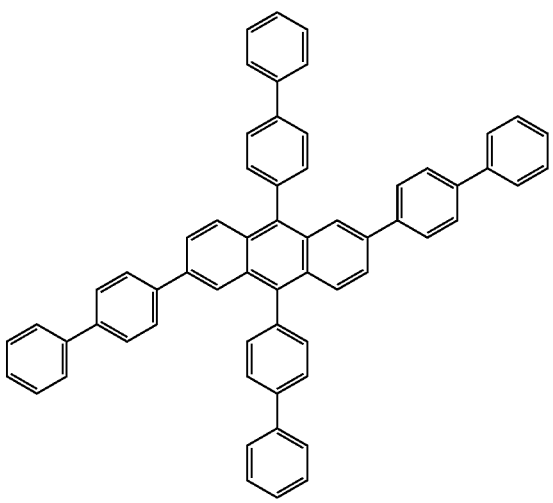
Inv-A95
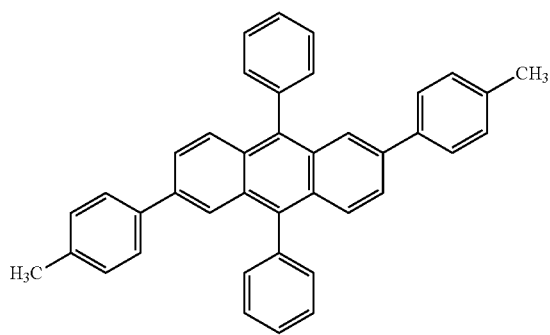
Inv-A96
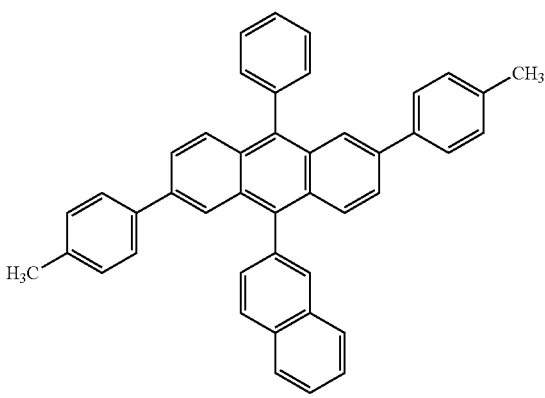
Inv-A97
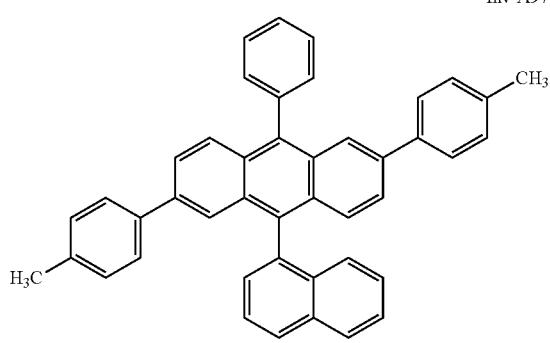
Inv-A98
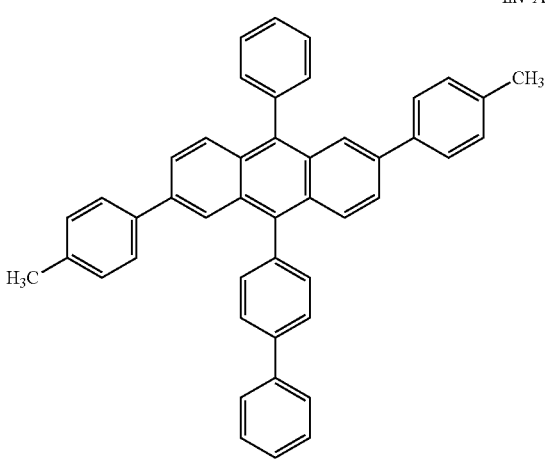

-continued
Inv-A99
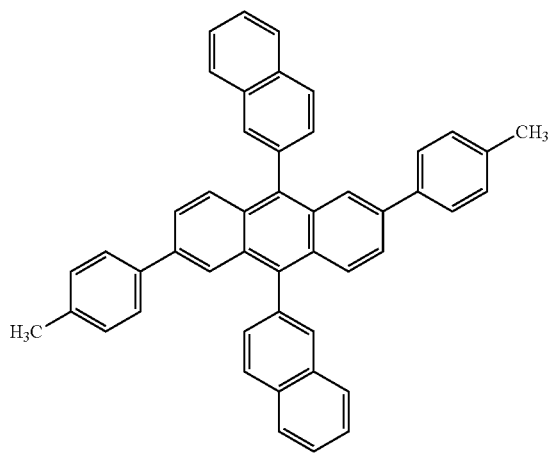
Inv-A100
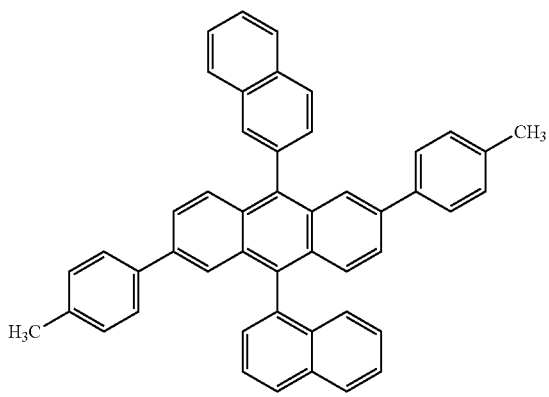
Inv-A101
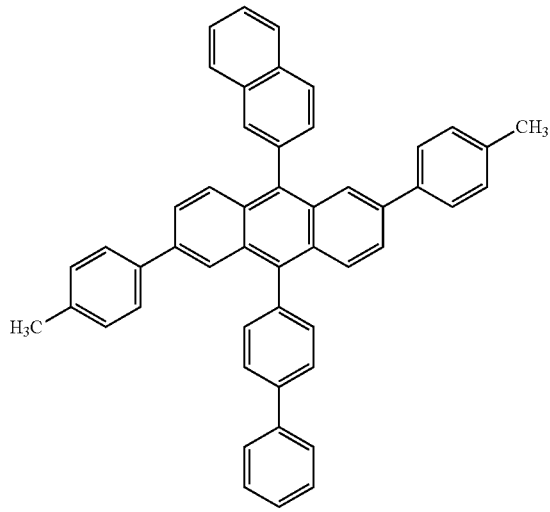
Inv-A102
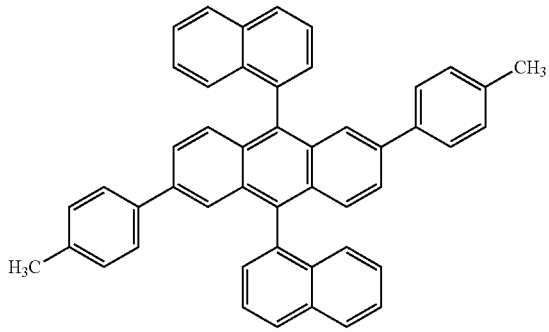
Inv-A103
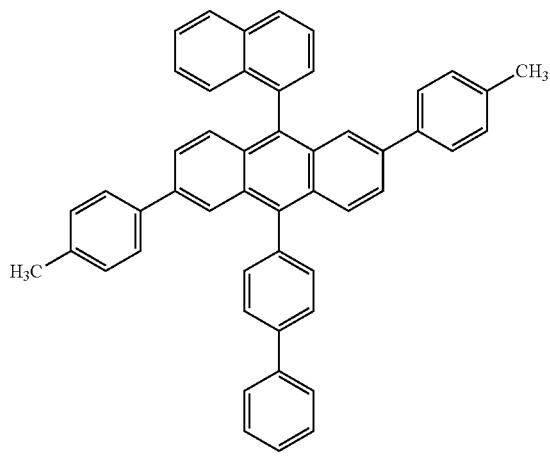
Inv-A104
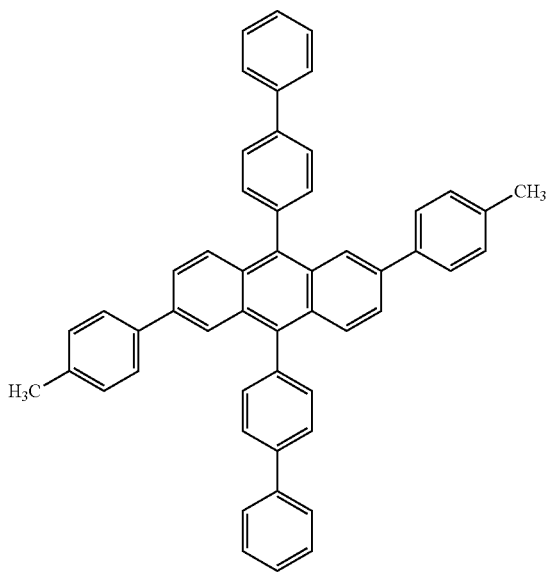

-continued
Inv-A105
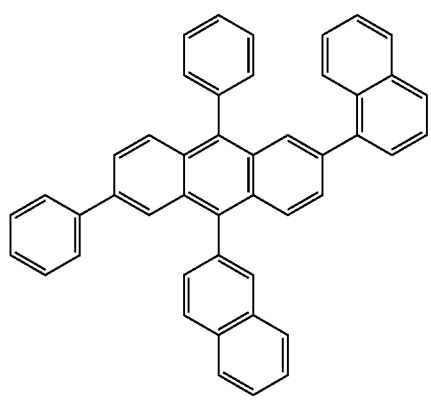
Inv-A106
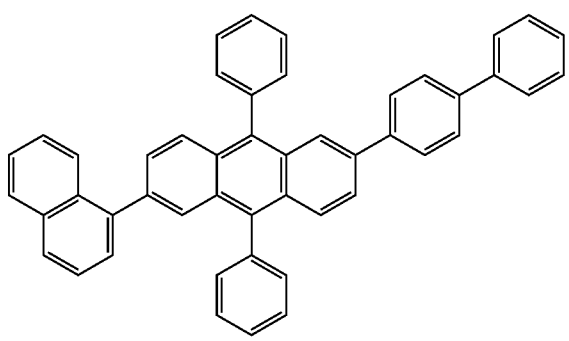
Inv-A107
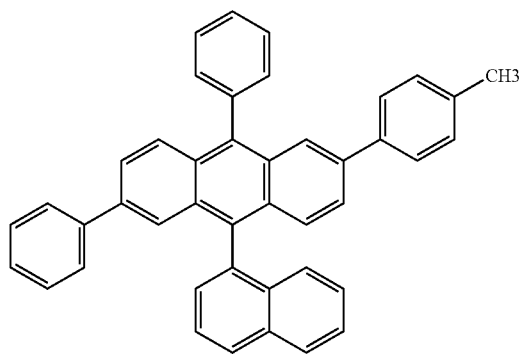
Inv-A108
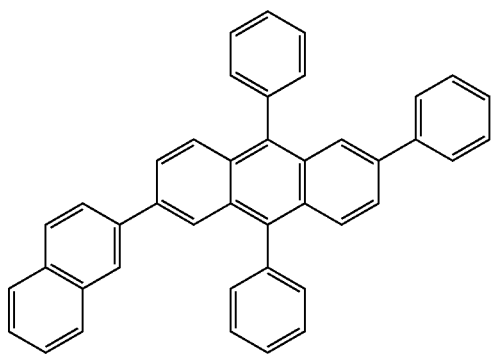
Inv-A109
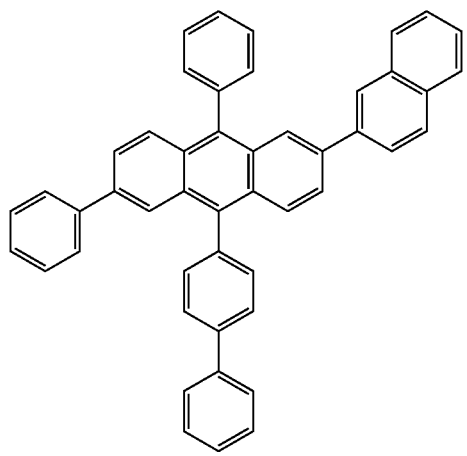
Inv-A110
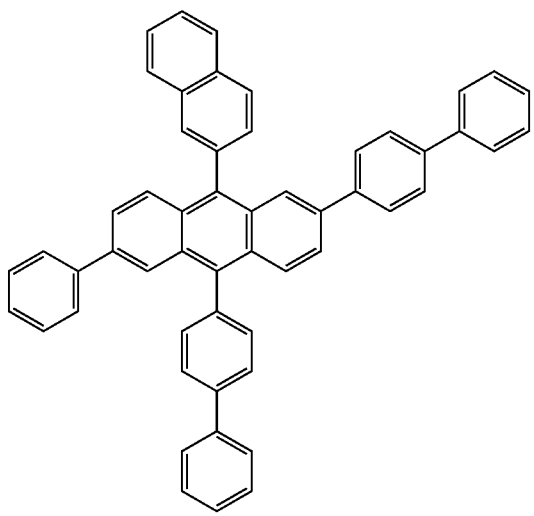
Inv-A111
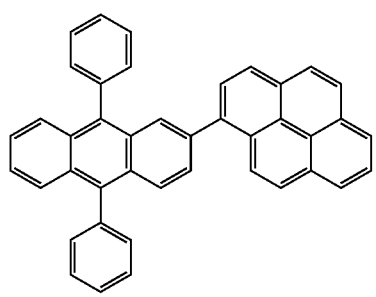
Inv-A112
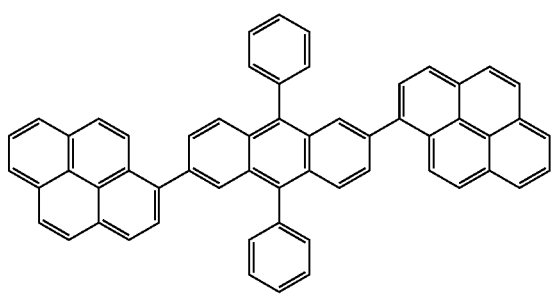

-continued
Inv-A113
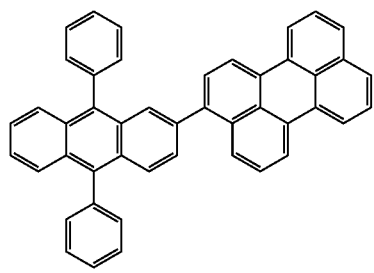
Inv-A114
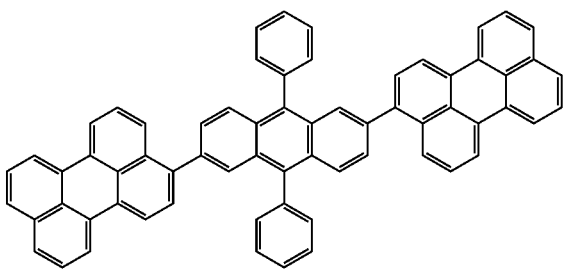
Inv-A115
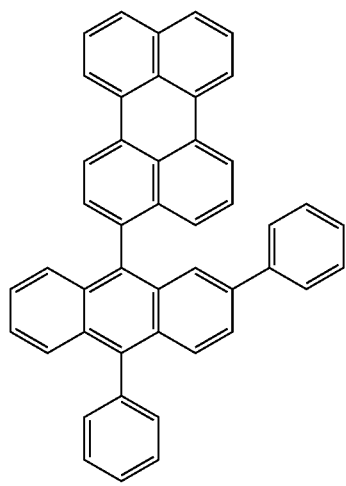
Inv-A116
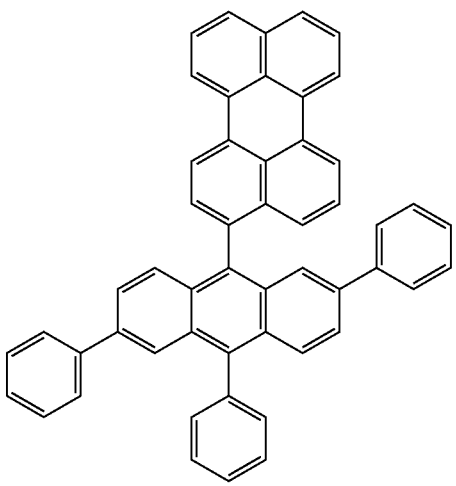
A117
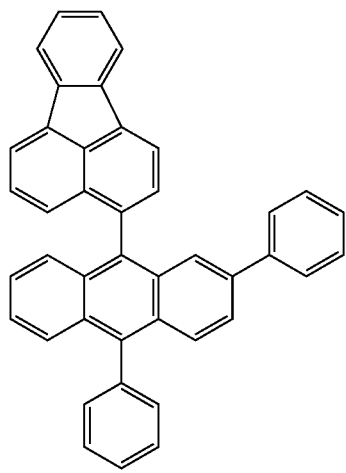
A118
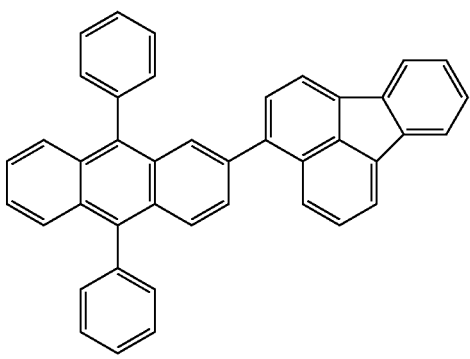
A119
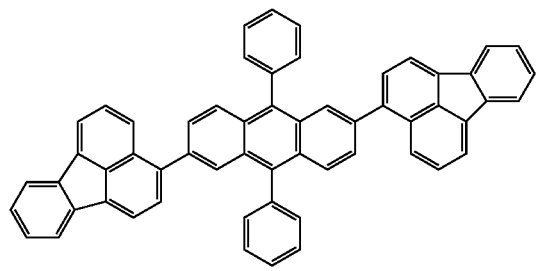
A120
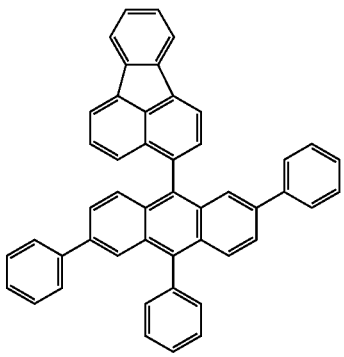

-continued
A121
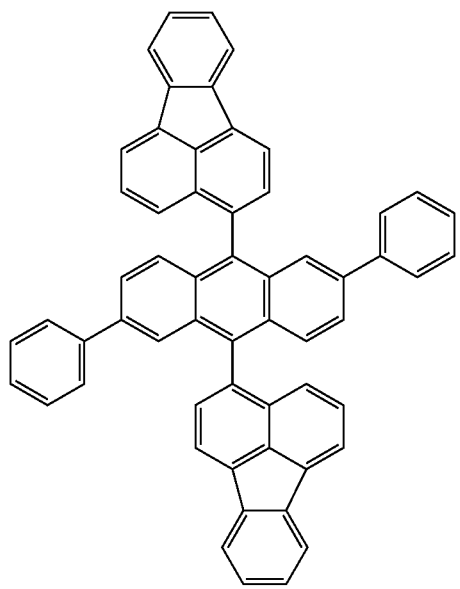
A122
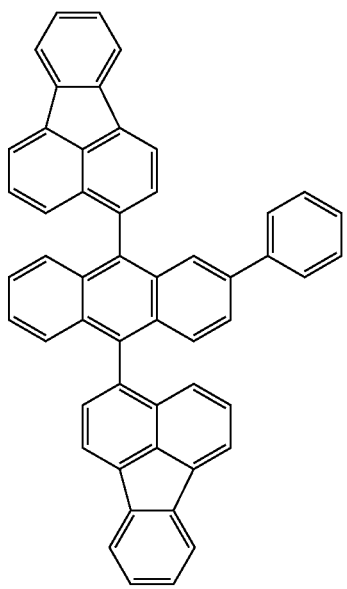
A123
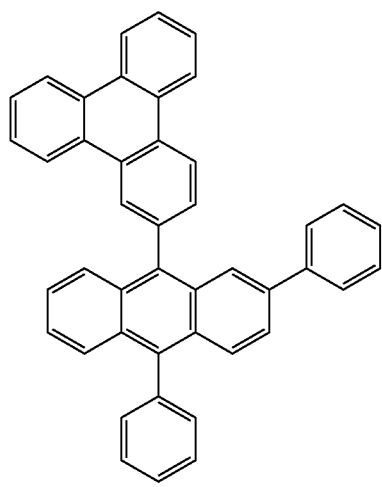
A124
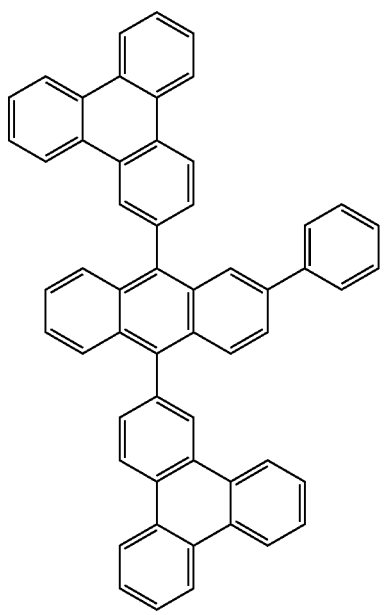
A125
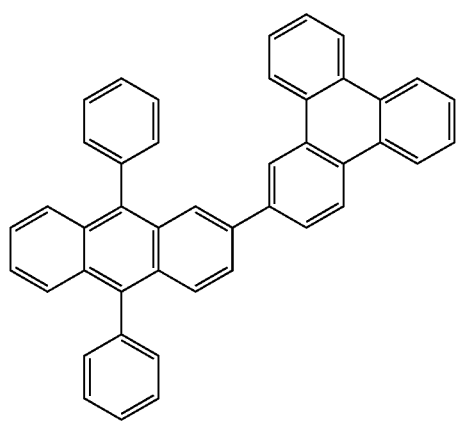
A126
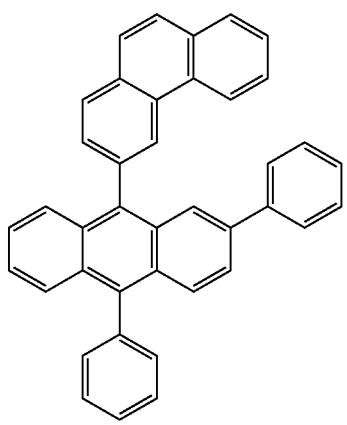

-continued
A127
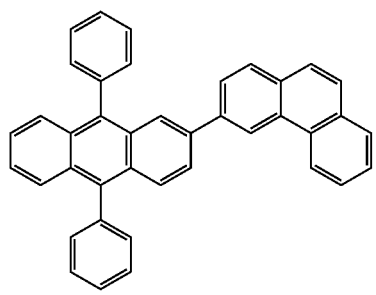
A128
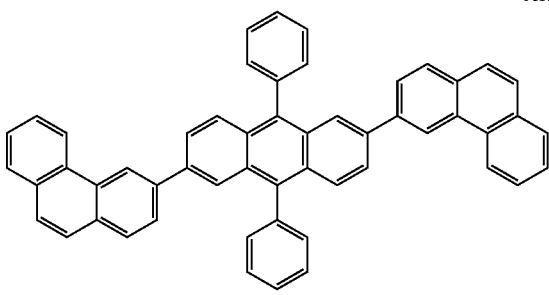
A129
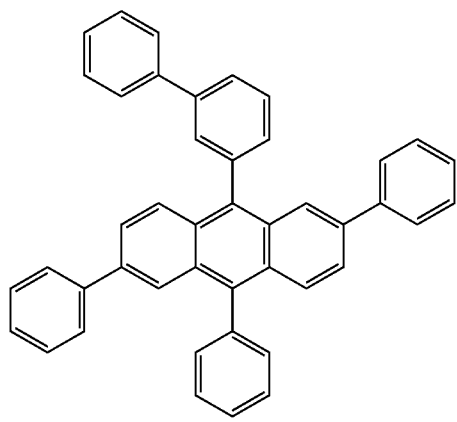
A130
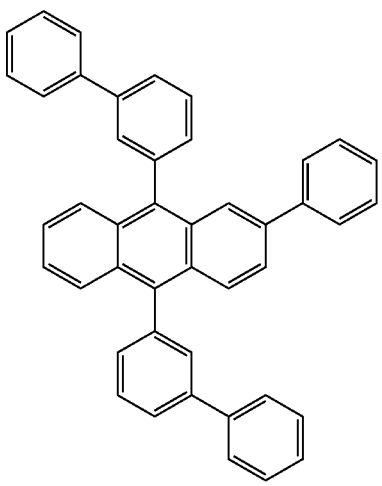
A131
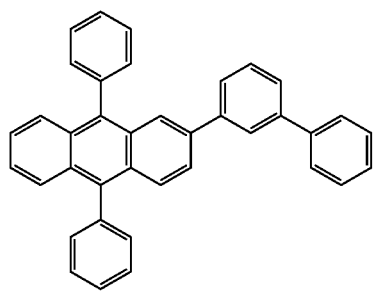
A132
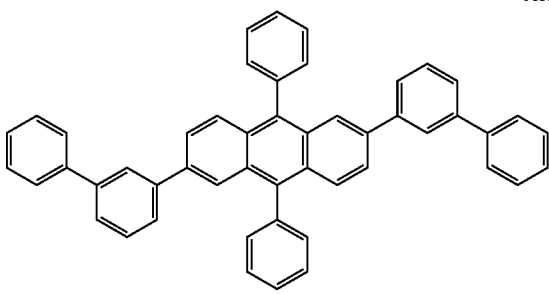
A133
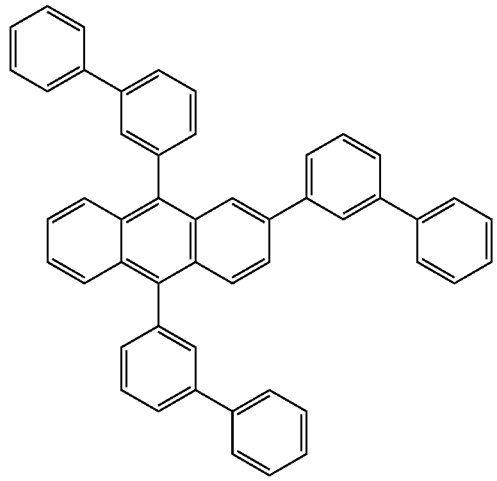
A134
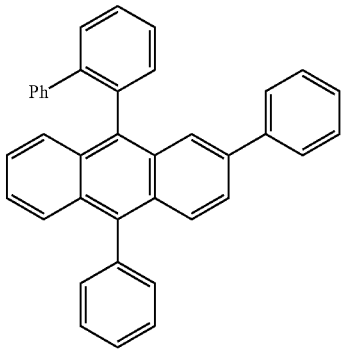

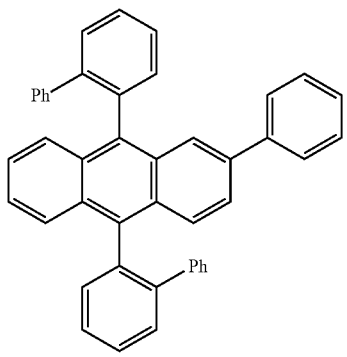
A135

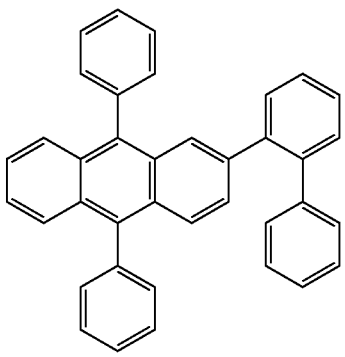
A136

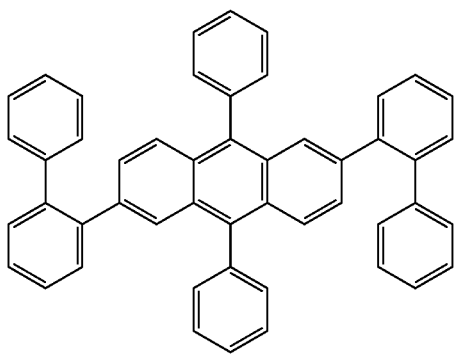
A137

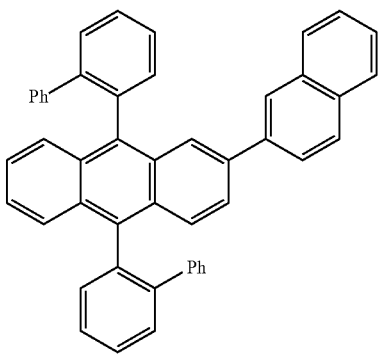
A138

In one suitable embodiment, the light-emitting second anthracene compound (b) is represented by formula [4],

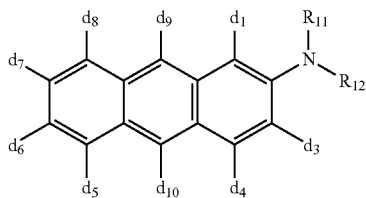
[4]

wherein $R_{11}$ and $R_{12}$ represent aryl or alkyl groups and $d_1$ and $d_3$-$d_{10}$ may be the same or different and each represents hydrogen or an independently selected substituent and at least one of $d_1$ and $d_3$-$d_{10}$ is a further amino group bearing two substituents selected from alkyl or aryl groups. In another suitable embodiment, $d_6$ of formula [4] represents a further amino group. In another suitable embodiment, $d_6$ and $d_9$ independently represent further amino groups. In another suitable embodiment, $d_6$, $d_9$ and $d_{10}$ independently represent further amino groups.

In another suitable embodiment, the light-emitting second anthracene compound (b) is represented by formula [5],

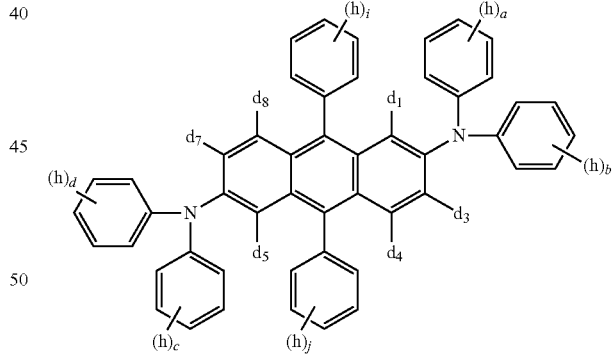
[5]

wherein $d_1$, $d_3$-$d_5$ and $d_7$-$d_8$ may be the same or different and each represents hydrogen or an independently selected substituent and each h may be the same or different and each represents an independently selected substituent, provided that two substituents may combine to form a ring group and a-d, i and j are independently 0-5.

In another suitable embodiment, the light-emitting second anthracene compound (b) is represented by formula [6],

[6]

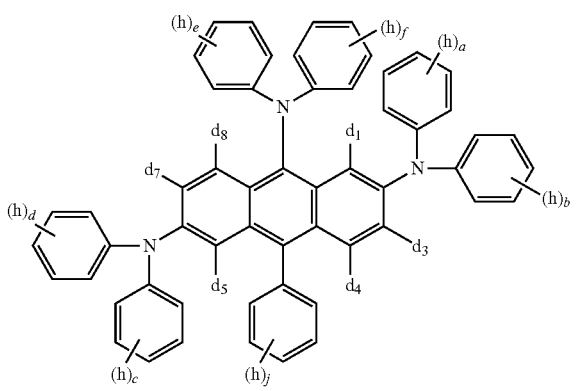

wherein $d_1$, $d_3$-$d_5$ and $d_7$-$d_8$ may be the same or different and each represents hydrogen or an independently selected substituent and each h may be the same or different and each represents an independently selected substituent, provided that two substituents may combine to form a ring group and a-f, and j are independently 0-5.

In another suitable embodiment, the light-emitting second anthracene compound (b) is represented by formula [7],

[7]

wherein $d_1$, $d_3$-$d_5$ and $d_7$-$d_8$ may be the same or different and each represents hydrogen or an independently selected substituent and each h may be the same or different and each represents an independently selected substituent, provided that two substituents may combine to form a ring group and a-h are independently 0-5.

In one suitable embodiment, the light-emitting second anthracene compound (b) is present in an amount up to 50 volume %, preferably up to 20 volume % and more preferably up to 10 volume %.

In another embodiment the light-emitting second anthracene compound (b) has an oxidation potential of 0.8 V vs. SCE or less and suitably an oxidation potential of 0.7 V vs. SCE or less. Desirably the oxidation potential of the 2,6-diamino-substituted anthracene is between 0.50 V and 0.8 V vs. SCE and suitably between 0.55 V and 0.70 V vs. SCE.

Oxidation potentials can be measured by well-known literature procedures, such as cyclic voltammetry (CV) and Osteryoung square-wave voltammetry (SWV). For a review of electrochemical measurements, see J. O. Bockris and A. K. N. Reddy, *Modern Electrochemistry*, Plenum Press, New York; and A. J. Bard and L. R. Faulkner, *Electrochemical Methods*, John Wiley & Sons, New York, and references cited therein.

Inventive light-emitting second anthracene compound (b) materials can be synthesized by various methods known in the literature. By way of illustration, some materials of light-emitting second anthracene compound (b) can be prepared as shown in Scheme III, where $Ar_1$, $Ar_2$, and $Ar_3$ represent independently selected aromatic groups. The starting material, 2,6-dibromoanthraquinone (Int-D) can be synthesized according to a literature procedure according to Hodge et al. (*Chem. Commun. (Cambridge)*, 1, 73-74 (1997)). Diaminoanthraquinone derivatives (Int-G, equation G) can be synthesized using palladium catalyzed amination chemistry, which was developed by Hartwig et al. (*J. Org. Chem.*, 64, 5575-80 (1999)). Reaction of (Int-G) with either a grignard reagant or an aryllithiated species will afford the intermediate diol (Int-H, equation H). The crude diol can be reduced using a procedure developed by Smet et al. (*Tetrahedron*, 55, 7859-74 (1999)) using potassium iodide and sodium hypophosphite hydrate (equation I) to yield 2,6-anthracenediamine derivatives, P-3.

Scheme III:

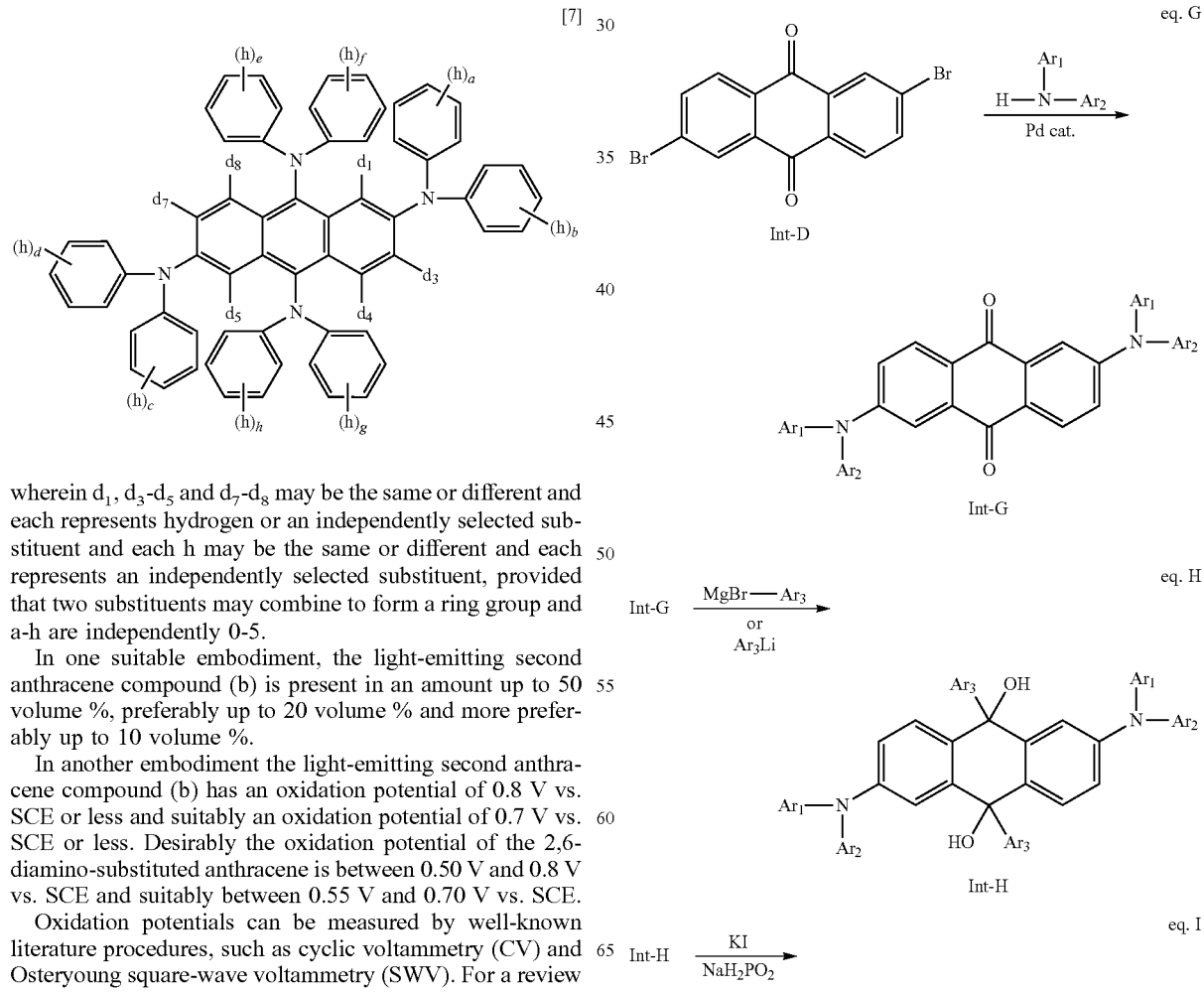

-continued

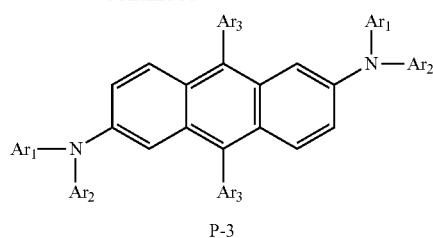

P-3

-continued

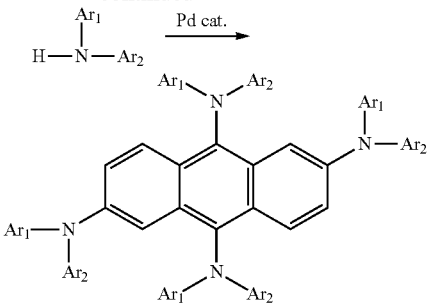

P-4

Scheme IV:

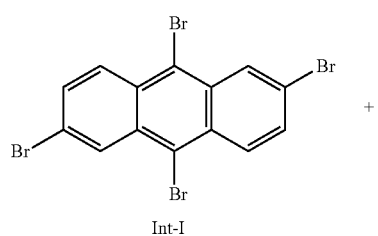

Int-I eq. J

Another route to additional light-emitting second anthracene compound (b) materials is depicted in Scheme IV. The starting material, 2,6,9,10-tetrabromoanthracene (Int-I), can be synthesized according to U.S. Pat. No. 4,341,852. Tetraminoanthracene derivatives can be synthesized using palladium catalyzed amination chemistry (equation J), which was developed by Hartwig et al., *J. Org. Chem.*, 64, 5575-80 (1999).

Illustrative, non-limiting examples of inventive light-emitting second anthracene compound (b) materials are listed below.

Inv-B1

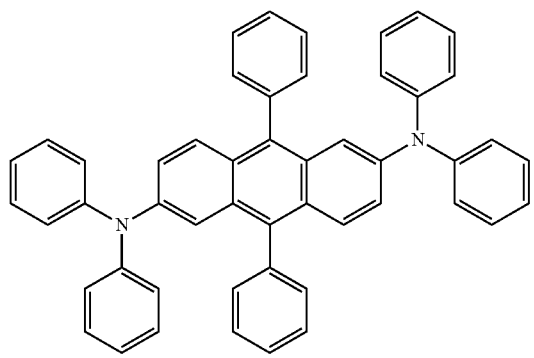

Inv-B2

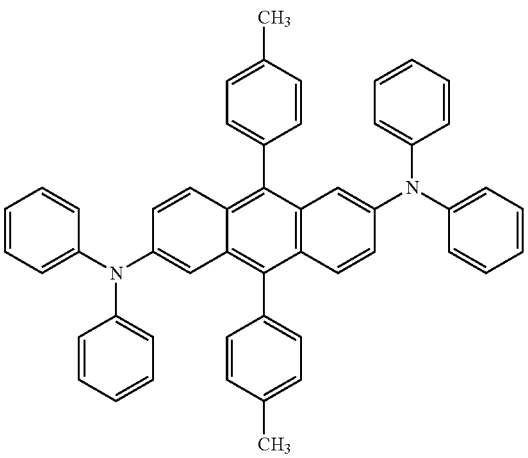

Inv-B3

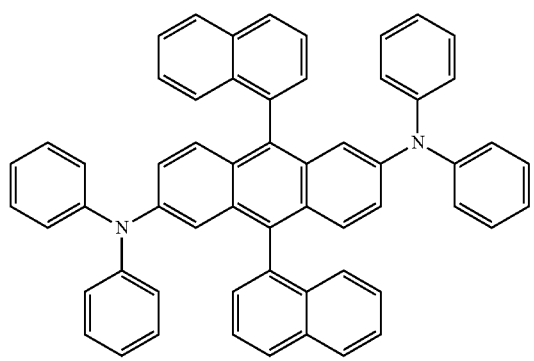

Inv-B4

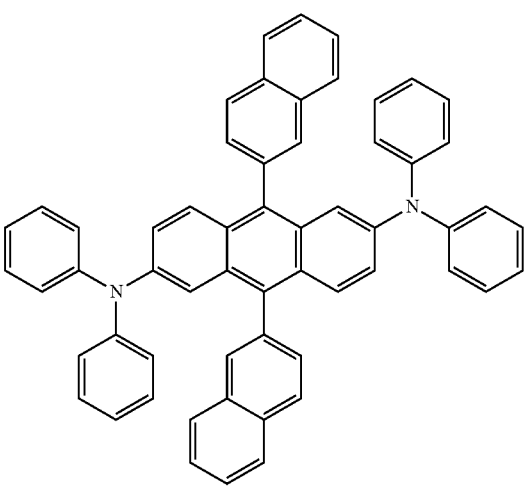

-continued
Inv-B5
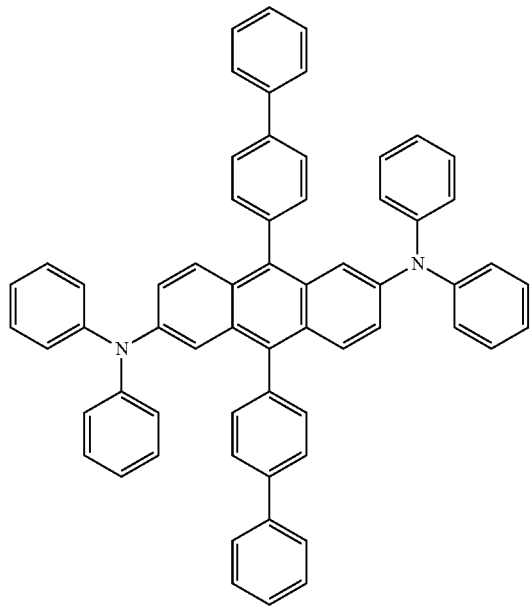
Inv-B6
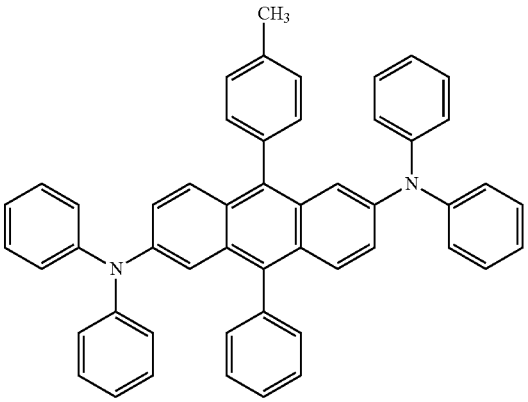
Inv-B7
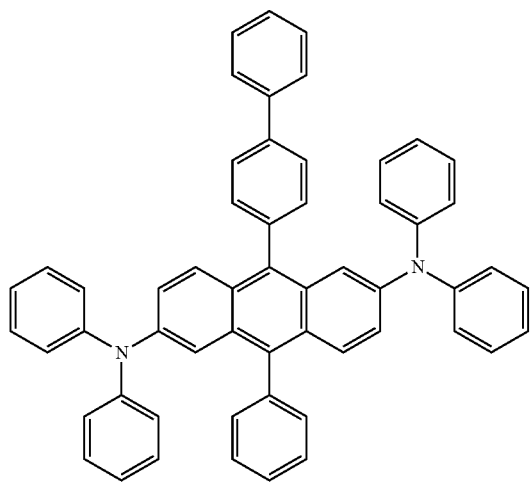
Inv-B8
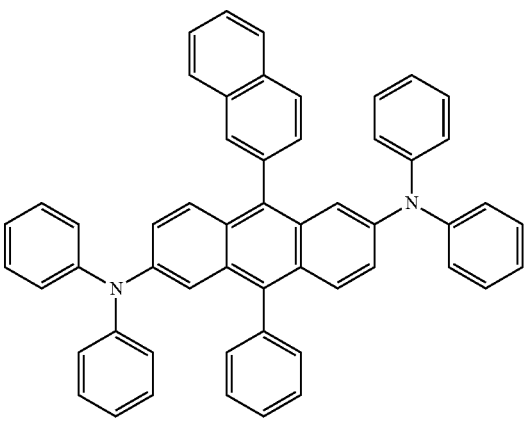
Inv-B9
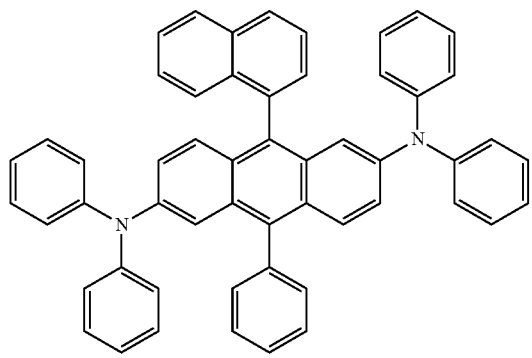
Inv-B10
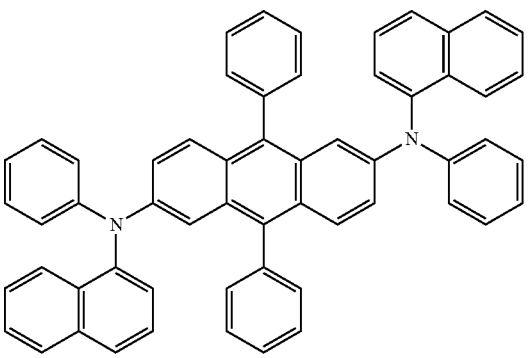

-continued
Inv-B11
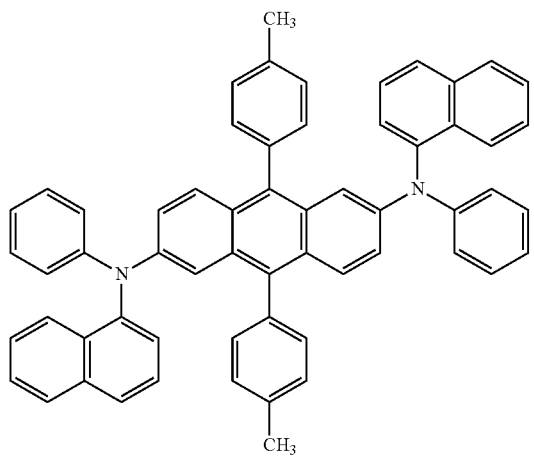
Inv-B12
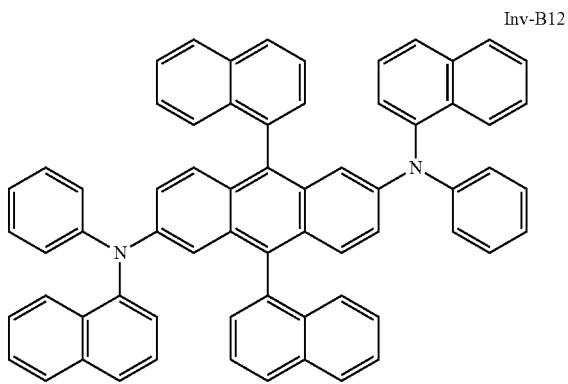
Inv-B13
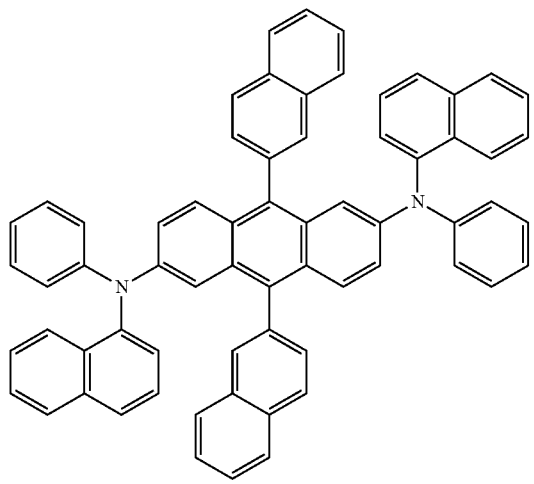
Inv-B14
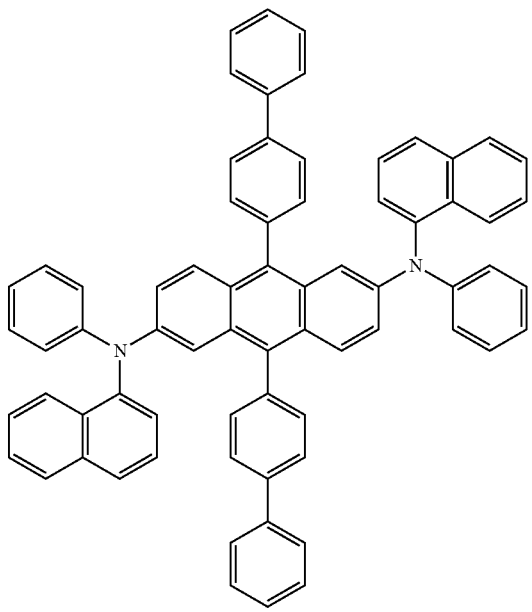
Inv-B15
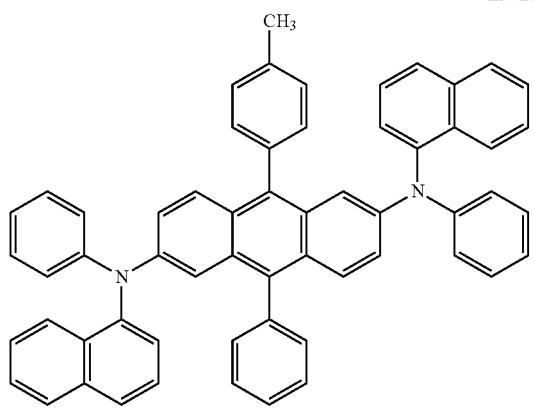
Inv-B16
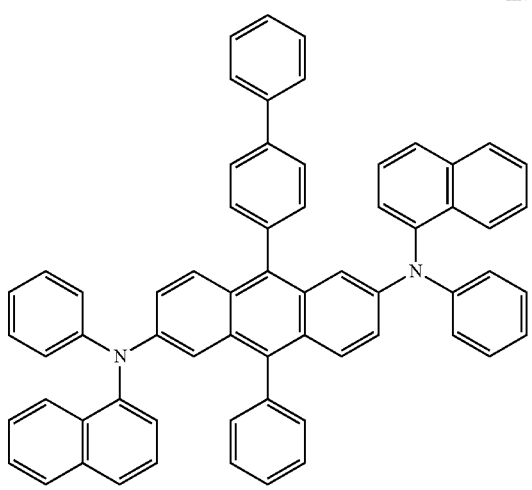

-continued
Inv-B17
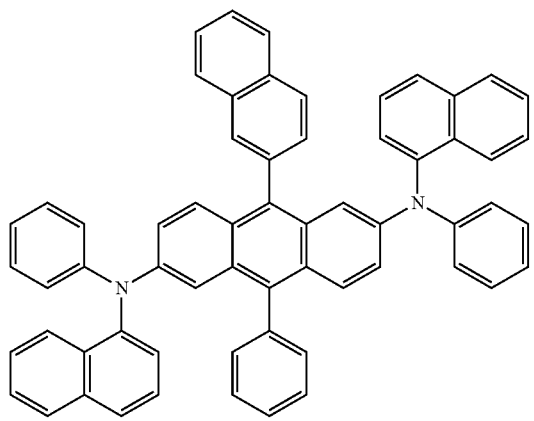
Inv-B18
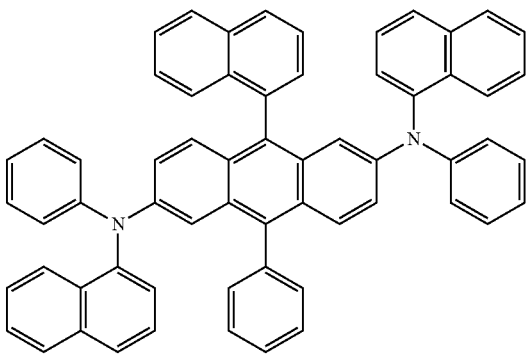
Inv-B19
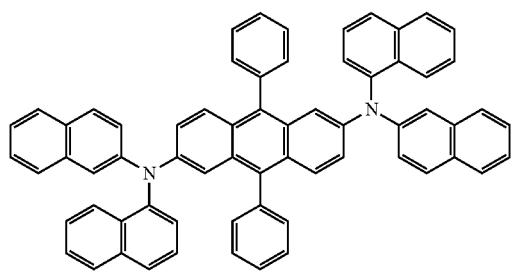
Inv-B20
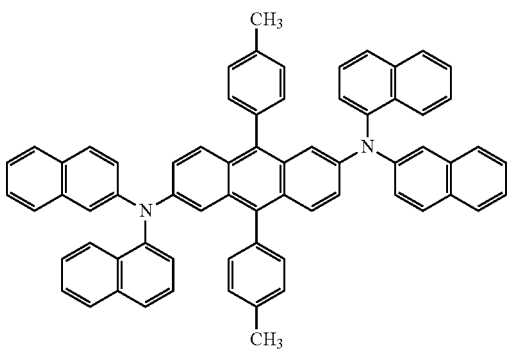
Inv-B21
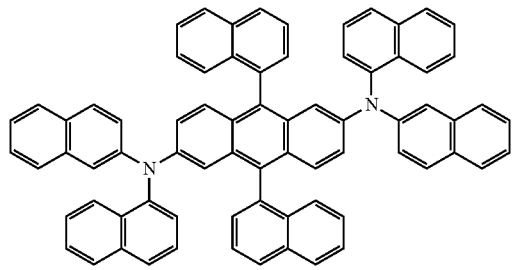
Inv-B22
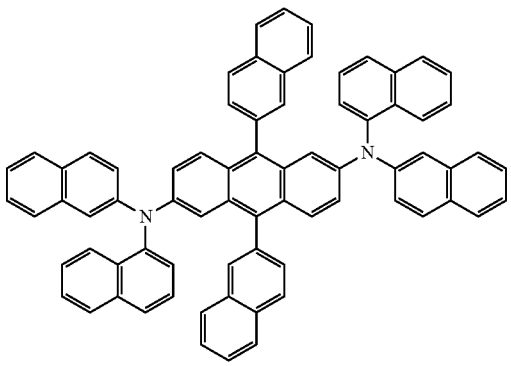
Inv-B23
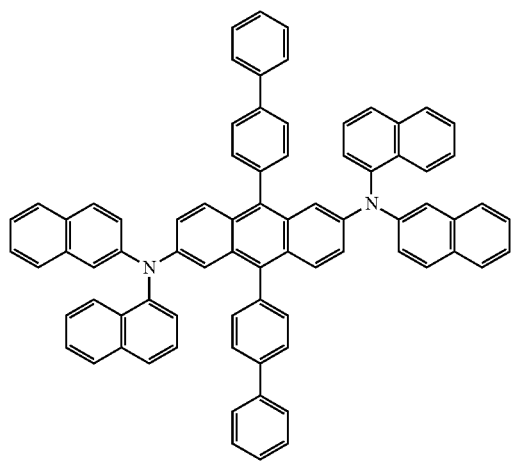
Inv-B24
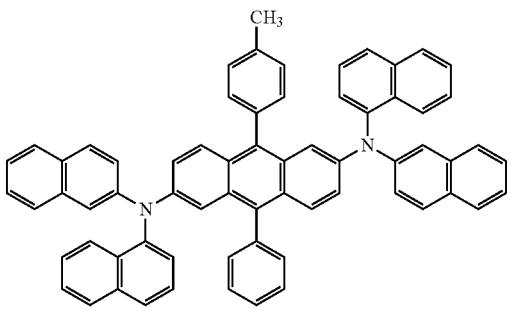

-continued
Inv-B25
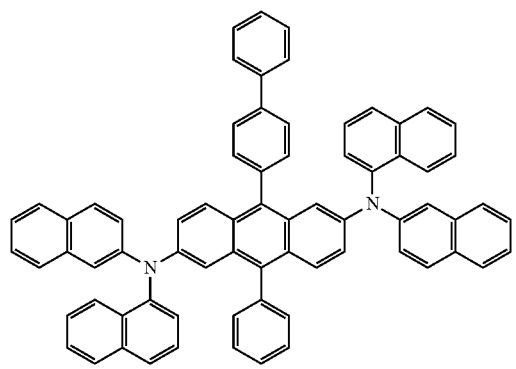
Inv-B26
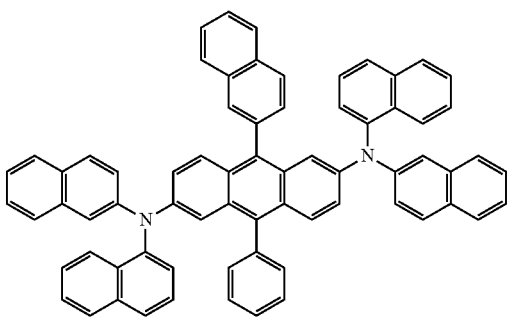
Inv-B27
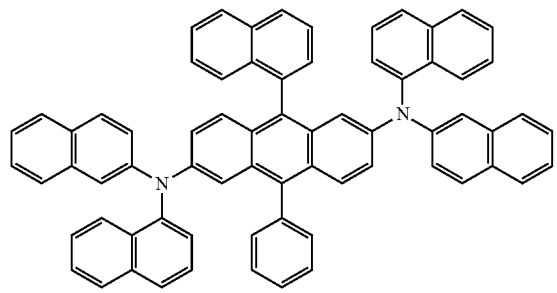
Inv-B28
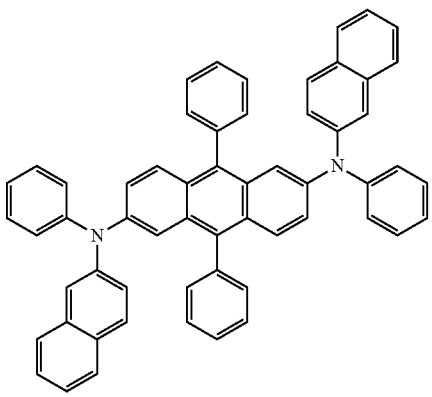
Inv-B29
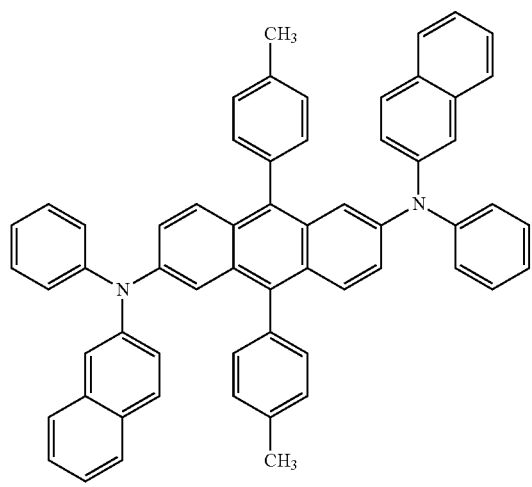
Inv-B30
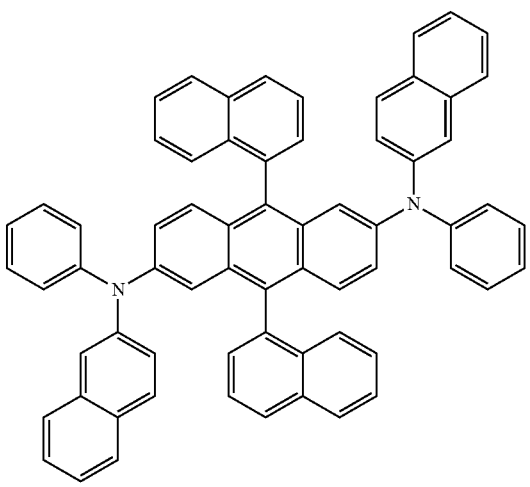

-continued
Inv-B31
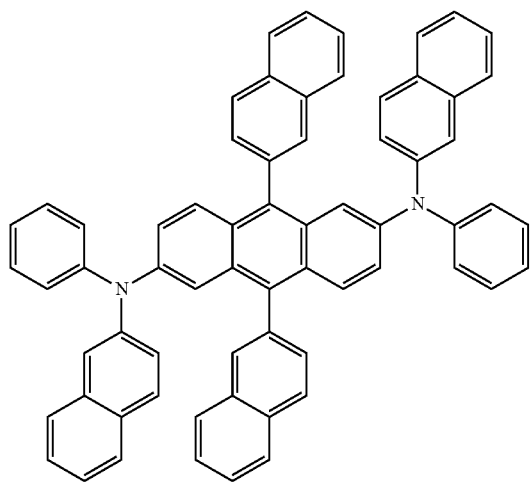
Inv-B32
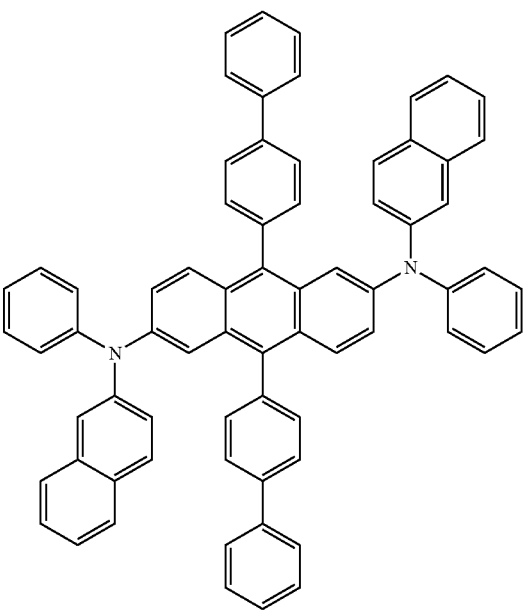
Inv-B33
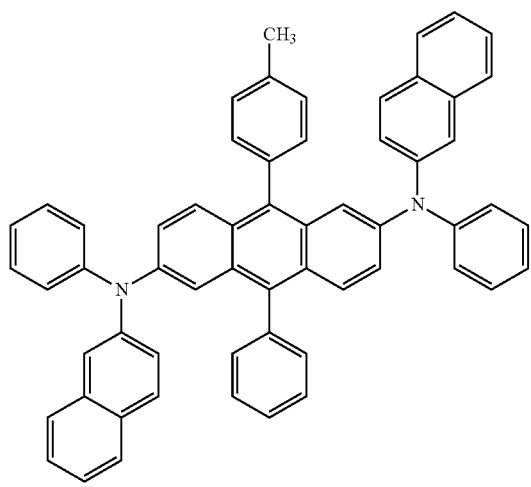
Inv-B34
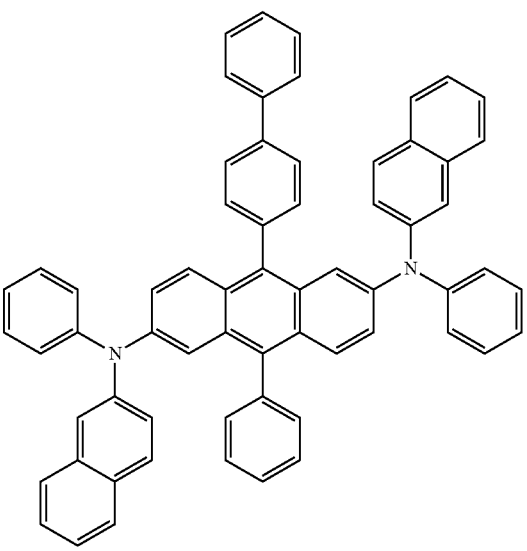
Inv-B35
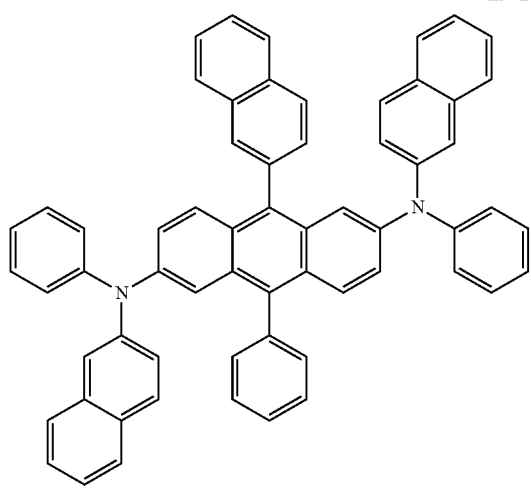
Inv-B36
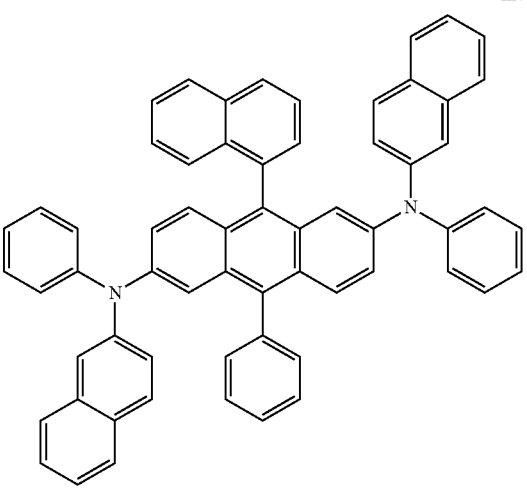

-continued
Inv-B37
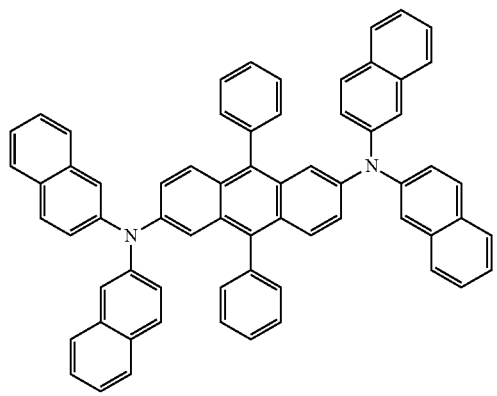
Inv-B38
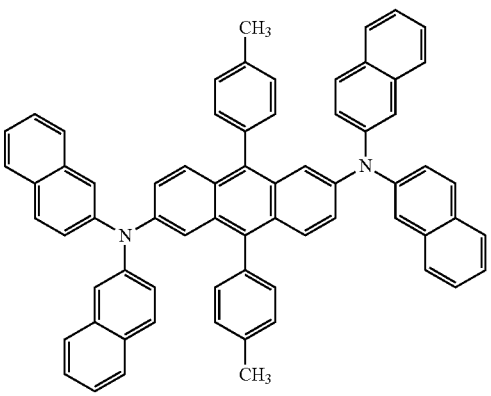
Inv-B39
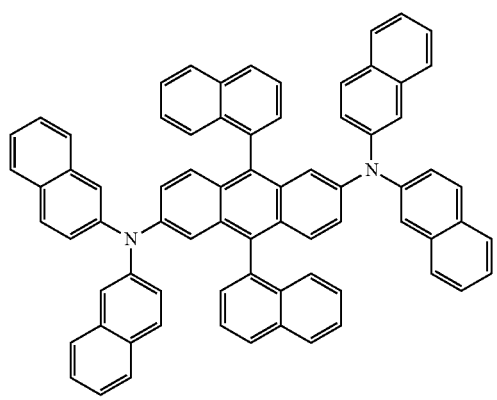
Inv-B40
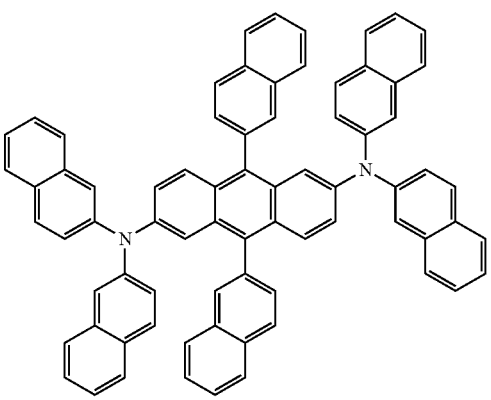
Inv-B41
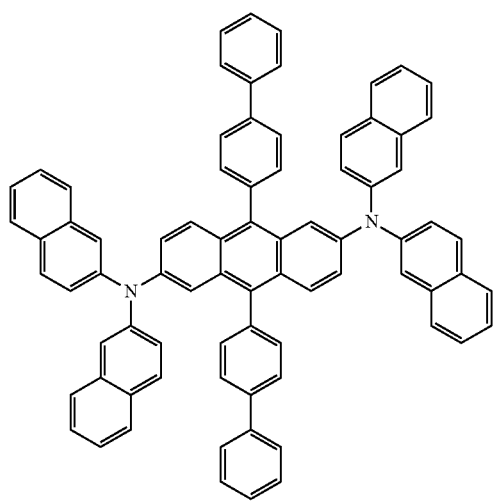
Inv-B42
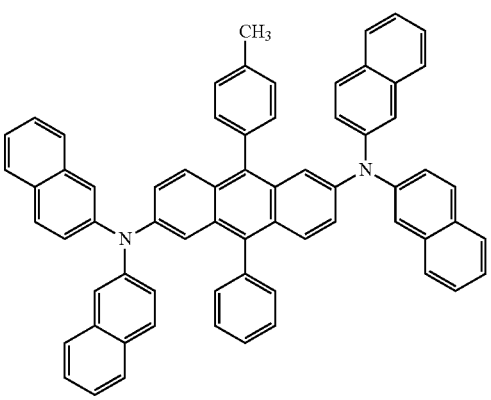

-continued
Inv-B43
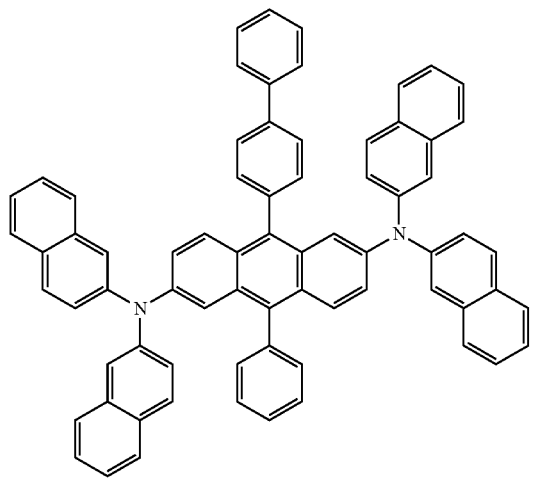
Inv-B44
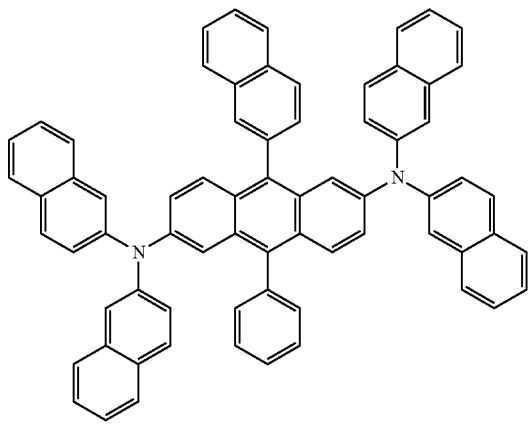
Inv-B45
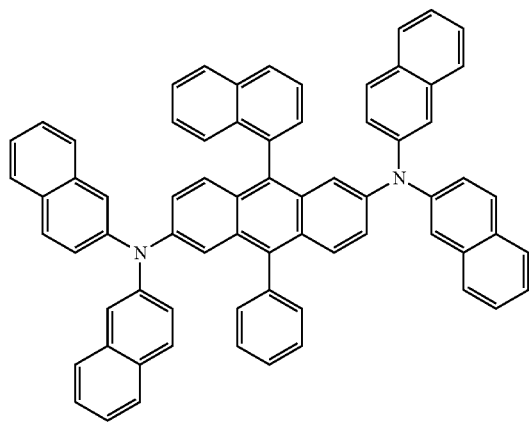
Inv-B46
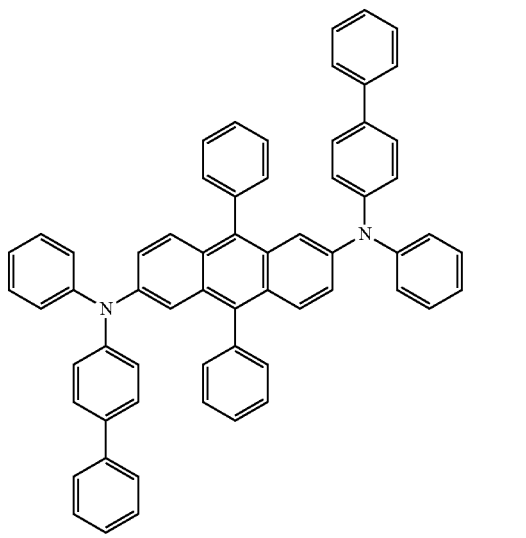
Inv-B47
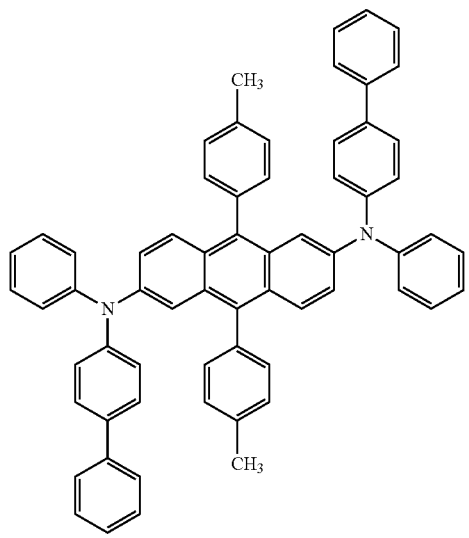
Inv-B48
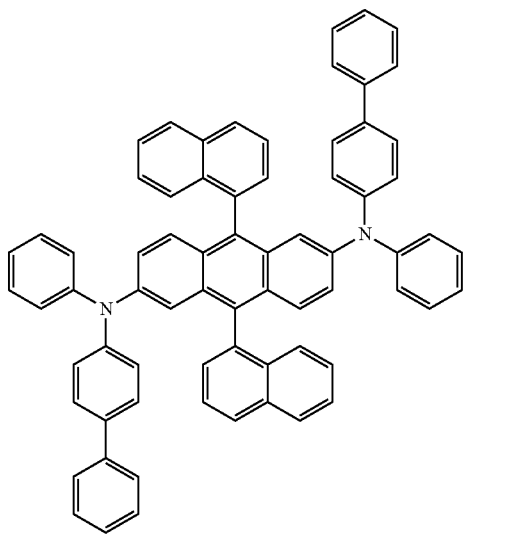

-continued
Inv-B49
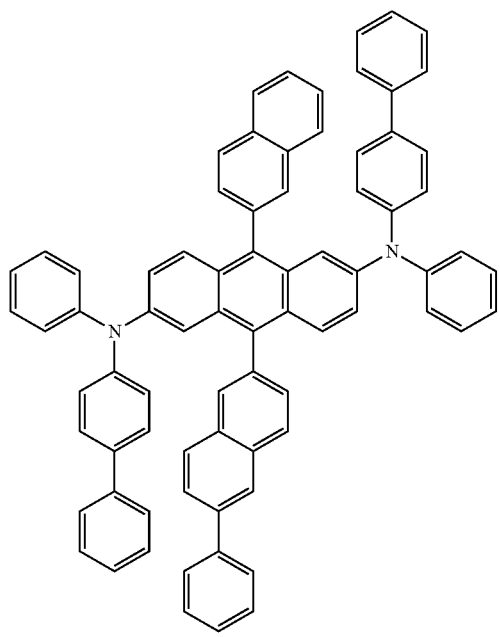
Inv-B50
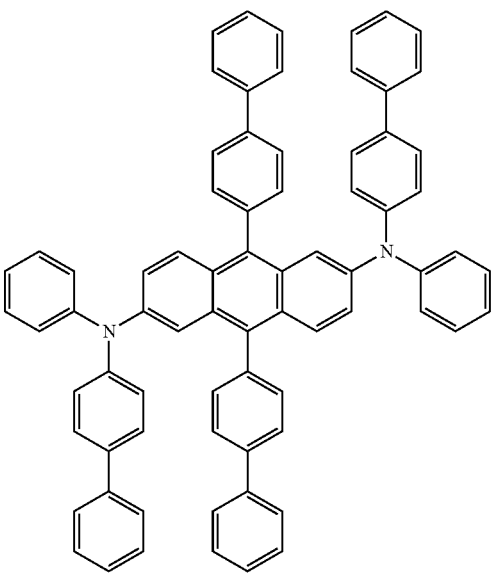
Inv-B51
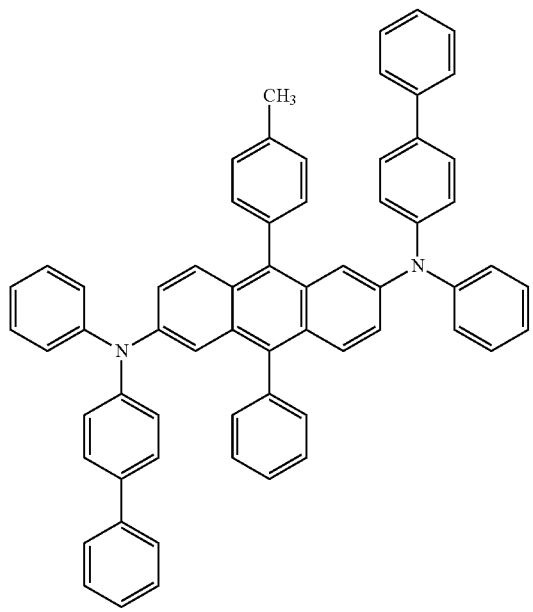
Inv-B52
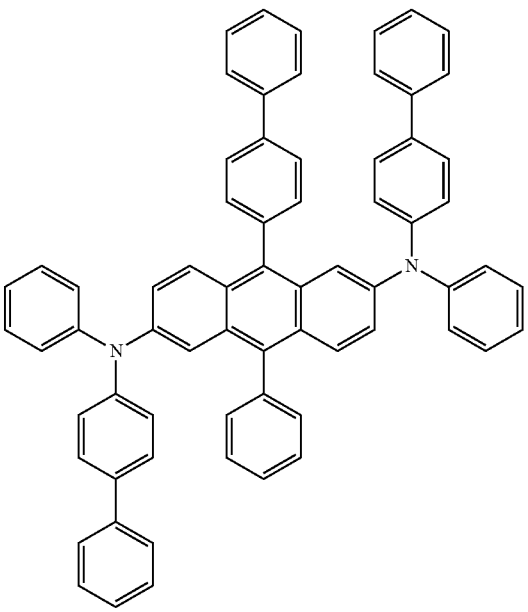

-continued
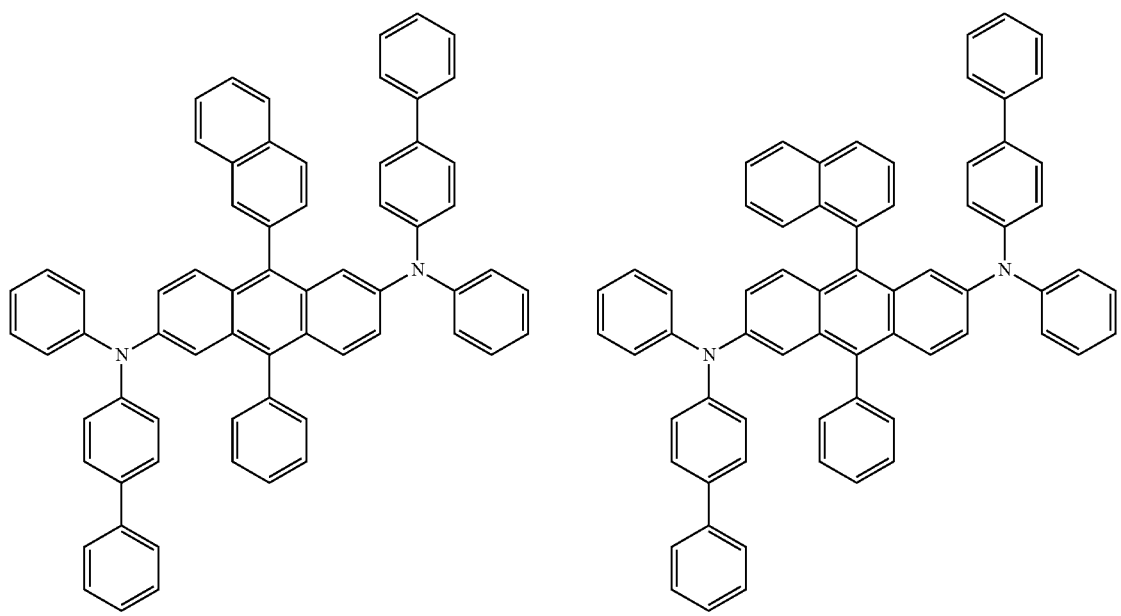
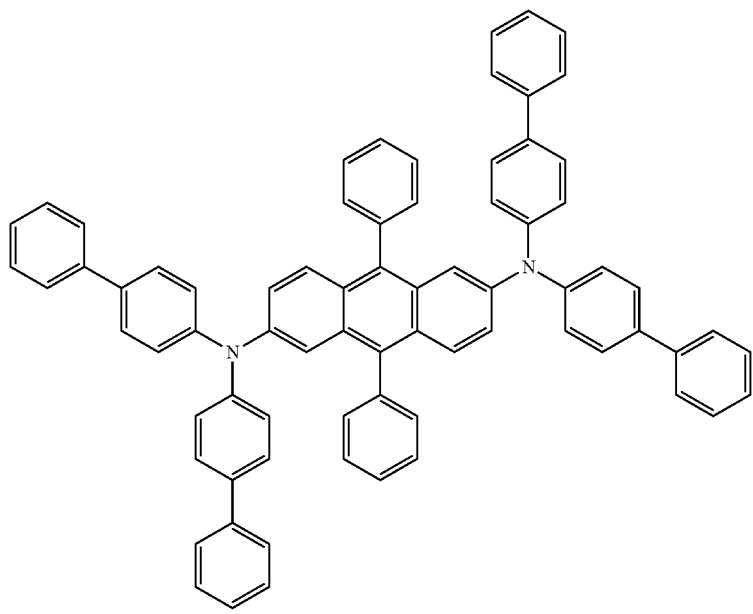

Inv-B56
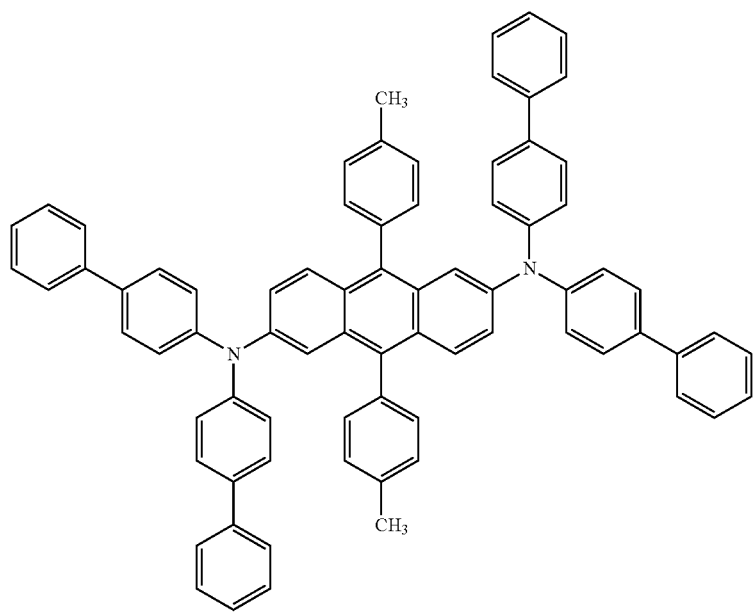
Inv-B57
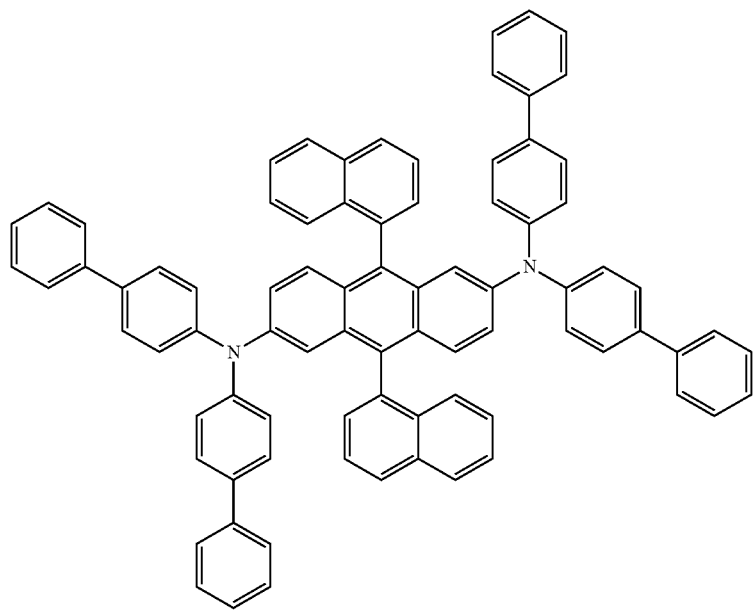

Inv-B58
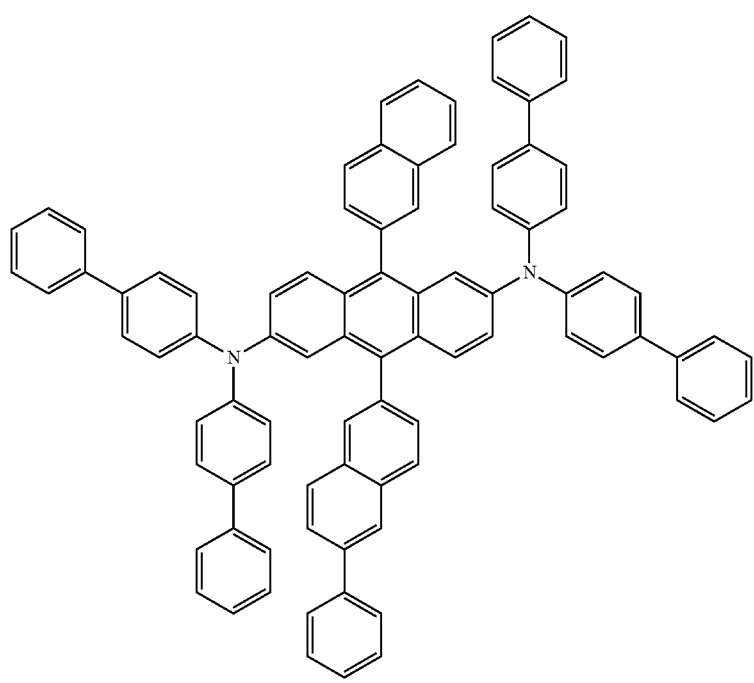
Inv-B59

Inv-B60
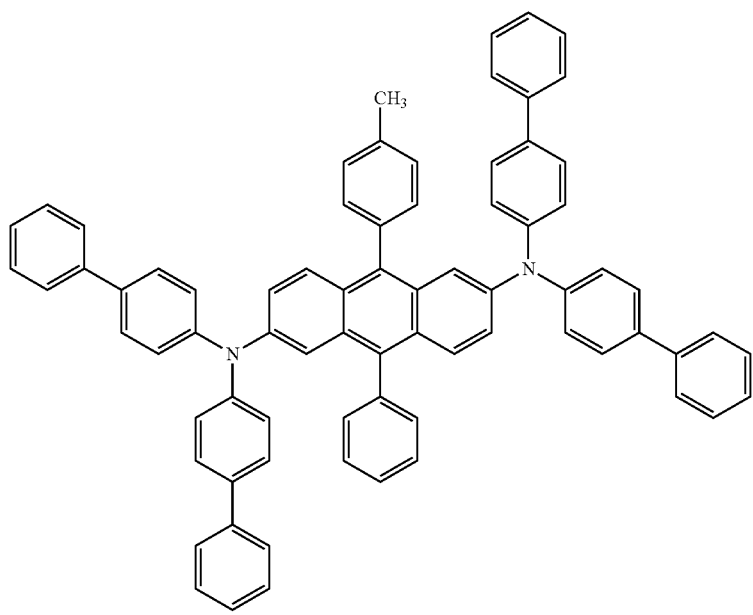
Inv-B61
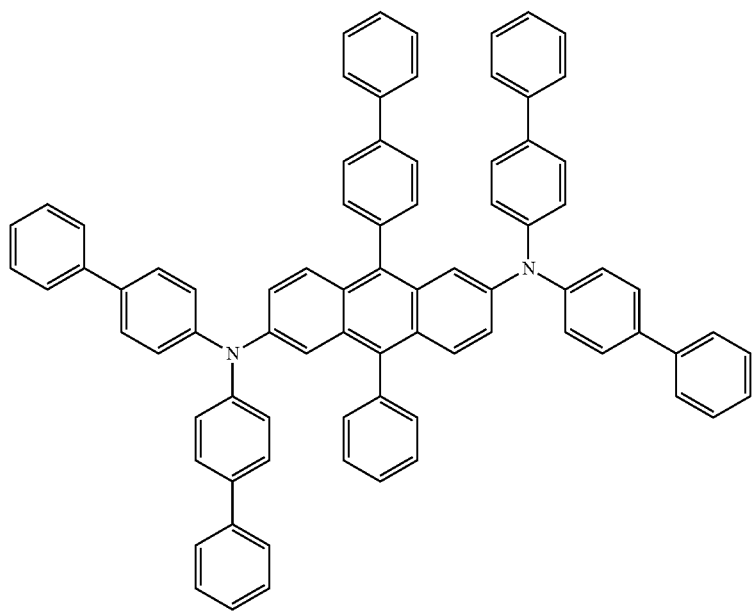

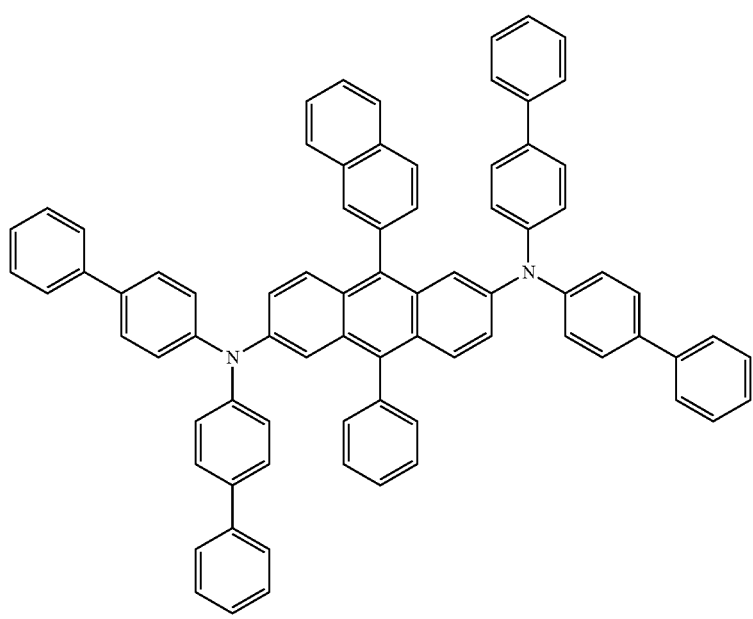
Inv-B62
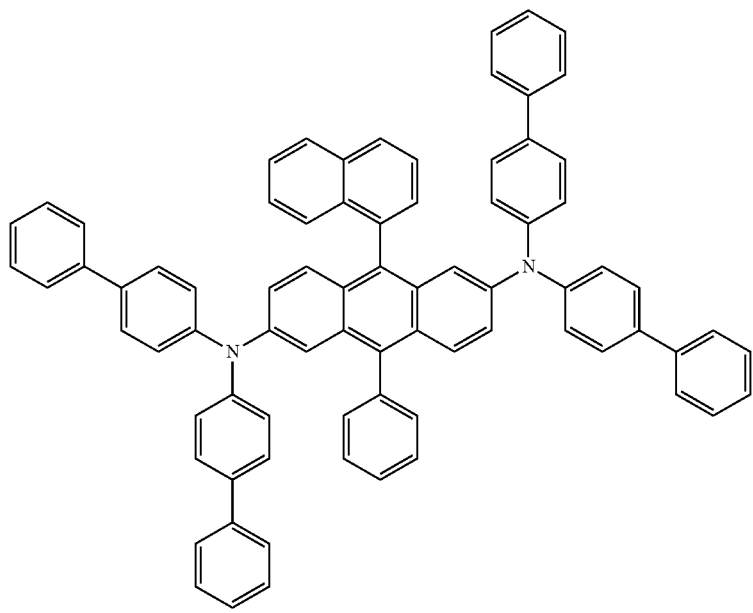
Inv-B63

-continued
Inv-B64
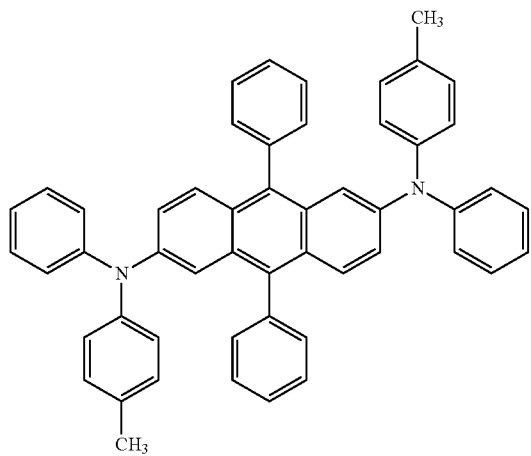
Inv-B65
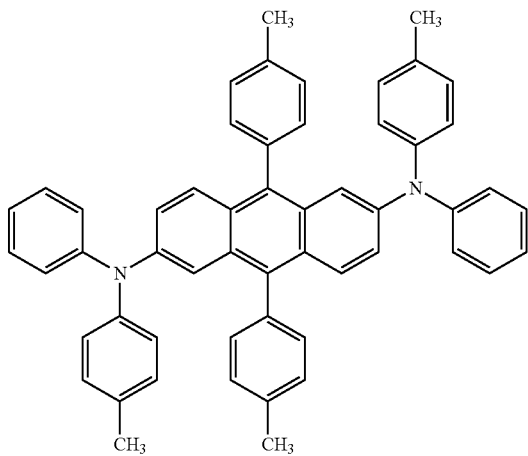
Inv-B66
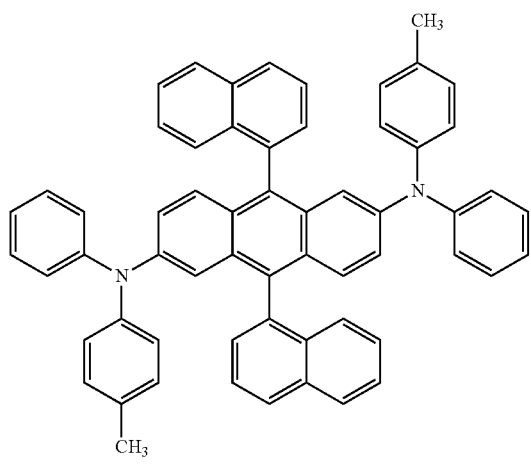
Inv-B67
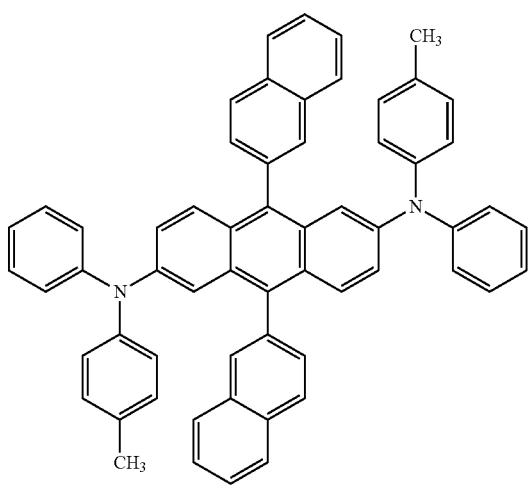
Inv-B68
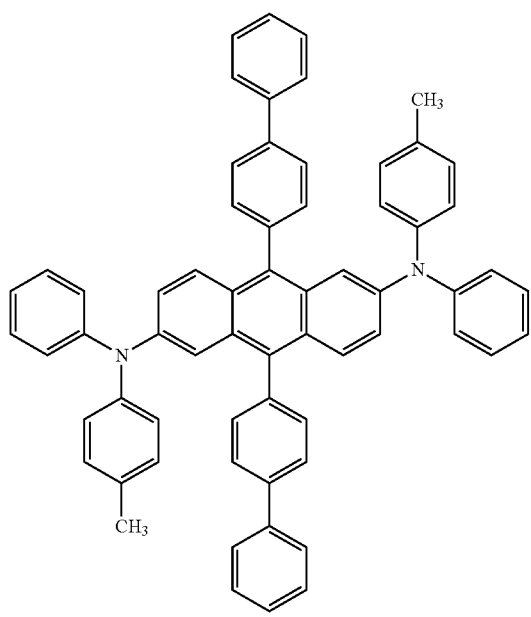
Inv-B69
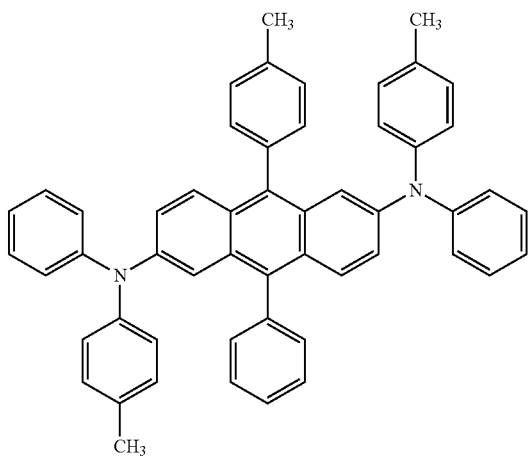

-continued
Inv-B70
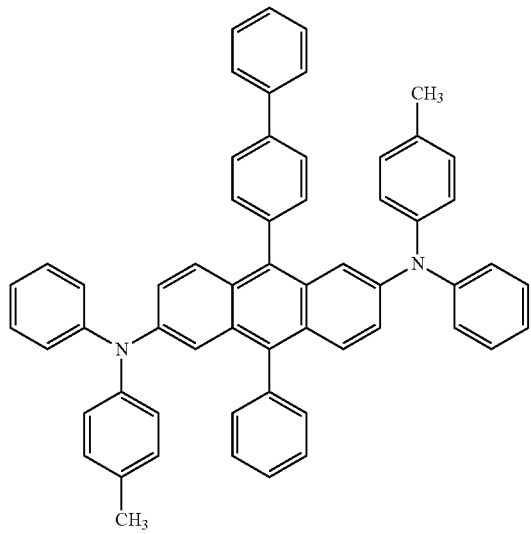
Inv-B71
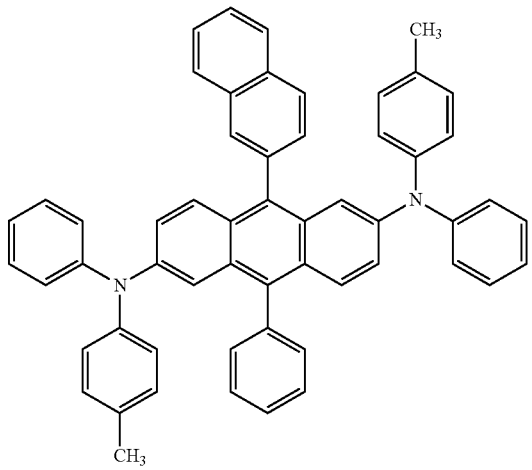
Inv-B72
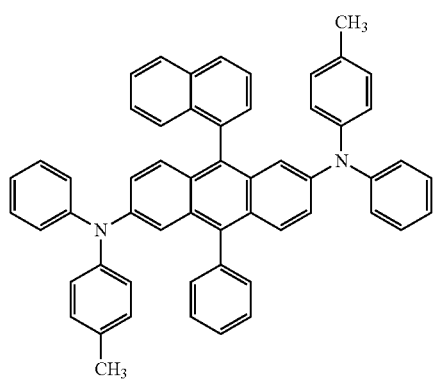
Inv-B73
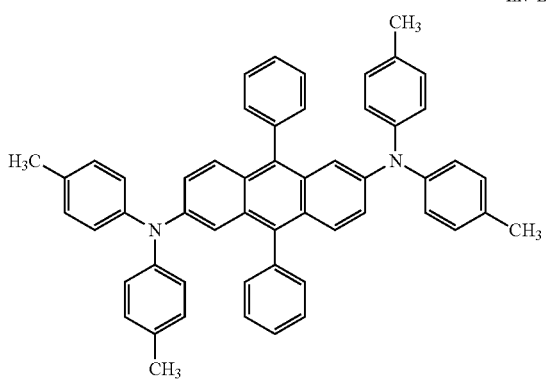
Inv-B74
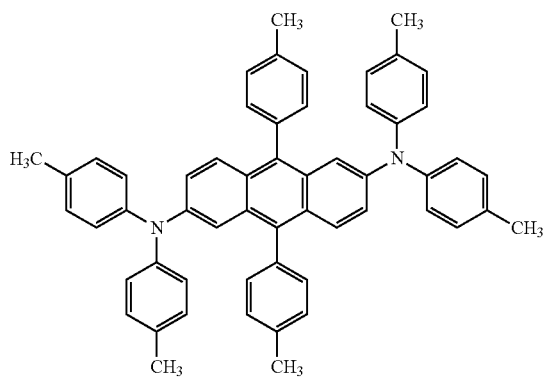
Inv-B75
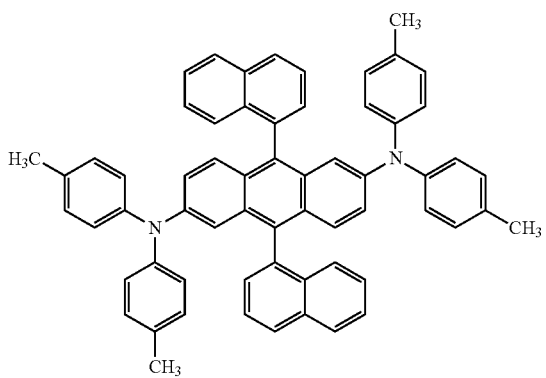

-continued
Inv-B76
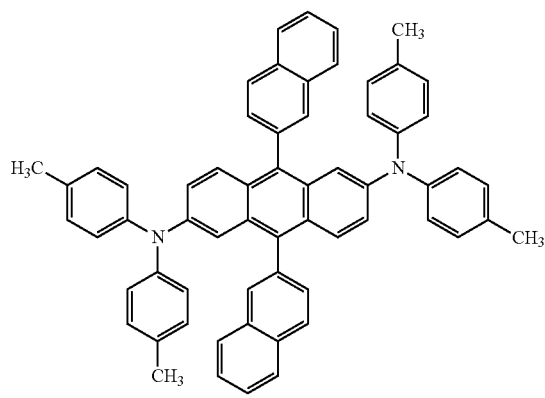
Inv-B77
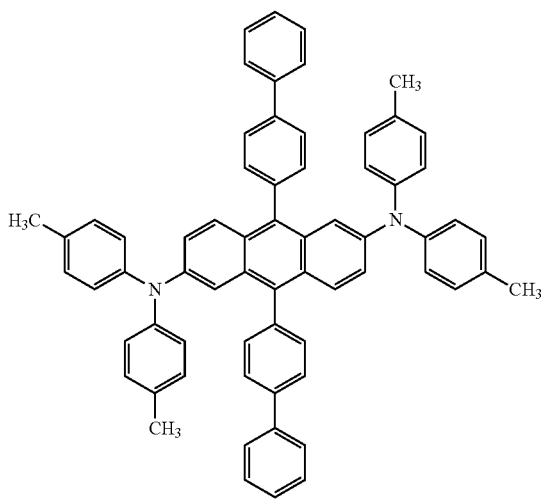
Inv-B78
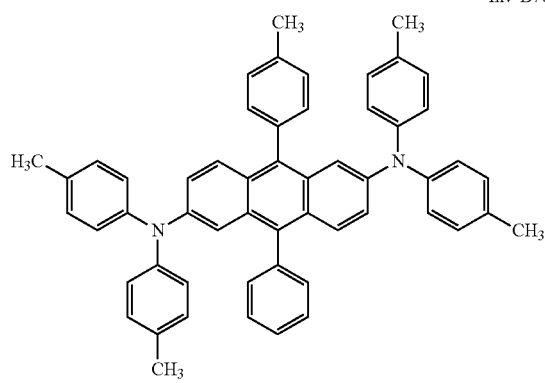
Inv-B79
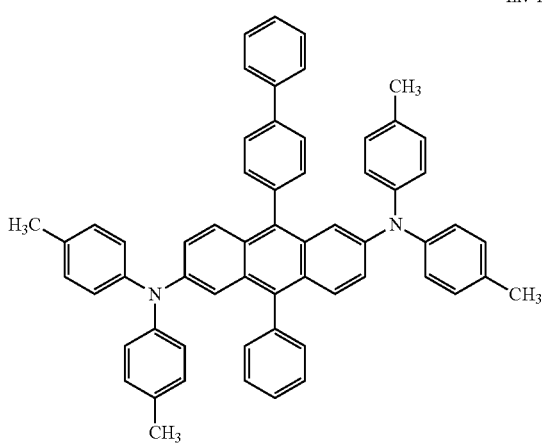
Inv-B80
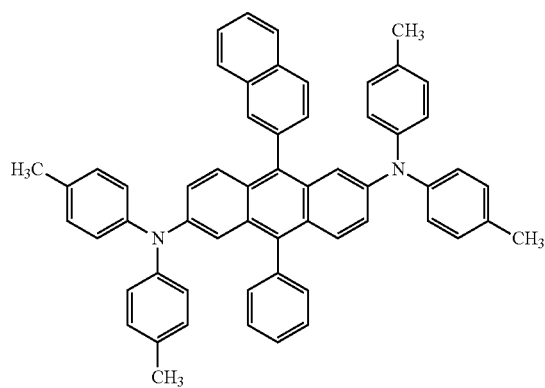
Inv-B81
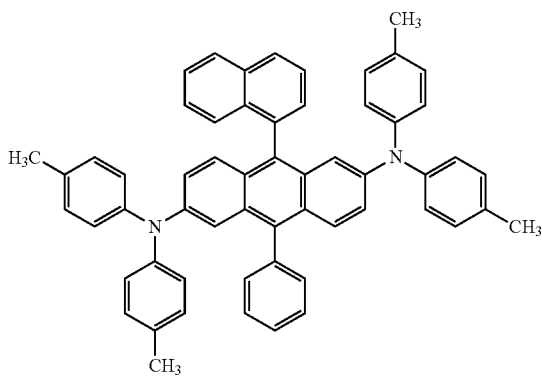

-continued
Inv-B82
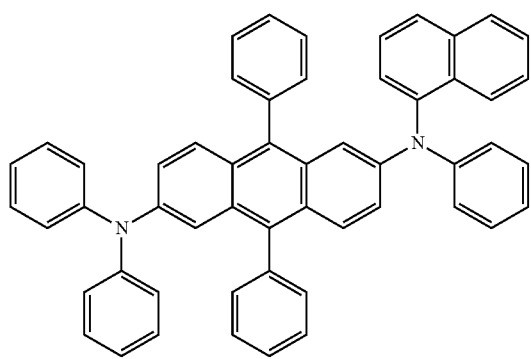
Inv-B83
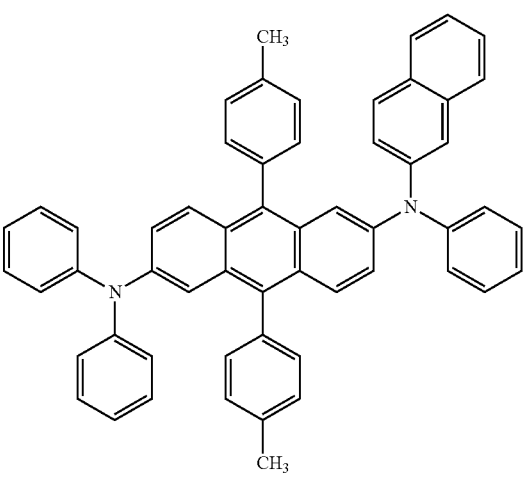
Inv-B84
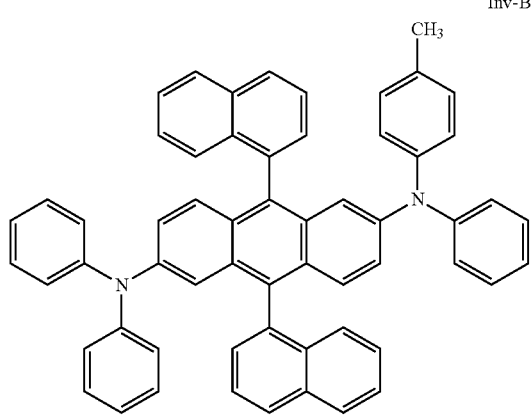
Inv-B85
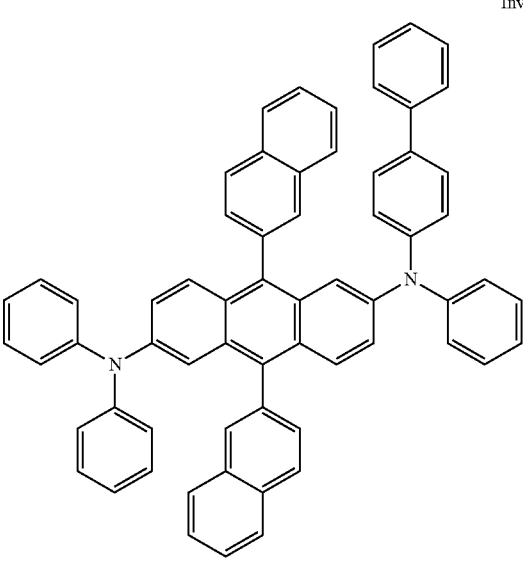
Inv-B86
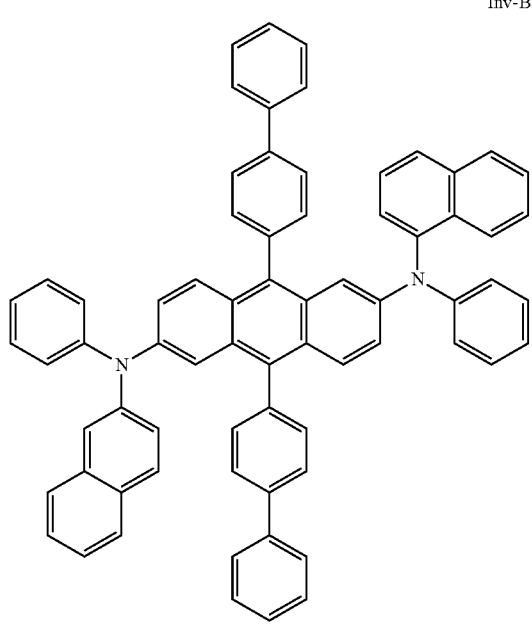
Inv-B87
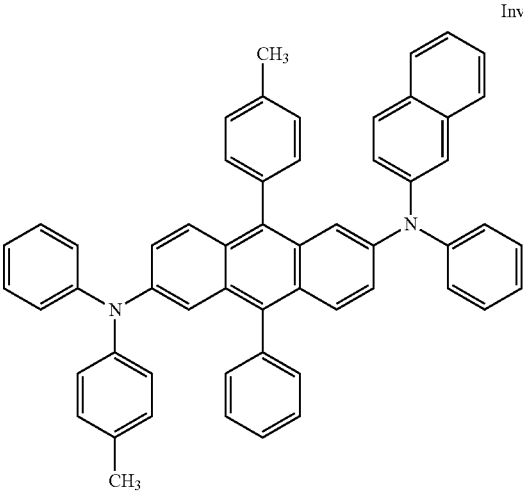

-continued
Inv-B88
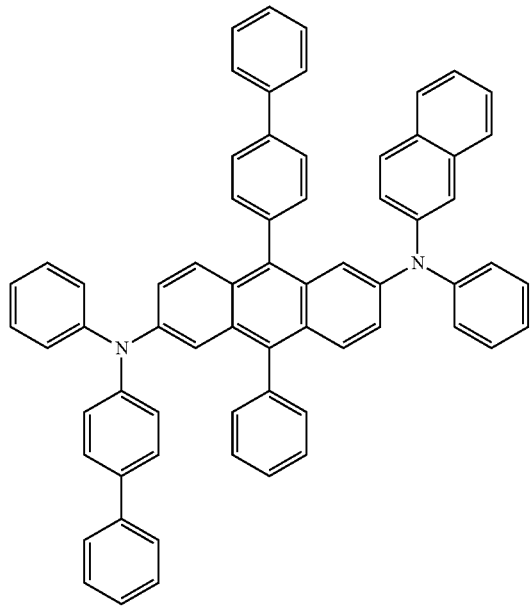
Inv-B89
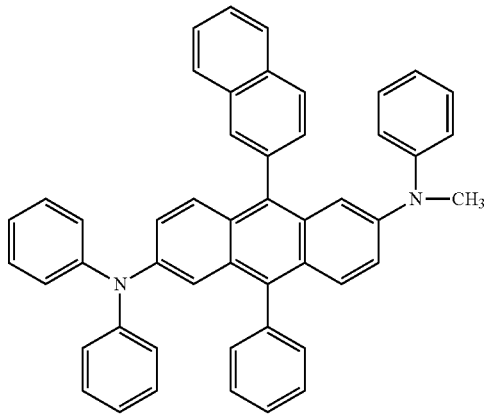
Inv-B90
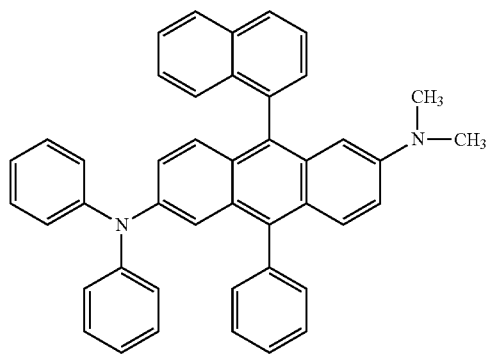
Inv-B91
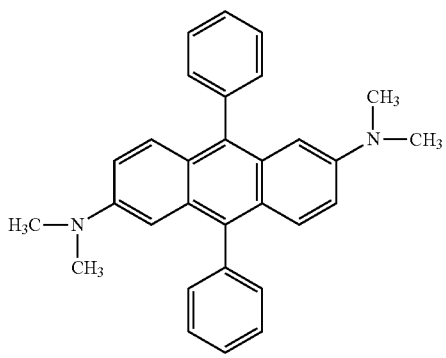
Inv-B92
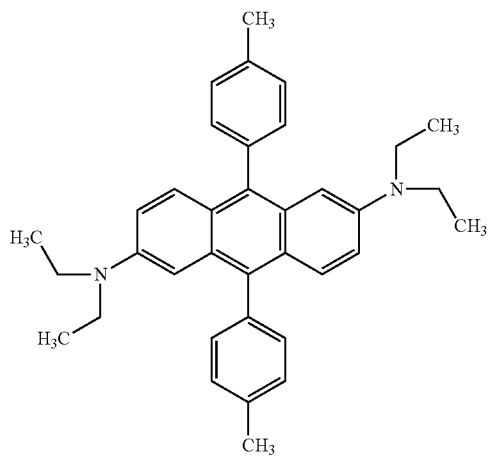
Inv-B93
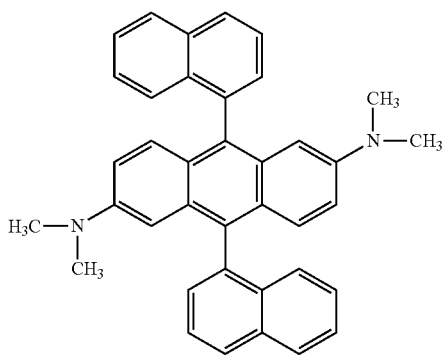

-continued
Inv-B94
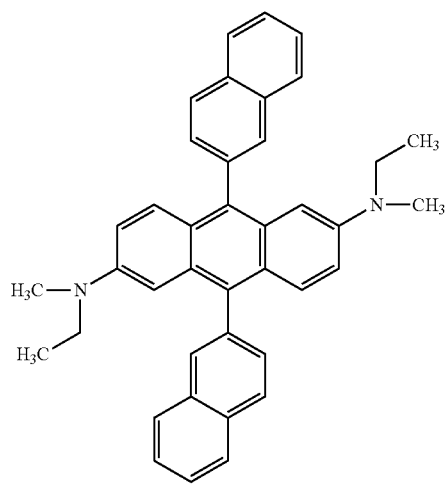
Inv-B95
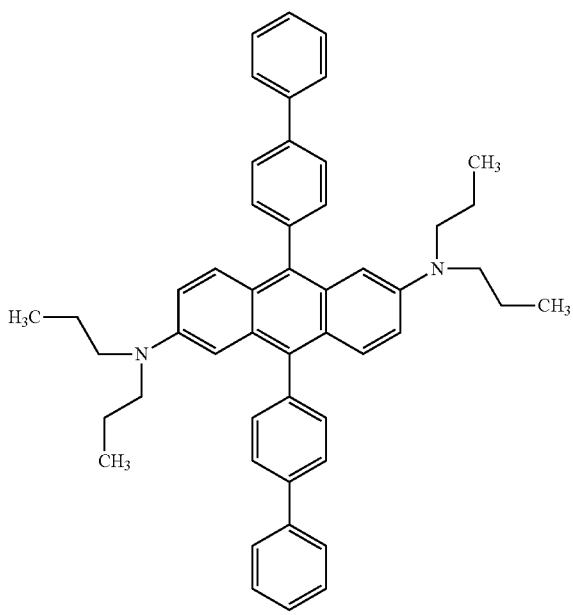
Inv-B96
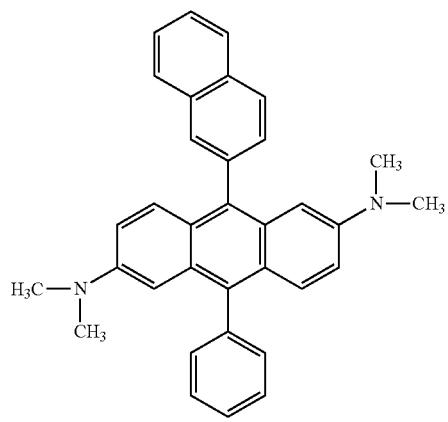
Inv-B97
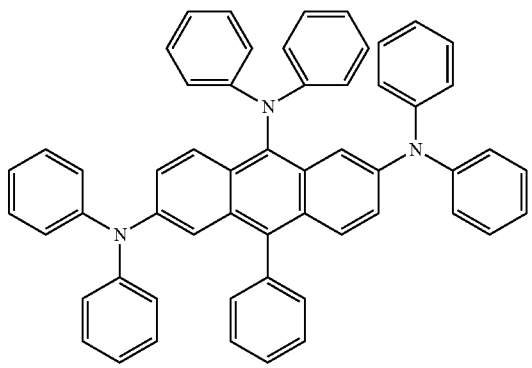
Inv-B98
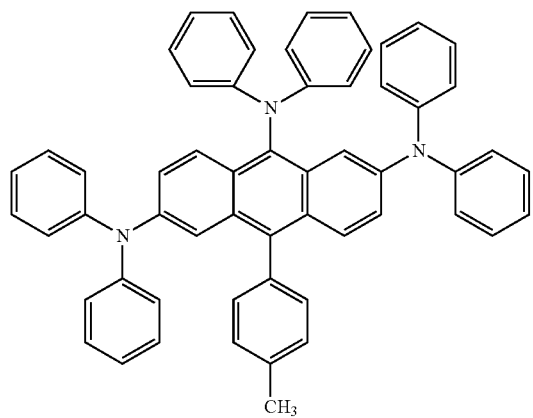
Inv-B99
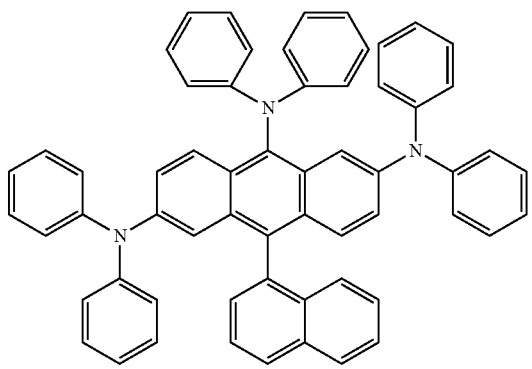

-continued
Inv-B100
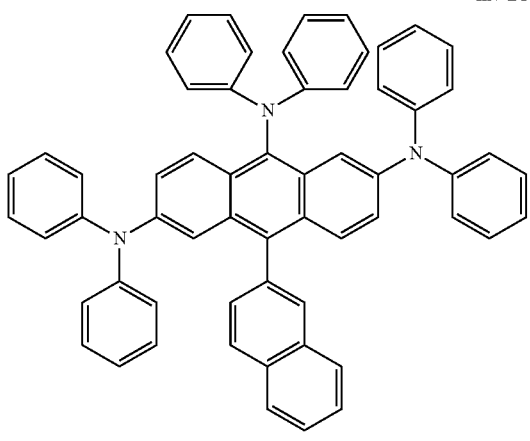
Inv-B101
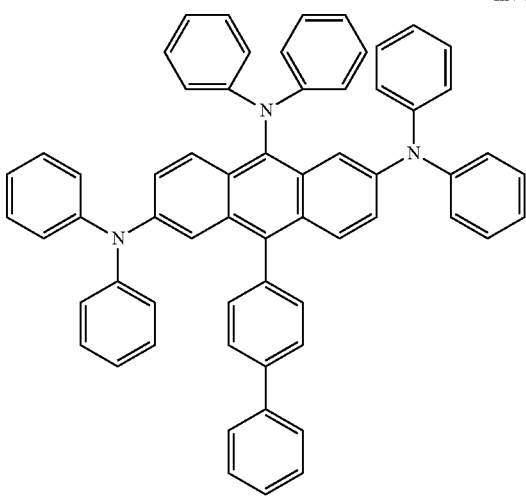
Inv-B102
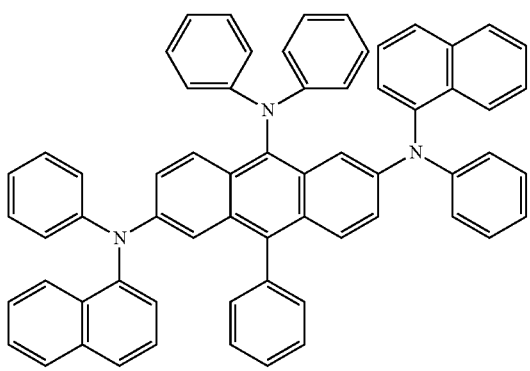
Inv-B103
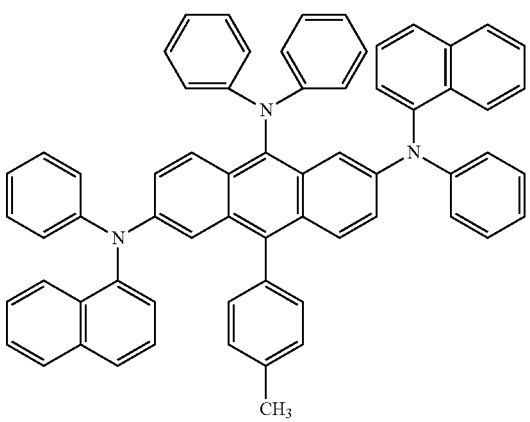
Inv-B104
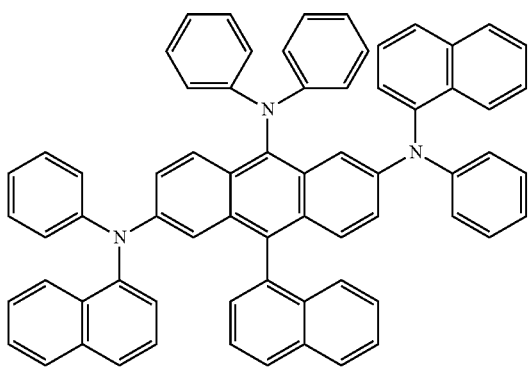
Inv-B105
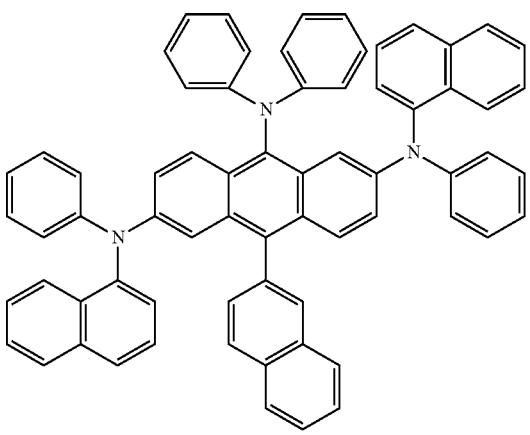

-continued
Inv-B106
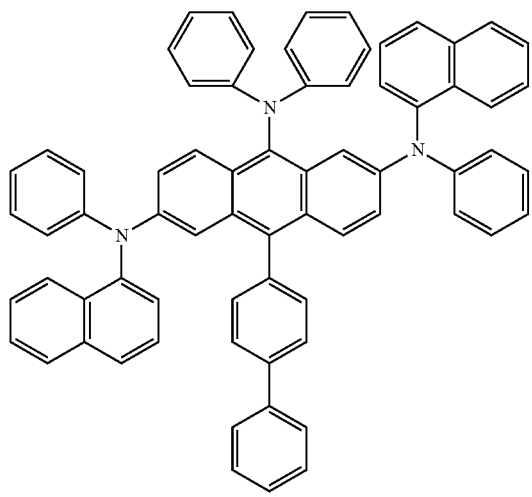
Inv-B107
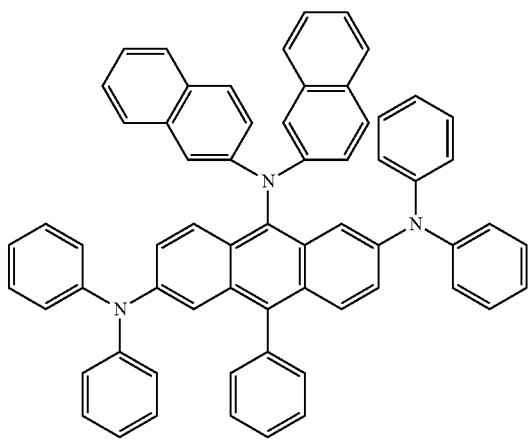
Inv-B108
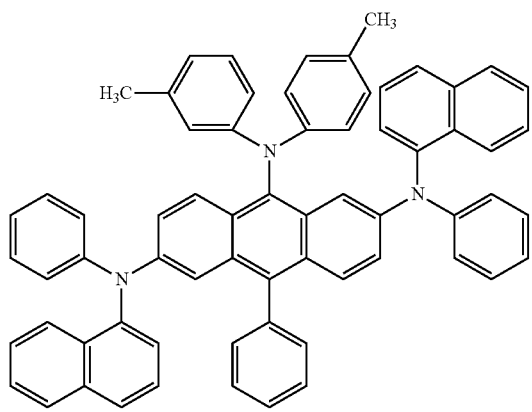
Inv-B109
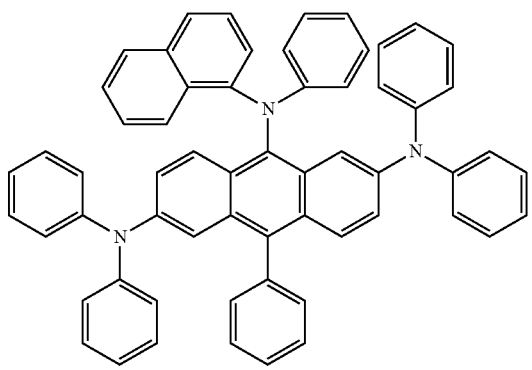
Inv-B110
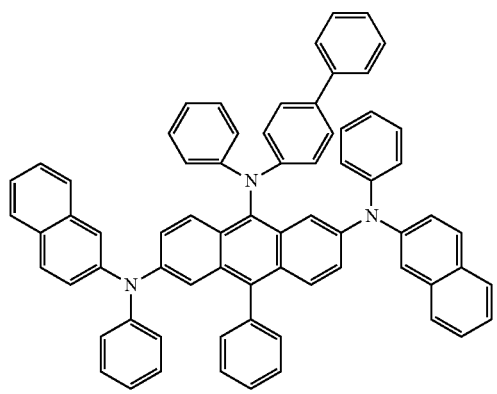
Inv-B111
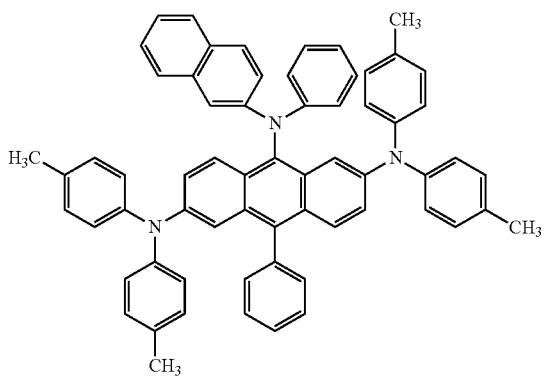

-continued
Inv-B112
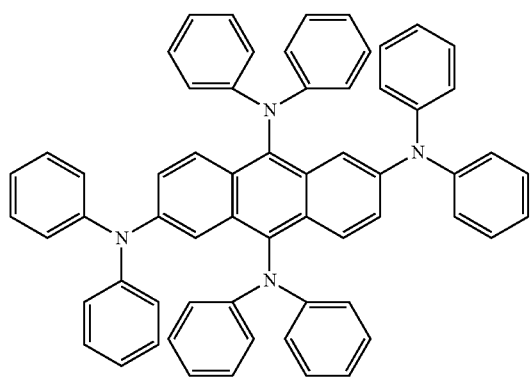
Inv-B113
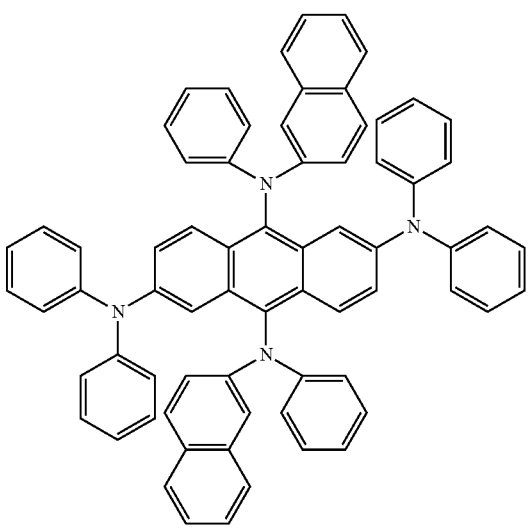
Inv-B114
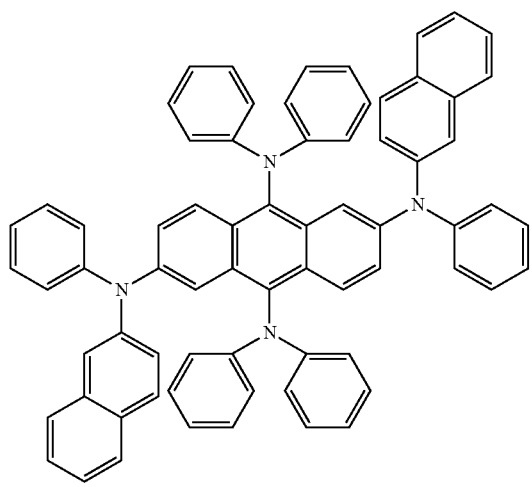
Inv-B115
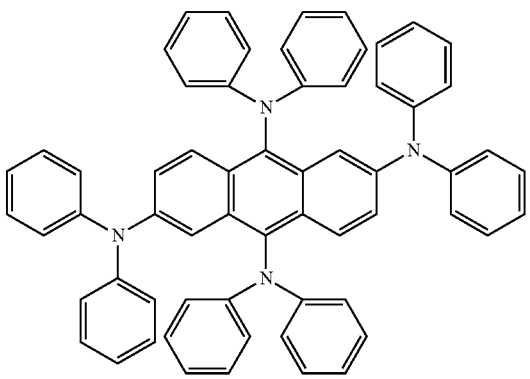
Inv-B116
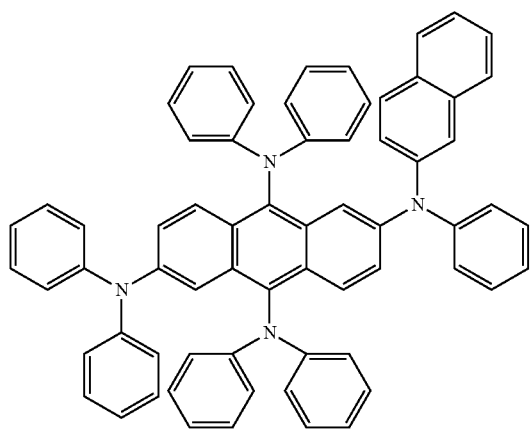
Inv-B117
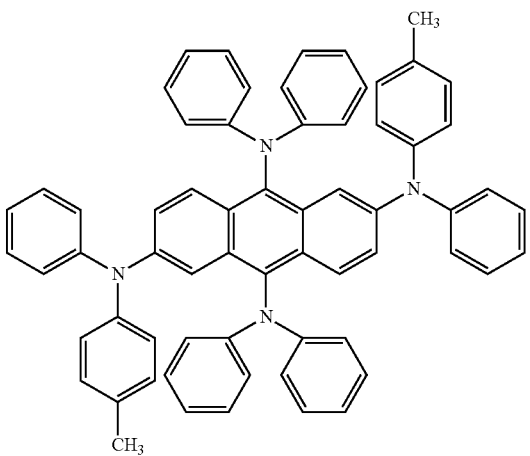

-continued
Inv-B118
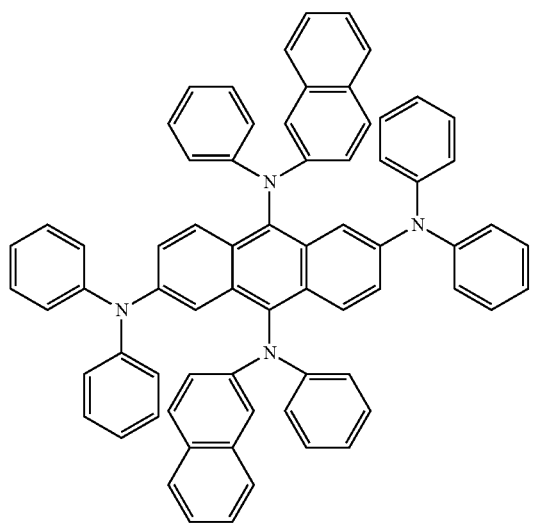
Inv-B119
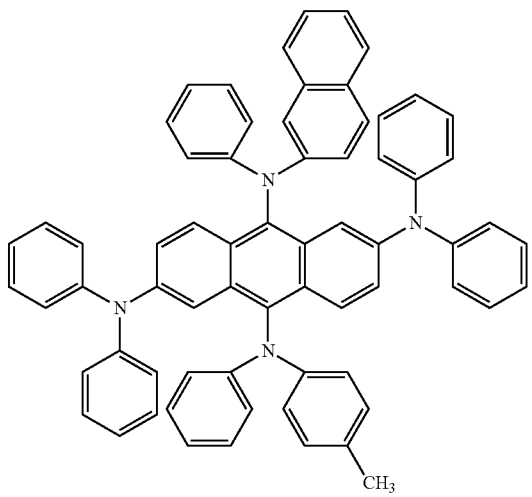
Inv-B120
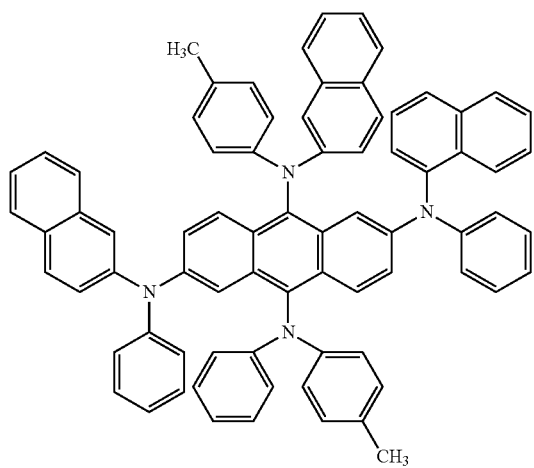
Inv-B121
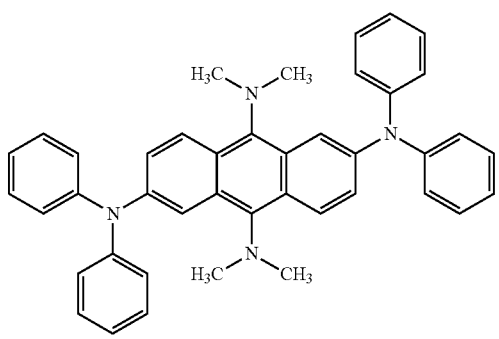
Inv-B122
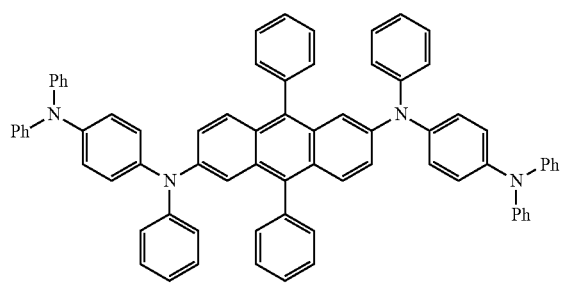
Inv-B123
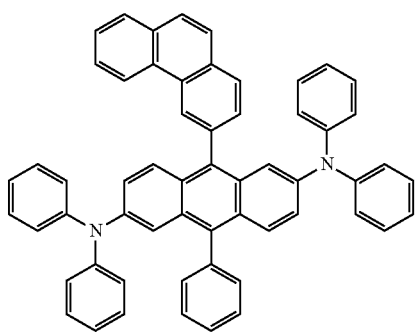

-continued
Inv-B124
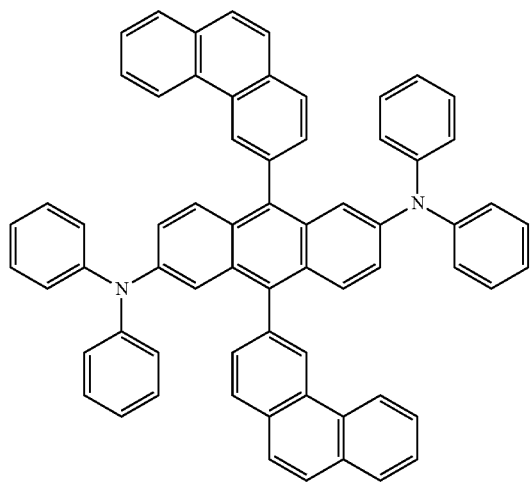
Inv-B125
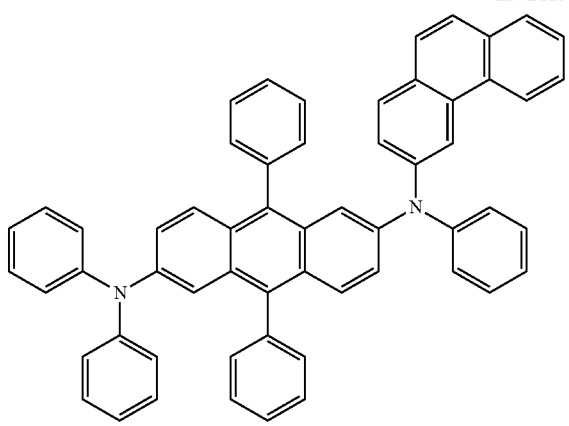
Inv-B126
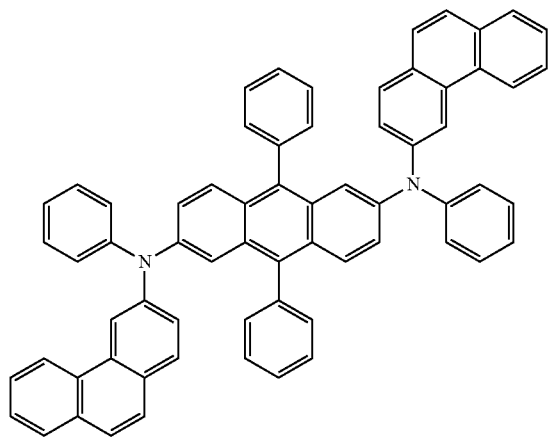
Inv-B127
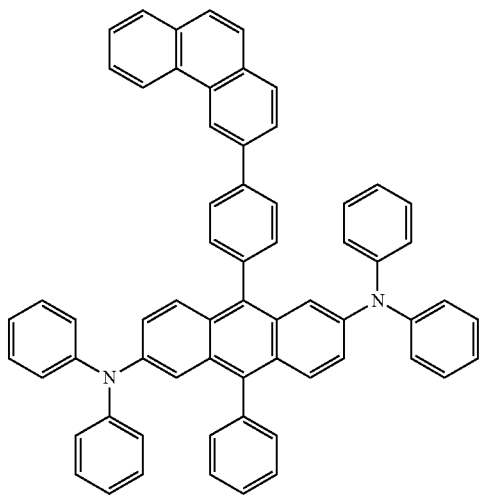
Inv-B128
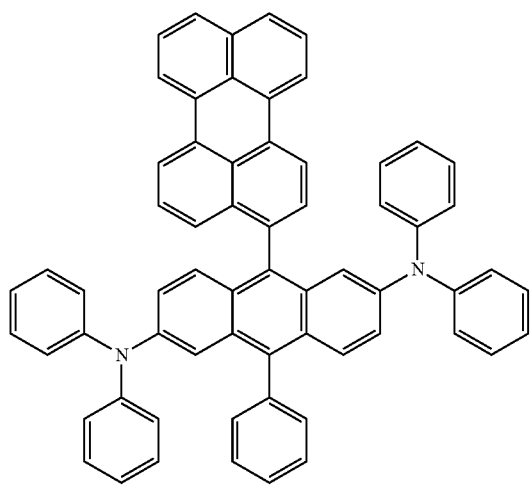
Inv-B129
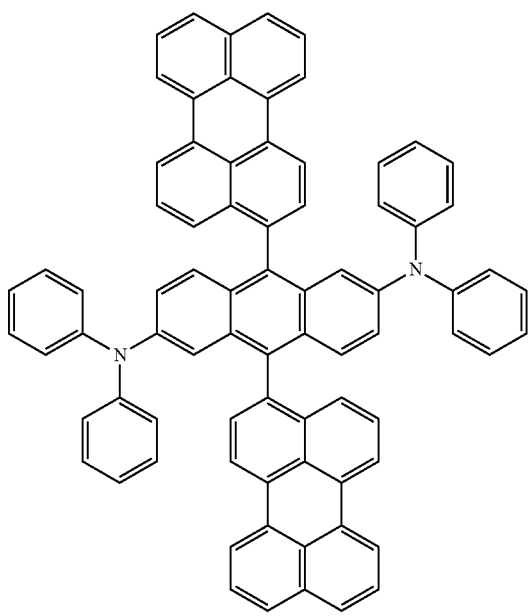

-continued
Inv-B130
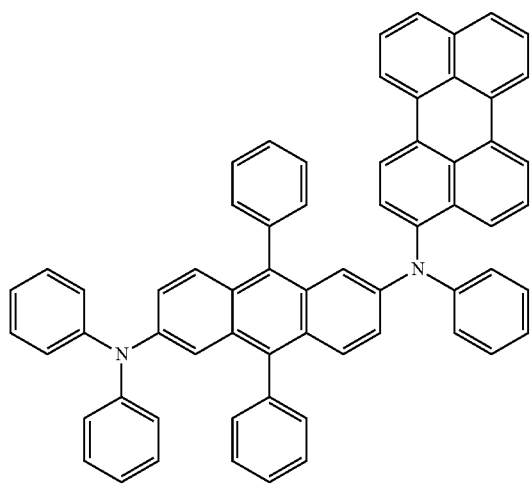
Inv-B131
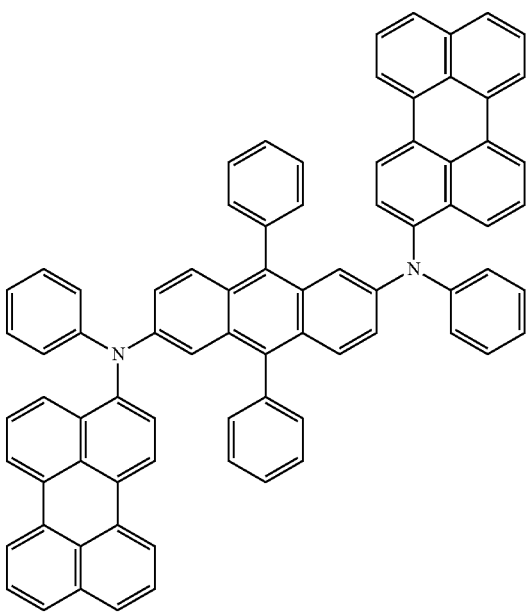
Inv-B132
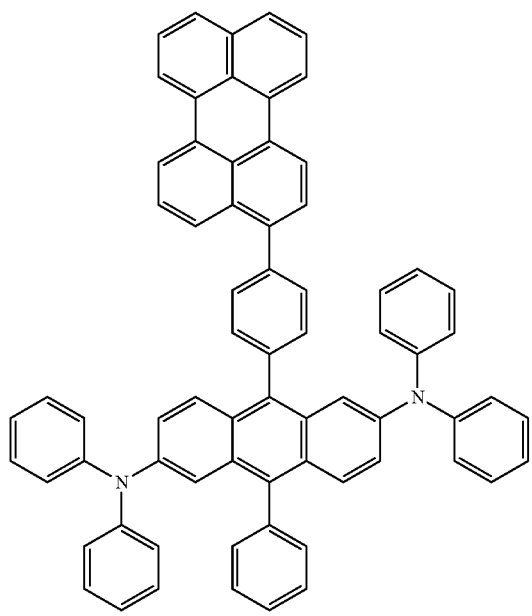
Inv-B133
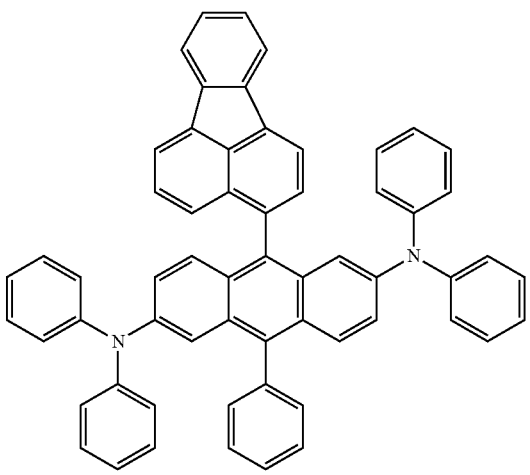

-continued
Inv-B134
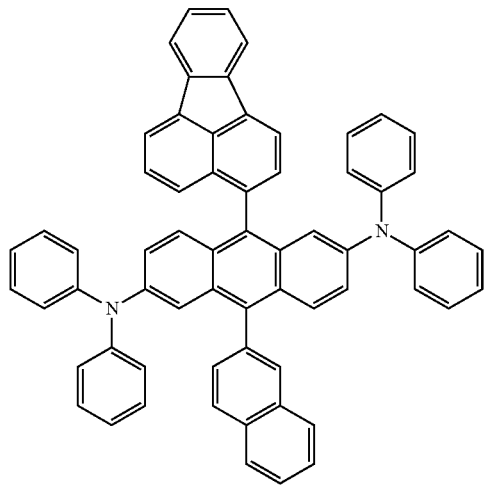
Inv-B135
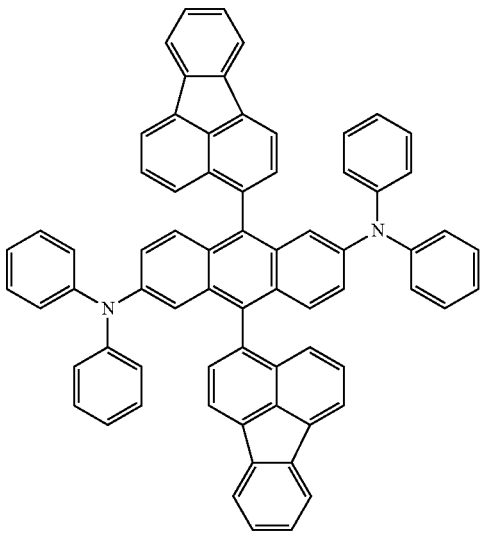
Inv-B136
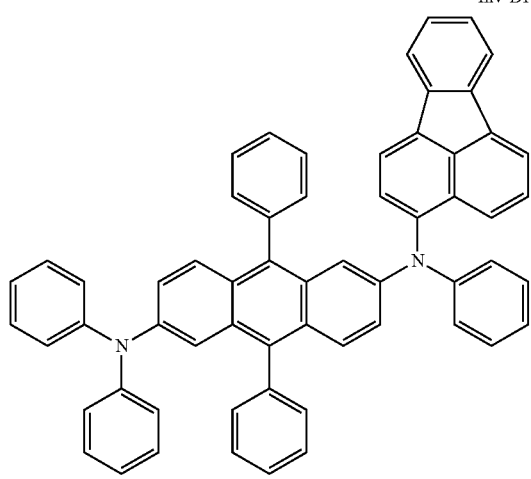
Inv-B137
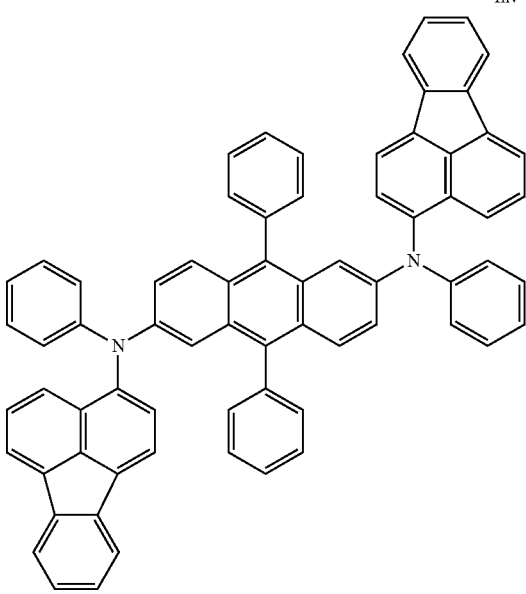
Inv-B138
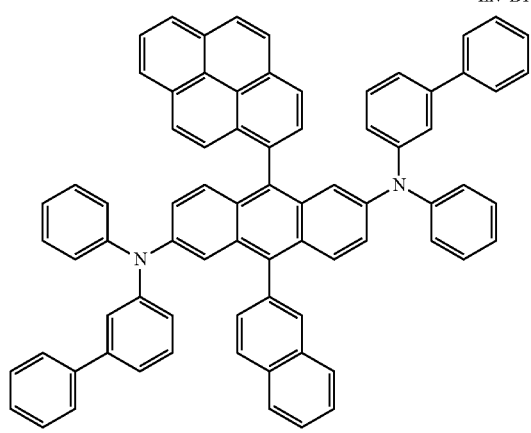
Inv-B139
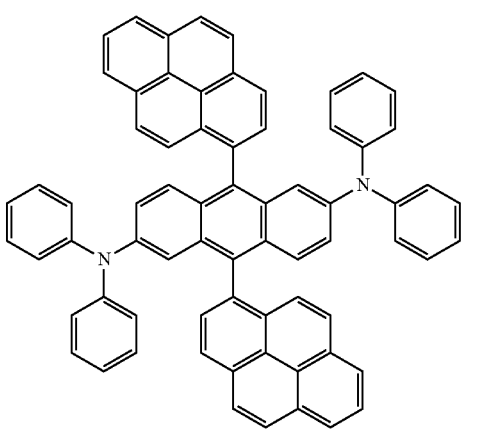

-continued
Inv-B140
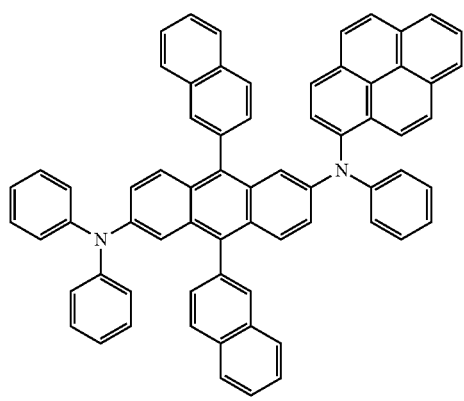
Inv-B141
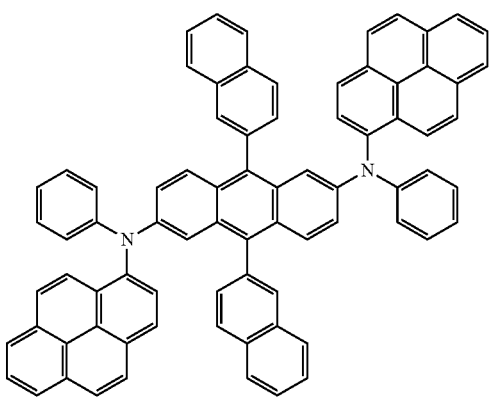
Inv-B142
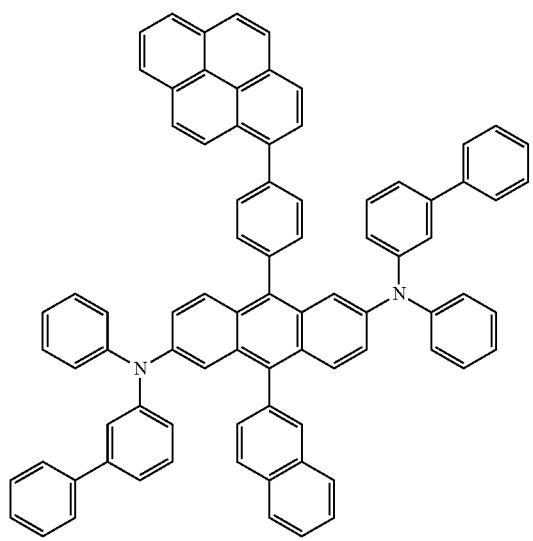
Inv-B143
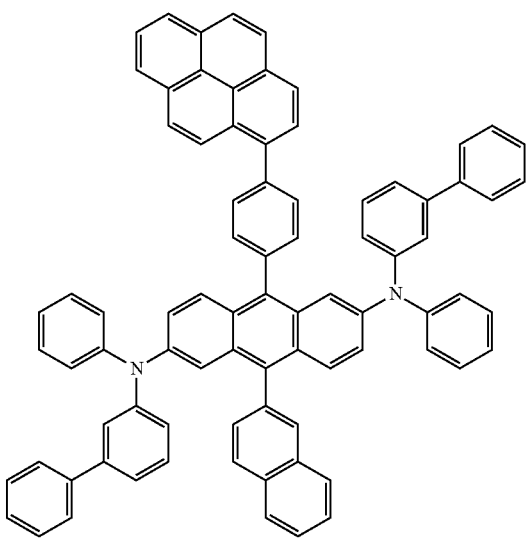
Inv-B144
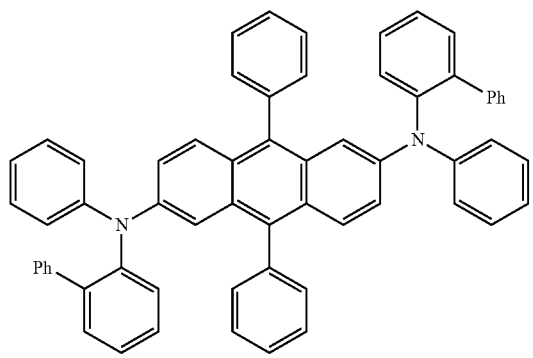
Inv-B145
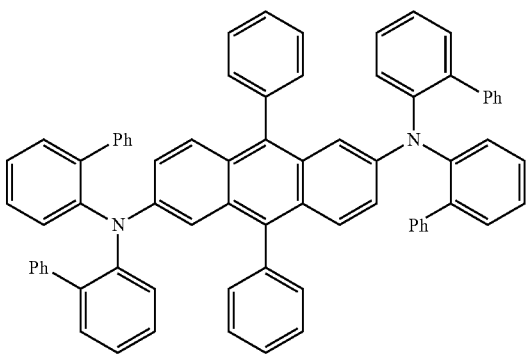

-continued
Inv-B146
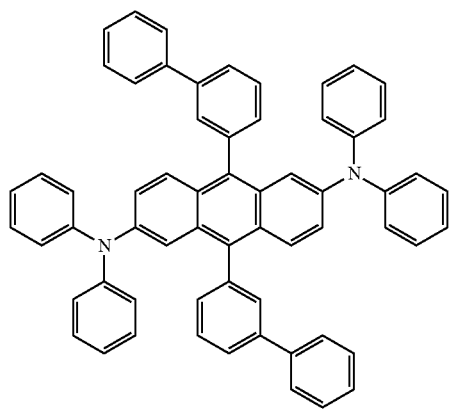
Inv-B147
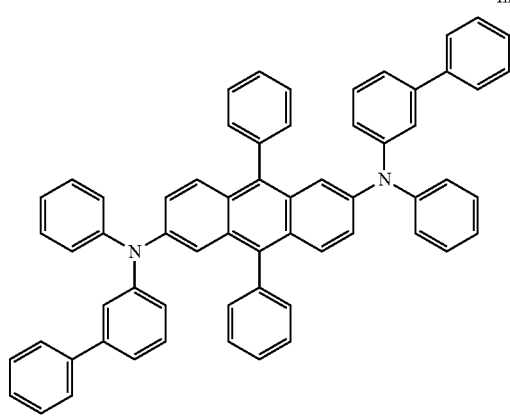
Inv-B148
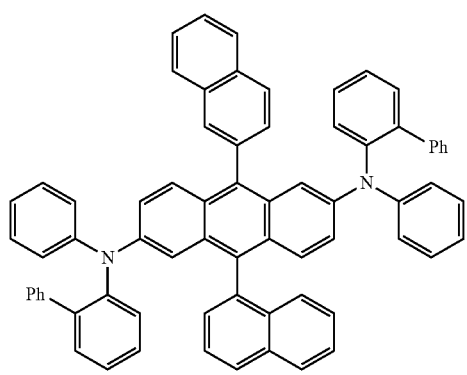
Inv-B149
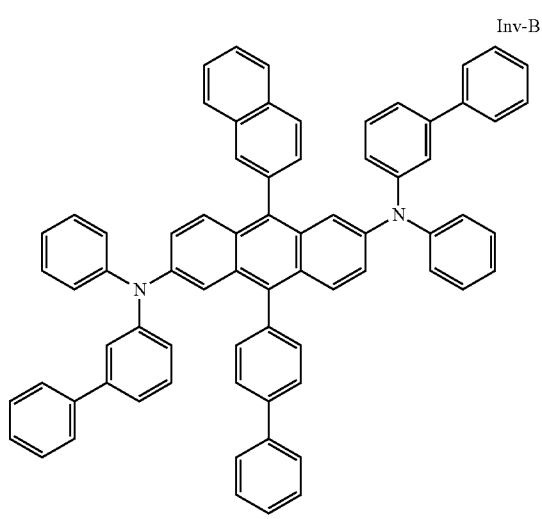
Inv-B150
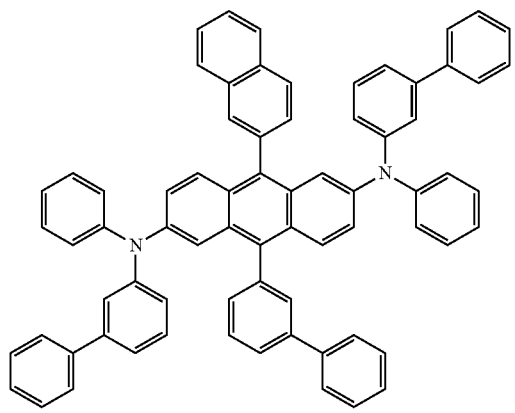
Inv-B151
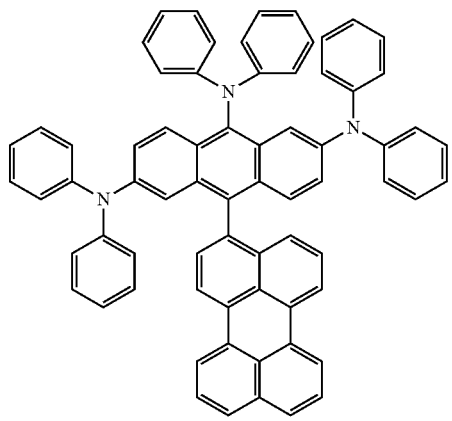

121

Inv-B152

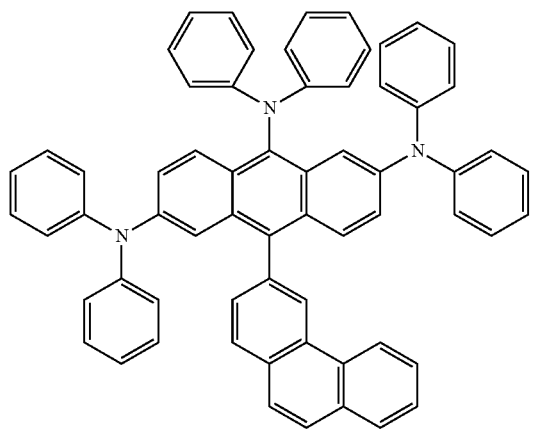

122
-continued

Inv-B153

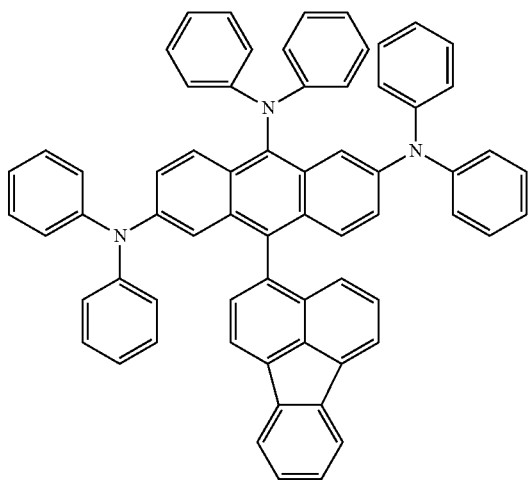

In one embodiment of the present invention, the light-emitting layer comprises (a) a 2,9,10-triarylanthracene compound and (b) an N,N,N',N',9,10-hexaaryl-2,6-anthracenediamine compound.

In another embodiment of the present invention, the light-emitting layer comprises (a) a 2,6,9,10-tetraarylanthracene compound and (b) an N,N,N',N',9,10-hexaaryl-2,6-anthracenediamine compound.

In one embodiment of the present invention, the light-emitting layer comprises (a) a 2,9,10-triarylanthracene compound and (b) an N,N,N',N',N'',N'',10-heptaaryl-2,6,9-anthracenetriamine compound.

In another embodiment of the present invention, the light-emitting layer comprises (a) a 2,6,9,10-tetraarylanthracene compound and (b) an N,N,N',N',N'',N'',10-heptaaryl-2,6,9-anthracenetriamine compound.

In one embodiment of the present invention, the light-emitting layer comprises (a) a 2,9,10-triarylanthracene compound and (b) an N,N,N',N',N'',N'',N''',N'''-octaaryl-2,6,9,10-anthracenetetraamine compound.

In another embodiment of the present invention, the light-emitting layer comprises (a) a 2,6,9,10-tetraarylanthracene compound and (b) an N,N,N',N',N'',N'',N''',N'''-octaaryl-2,6,9,10-anthracenetetraamine compound.

As more fully described in U.S. Patent Application 2004076583 by Jarikov and U.S. Patent Application 2005106415 by Jarikov et al., the LEL of the present invention may additionally comprise a third component (c), wherein the third component is an organic compound that is capable of transporting either electrons or holes or both and is capable of forming both a monomer state and an aggregate state and further is capable of forming the aggregate state either in the ground electronic state or in the excited electronic state that results in a different absorption or emission spectrum or both relative to the absorption or emission spectrum or both of the monomer state, respectively, or the third component of the mixture is capable of forming the aggregate state whose presence results in a quantum yield of luminescence of the monomer state being different relative to the quantum yield of luminescence of the monomer state in the absence of the aggregate state.

One particular selection criterion for the third component is that the organic compound should have a molecular structure that enables it to form both monomer state and aggregate state. The aggregate state can be formed by at least two molecules of the same compound, such as the third component, or by at least two molecules of two different compounds, such as compound (a) and the third component or the third component and the light-emitting compound (b). All these aggregate states are useful in the present invention. However, the following discussion will be focused on the first case. The monomer state is defined as a state where molecules of the third host component do not interact with each other in either ground or excited electronic state and thus behave as single molecules in a solid solution of the second component. Thus, in particular their absorption and emission processes involve just one molecule. The absence of the interaction can evolve e.g. due to the intrinsic lack of forces that enable the interaction, distances between the molecules being too large, improper geometry, steric hindrance, and other reasons. The aggregate state is defined as a state formed by an interaction, for example such as commonly known in the art van der Waals forces or by commonly known in the art charge-transfer interactions, of at least two molecules. It has physical and chemical properties different from those of the monomer state. In particular, two or more molecules can participate in cooperative absorption or emission or both, that is absorption or emission or both can only be understood as arising from molecular complexes or molecular aggregates. When two or more molecules act cooperatively to absorb a photon, it is said that the absorption aggregate exists in the ground electronic state. When two or more molecules act cooperatively to emit a photon, it is said that the exciplex, or a molecular complex or molecular aggregate, exists in the excited electronic state. The absorption aggregate need not form an exciplex upon excitation and the exciplex need not emit to produce a ground state aggregate. Thus, molecular aggregation can occur in either the ground electronic state or the excited electronic state or both. Molecules that comprise an aggregate can be only weakly associated in the ground electronic state (the energy of van der Waals interactions ~1-3 kcal/mol) but more strongly associated in its excited electronic state (the energy of van der Waals interactions ~3-10 kcal/mol). The simplest aggregate state in the ground electronic state is often called a dimer, that is an aggregate state formed by two identical molecules in their ground electronic states. The aggregate state in the excited electronic state is called an exciplex or excimer and in the simplest case is formed by two identical molecules one of which prior to formation of the excimer was in the ground electronic state and the other was in the excited electronic state. One of the most commonly observed features of aggregate states is that either their absorption spectrum or their emission spectrum or both are shifted compared to the absorption spectrum or emission spectrum or both, respectively, of the monomer state. The shift can occur to the red or to the blue. On the other hand, the absorption or emission spectra or both of aggregate states can contain new features such as peaks and shoulders positioned to either red or blue compared to the absorption or emission spectrum or both of the monomer state, respectively. Another most commonly observed characteristic of aggregate states is that the intensity and sometimes the position (wavelength) of the new or shifted absorption or emission or both depend on concentration of molecules that form the aggregate state. With increasing concentration, the intensity of shifted absorption or emission features or both can increase due to the increasing concentration of the aggregate states, while the position, or wavelength, can shift too due to the increase in the size (number of molecules involved in the formation) of the aggregate states. Another common characteristic of aggregate states that is observed in the absence of readily detectable changes in the monomer absorption or emission spectrum or both is the change in the intensity (quantum yield of luminescence) of the monomer emission. For reference, these definitions can be found in N. J. Turro, Modern Molecular Photochemistry, University Science Books, Sausalito, Calif., 1991.

For some organic compounds, their molecular structure is such that their aggregates in excited electronic states are emissive, and thus can be readily observed by measuring fluorescence emission spectra as a function of concentration. Compounds that form emissive and highly emissive aggregate states are potentially the most useful as third components. However, there are many organic compounds that form aggregate states which are not emissive or only weakly emissive. Formation of completely or essentially non-emissive aggregate states (that is those with the quantum yield of luminescence of zero or near zero) can lead to a decrease in the efficiency of electroluminescence and photoluminescence due to insufficient efficiency of electronic excitation energy transfer to the luminescent dopant. Nevertheless, for certain types of compounds, especially the ones listed above, the quantum yield of luminescence of an aggregate state is most often found to be non-zero. This can be sufficient to sustain a sufficient rate of electronic excitation energy to the luminescent dopant, if the latter acts as a sufficiently strong acceptor in the well known in the art Forster energy transfer process. Therefore, such compounds would not compromise the electroluminescence efficiency and could also be useful as third components. Their use would result not only in improved operational lifetimes but also in excellent EL efficiencies. On the other hand, if the acceptor (luminescent dopant) of the excitation energy transfer is strong and its concentration is sufficiently high so that the quantum efficiency of the energy transfer is ~100% then even if the quantum yield of luminescence of the donor decreases by 10-15 times (given that everything else remains equal) the quantum efficiency of the energy transfer, and thus of the acceptor luminescence, decreases only by ~10%.

Another important criteria for selection of compounds as third components is that the aggregate states of this compound should have spectroscopic characteristics, namely absorption and emission spectra, excited state lifetime, quantum yield of luminescence, and oscillator strength, such that efficient transfer of electronic excitation energy to the light-emitting compound (b) is insured.

Many of the benzenoid compounds found useful as the third component in the present invention have a flat rigid geometry, which encourages formation of aggregate states. Many representative benzenoids, such as pyrene, perylene, coronene, naphthacene, anthracene, anthanthrene, picene, triphenylene, chrysene, fluoranthene, benzo[ghi]perylene, etc. and their mono- and poly-substituted benzo, naphtho, anthra, phenanthro, triphenyleno, and other derivatives have been shown in the common literature to possess a pronounced propensity for aggregate state formation. The aggregate states of these compounds are extensively characterized in common literature. If the benzenoid compound is emissive in its monomer state, it is most often found to be emissive in its aggregate state also, especially in the solid solutions and in the absence of oxygen (exactly as found in an OLED device). Other organic compounds meeting such a planar geometry criteria are useful as well.

Although aggregate states including two molecules are most often found and described in the literature, often it is found that compounds such as disclosed in the present invention are capable of forming aggregate states including not only two molecules, but of three, four, five, ten, hundred, thousand and more molecules as the volume % increases. With sufficiently high number of molecules of the third component participating in the formation of an aggregate state, a domain could be formed where certain degree of order or degree of crystallinity could be found. The size of these domains could be in the range of nanometers (nanocrystalline domain) or even micrometers (microcrystalline domain).

Illustrative, non-limiting examples of inventive, third component compounds are benzo[g,h,i]perylene, benzo[a]pyrene, tetracene, unsubstituted perylene, dibenzo[b,k]perylene, dibenzo[b,n]perylene, dibenzo[b,def]chrysene, 2,5,8,11-tetra-tert-butylperylene, 3,9-di-1-naphthylperylene, 3,9-di-2-naphthylperylene, and 3,10-di-2-naphthylperylene.

The light-emitting layer may also comprise additives for the purposes of improving device performance, for example, improving efficiency, lowering voltage, and improving lifetime. Examples of useful additives are 5,12-dihydro-5,12-diphenyl-quino[2,3-b]acridine-7,14-dione (AD1), difluoro [6-mesityl-N-(2(1H)-quinolinylidene-κN)-(6-mesityl-2-quinolinaminato-κN1)]boron (AD2) and 4-(di-p-Tolylamino)-4'-[(di-p-tolylamino)styryl]stilbene (AD3).

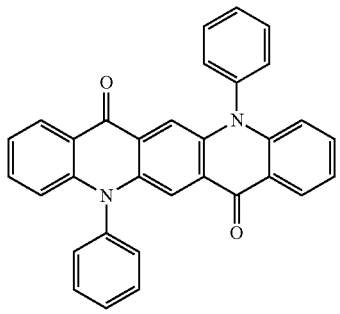

AD1

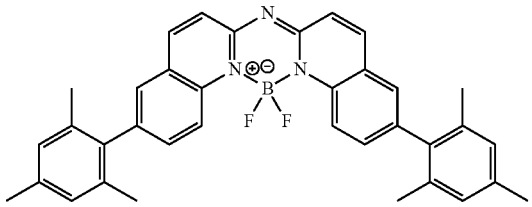

AD2

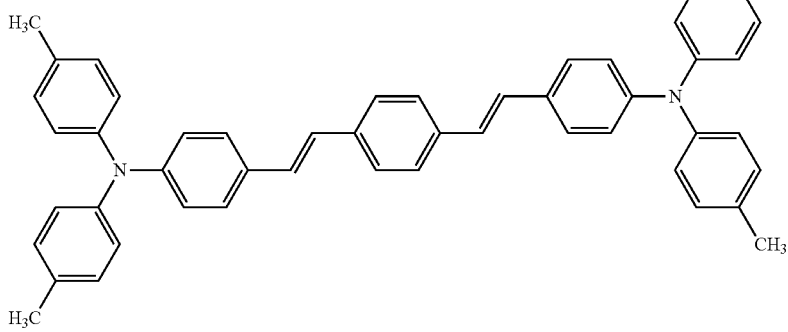

AD3

It is preferable that a light-emitting layer of an OLED device of the present invention emits green electroluminescence. It is preferable for the green electroluminescence to have excellent color purity. By excellent color purity, it is meant that the 1931 Commission Internationale de l'Eclairage (CIE) x coordinate of the electroluminescent spectrum of the present invention is between 0.21 and 0.30 and the 1931 CIE y coordinate of the electroluminescent spectrum of the present invention is between 0.60 and 0.70.

Unless otherwise specifically stated, use of the term "substituted" or "substituent" means any group or atom other than hydrogen. Additionally, when the term "group" is used, it means that when a substituent group contains a substitutable hydrogen, it is also intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy)propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxopyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecylphenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy) acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur or phosphorous, such as pyridyl, thienyl, furyl, azolyl, thiazolyl, oxazolyl, imidazolyl, pyrazolyl, pyrazinyl, pyrimidinyl, pyrrolidinonyl, quinolinyl, isoquinolinyl, 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

For the purpose of this invention, also included in the definition of a heterocyclic ring are those rings that include coordinate or dative bonds. The definition of a coordinate bond can be found in *Grant & Hackh's Chemical Dictionary*, page 91. In essence, a coordinate bond is formed when electron rich atoms such as O or N, donate a pair of electrons to electron deficient atoms such as Al or B.

It is well within the skill of the art to determine whether a particular group is electron donating or electron accepting. The most common measure of electron donating and accepting properties is in terms of Hammett σ values. Hydrogen has a Hammett σ value of zero, while electron donating groups have negative Hammett σ values and electron accepting groups have positive Hammett σ values. Lange's handbook of Chemistry, 12$^{th}$ Ed., McGraw Hill, 1979, Table 3-12, pp. 3-134 to 3-138, here incorporated by reference, lists Hammett σ values for a large number of commonly encountered groups. Hammett σ values are assigned based on phenyl ring substitution, but they provide a practical guide for qualitatively selecting electron donating and accepting groups.

Suitable electron donating groups may be selected from —R', —OR', and —NR'(R") where R' is a hydrocarbon containing up to 6 carbon atoms and R" is hydrogen or R'. Specific examples of electron donating groups include methyl, ethyl, phenyl, methoxy, ethoxy, phenoxy, —N(CH$_3$)$_2$, —N(CH$_2$CH$_3$)$_2$, —NHCH$_3$, —N(C$_6$H$_5$)$_2$, —N(CH$_3$)(C$_6$H$_5$), and —NHC$_6$H$_5$.

Suitable electron accepting groups may be selected from the group consisting of cyano, α-haloalkyl, α-haloalkoxy, amido, sulfonyl, carbonyl, carbonyloxy and oxycarbonyl substituents containing up to 10 carbon atoms. Specific examples include —CN, —F, —CF$_3$, —OCF$_3$, —CONHC$_6$H$_5$, —SO$_2$C$_6$H$_5$, —COC$_6$H$_5$, —CO$_2$C$_6$H$_5$, and —OCOC$_6$H$_5$.

Unless otherwise specified, the term "percentage" or "percent" and the symbol "%" of a material indicate the volume percent of the material in the layer in which it is present.

Electron-Transporting Layer (ETL)

Preferred thin film-forming materials for use in forming the electron-transporting layer of the organic EL devices of this invention include metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (A).

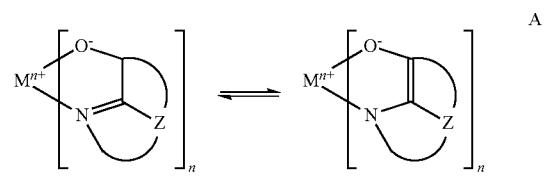

wherein
M represents a metal;
n is an integer of from 1 to 4; and
Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:
CO-1: Aluminum trisoxine [alias, tris(8-quinolinolato)aluminum(III); AlQ$_3$]
CO-2: Magnesium bisoxine [alias, bis(8-quinolinolato)magnesium(II)]
CO-3: Bis[benzo {f}-8-quinolinolato]zinc (II)

CO-4: Bis(2-methyl-8-quinolinolato)aluminum(III)-μ-oxo-bis(2-methyl-8-quinolinolato)aluminum(III)
CO-5: Indium trisoxine [alias, tris(8-quinolinolato)indium]
CO-6: Aluminum tris(5-methyloxine) [alias, tris(5-methyl-8-quinolinolato)aluminum(III)]
CO-7: Lithium oxine [alias, (8-quinolinolato)lithium(I)]
CO-8: Gallium oxine [alias, tris(8-quinolinolato)gallium(III)]
CO-9: Zirconium oxine [alias, tetra(8-quinolinolato)zirconium(IV)]

Benzazoles satisfying structural formula (B) are also useful electron-transporting materials.

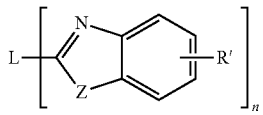

Where:
n is an integer of 3 to 8;
Z is O, NR or S; and
R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring;
L is a linkage unit consisting of alkyl, aryl, substituted alkyl, or substituted aryl, which conjugately or unconjugately connects the multiple benzazoles together. An example of a useful benzazole is 2,2',2"-(1,3,5-phenylene)tris[1-phenyl-1H-benzimidazole].

Substituted 1,10-phenanthroline compounds are also known to be useful as electron-transporting materials, such as are disclosed in JP2003-115387; JP2004-311184; JP2001-267080; and WO2002-043449. Phenanthroline compounds that are useful as electron-transporting materials are also more fully described in U.S. patent application Ser. No. 11/289,856 by Klubek et al., wherein the electron-transporting layer includes a compound comprising one and only one anthracene nucleus and including no more than two phenanthroline-containing substituents and wherein said nucleus is substituted in the 2-, 3-, 6-, or 7-position with a phenanthroline-containing substituent. Useful phenanthroline compounds are also more fully described in U.S. patent application Ser. No. 11/290,214 by Klubek et al., wherein the electron-transporting layer includes a phenanthroline compound comprising no more than two optionally substituted phenanthroline moieties wherein one and only one group substituted on a phenanthroline nucleus includes an aromatic system comprising four or more fused aromatic rings.

Other electron-transporting materials include various butadiene derivatives as disclosed in U.S. Pat. No. 4,356,429 and various heterocyclic optical brighteners as described in U.S. Pat. No. 4,539,507. Triazines are also known to be useful as electron-transporting materials. Further useful materials are silacyclopentadiene derivatives described in EP 1,480,280; EP 1,478,032; and EP 1,469,533. Pyridine derivatives are described in JP2004-200162 as useful electron-transporting materials. 2-(2-Pyridyl)imidazolyl-based gallium chelates are also known to be useful as electron-transporting materials, as described in U.S. Patent Publication 2007/0003786 by Royster et al.

Anthracene derivatives are useful as electron-transporting materials as more fully described in U.S. patent application Ser. No. 11/412,676 by Kondakov et al., Ser. No. 11/412,426 by Kondakov et al., Ser. No. 11/412,602 by Owczarczyk et al., and U.S. patent publication 2004/0067387 by Kim et al.

Anthracenes having amine substitutions are also useful as electron-transporting materials as more fully described in U.S. patent application Ser. No. 11/314,548 by Klubek et al.

Mixing various electron-transporting materials has been shown to be useful for the electron-transporting layer, as more fully described in US Publication 2004/0207318 by Lee et al. and U.S. Pat. No. 6,396,209 by Kido et al., wherein the electron-transporting layer includes a mixed layer of an electron-transporting organic compound and an organic metal complex compound containing at least one of alkali metal ion, alkali earth metal ion, or rare earth metal ion. Mixed electron-transporting layers are also described in U.S. Ser. Nos. 11/259,290 and 11/501,336 by Begley et al., wherein the electron-transporting layer includes (a) 10 vol % or more of a fused ring aromatic compound and (b) at least one salt or first complex of an alkali or alkaline earth metal, and an additional layer containing a second complex of an alkali or alkaline earth metal. Useful mixed electron-transporting layers are further described by Seo et al., in US2002/0086180, wherein the mixed electron-transporting layer includes a 1:1 mixture of Bphen, (also known as 4,7-diphenyl-1,10-phenanthroline) and AlQ$_3$.

Useful mixed electron-transporting layers are further described by commonly assigned U.S. Ser. Nos. 11/076,821; 11/077,218; and 11/116,096 wherein the electron-transporting layer is formed by mixing a first compound with a second compound that is a low voltage electron-transporting material, to form a layer on the cathode side of the emitting layer in an OLED device, which gives an OLED device that has a drive voltage even lower than that of the device with only the low voltage electron-transporting material. In some cases a metallic material based on a metal having a work function less than 4.2 eV is included in the layer.

In one desirable embodiment, the electron-transporting layer can be doped with low work-function alkaline metals or alkaline earth metals, such as Li, Cs, Ca, or Mg. In one preferred embodiment, the alkali metal is Li. In another preferred embodiment, the alkali metal is Cs.

In one desirable embodiment, the electron-transporting layer can be doped with electron-injecting materials that are described below.

When the ETL contains a hydrocarbon material, that is, a material composed of only carbon and hydrogen atoms, for example, 9,10-di-2-naphthalenyl-2-phenylanthracene, it is often beneficial to incorporate an electron-injecting-layer (EIL) as described below.

Electron-Injecting Layer (EIL)

It is not required to have an electron-injecting layer (EIL), however, when present, an EIL is on the cathode side of the ETL and contiguous to the ETL. More than one electron-injecting layer may be present. In some cases, electron-transporting materials as described above can also be used as the EIL or mixed in the EIL with one or more materials. Organic compounds doped with low work-function alkaline metal or alkaline earth metal, such as Li, Cs, Ca, and Mg may also be useful as the electron-injecting layer. Examples are Li- or Cs-doped AlQ$_3$.

It has also been shown in U.S. patent application Ser. No. 11/412,676 by Kondakov et al., that it is desirable for the LUMO energy level of the EIL compound to be equal to or nearly the same as the LUMO energy level of the material contained in the ETL. In one embodiment, the LUMO energy level of the EIL compound is equal to or more positive than the LUMO energy level of the ETL material. Suitably, the difference in LUMO energy levels of the EIL compound and the ETL material is 0.50 or less, 0.40 or less, 0.30 or less, 0.20 or less or even 0.10 eV or less. Desirably the compound in the EIL has a LUMO energy value equal to or more positive than the LUMO energy value of the compound in the ETL.

It has been shown that in order to obtain the optimum device performance, it is also important to optimize the thickness of each layer of an EL device. It has been found that the relative thickness of the EIL to that of the LEL is important. The ratio of the thickness of the EIL to LEL should be greater than 0.125. Desirably this ratio is 0.25 or greater, or even 0.50 or greater. In one embodiment, the ratio of the thickness of the EIL to LEL is in the range of 0.125 to 1.50 or desirably in the range of 0.125 to 1.25.

In one suitable embodiment, as described in U.S. patent application Ser. No. 11/412,426 by Kondakov et al., the EIL includes a heterocyclic compound. Desirably, the LUMO energy level of the heterocyclic compound is equal to or nearly the same as the LUMO energy level of the material contained in the ETL. Suitably, the difference in LUMO energy levels of the EIL heterocyclic compound and the ETL material is 0.50 or less, 0.40 or less, 0.30 or less, 0.20 or less or even 0.10 eV or less. Desirably the heterocyclic compound in the EIL has a LUMO value equal to or more positive than the LUMO value of the ETL compound.

The thickness of the organic electron-injecting layer is frequently in the range of 0.1 to 40 nm and commonly in the range of 5 to 30 nm and often in the range of 1 to 20 nm. In one embodiment the thickness of this layer is greater than 10 nm but less than 20 nm. In another embodiment, the layer thickness is greater than 20 nm.

Metal chelates, Li chelates in particular, are useful electron-injecting materials as more fully described in U.S. patent application Ser. Nos. 11/258,671; 11/259,586; 11/259,290; 11/501,336; 11/258,740; 11/258,719.

Metal chelates that do not contain the 8-hydroxyquinolate ligand are also useful as electron-injecting layers, such as described in U.S. patent application Ser. No. 11/259,290 and 11/501,336 by Begley et al., wherein the electron-injecting layer contains a cyclometallated complex represented by formula (C)

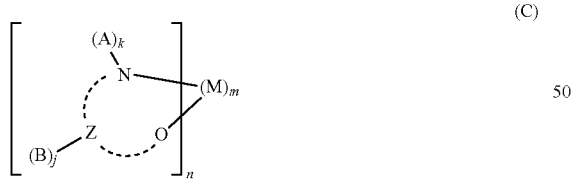

(C)

wherein:

Z and the dashed arc represent two or three atoms and the bonds necessary to complete a 5- or 6-membered ring with M;

each A represents H or a substituent and each B represents an independently selected substituent on the Z atoms, provided that two or more substituents may combine to form a fused ring or a fused ring system;

j is 0-3 and k is 1 or 2;

M represents a Group IA, IIA, IIIA and IIIB element of the Periodic Table;

m and n are independently selected integers selected to provide a neutral charge on the complex; and provided that the complex does not contain the 8-hydroxyquinolate ligand.

Illustrative of useful Li chelates are the following:

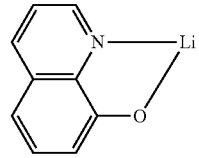

MC-1

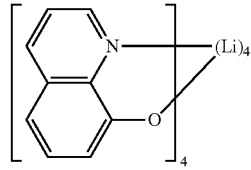

MC-2

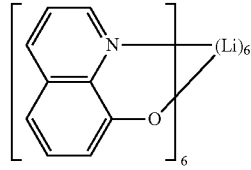

MC-3

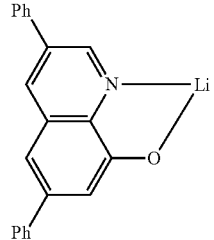

MC-4

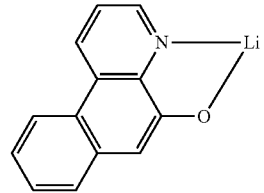

MC-5

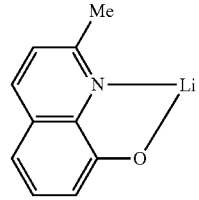

MC-6

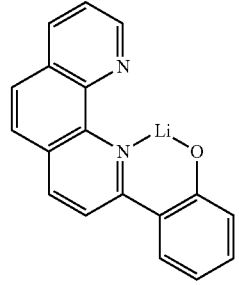

MC-7

U.S. Pat. No. 6,468,676 teaches the use of an organic metal salt, a halogenide, or an organic metal complex that is also useful for the electron-injection layer of the present invention.

Additional Electron-Injecting Layer (EIL-2)

In another desirable embodiment, a further layer is present between the cathode and the EIL and contiguous to the EIL. This layer represents an additional electron-injecting layer. Desirably the further layer includes an inorganic material such as a low work-function alkaline metal or alkaline earth metal, such as Li, Cs, Ca, and Mg. In addition, an organic material doped with these low work-function metals can also be used effectively as the electron-injecting layer. Examples are Li- or Cs-doped $AlQ_3$. In one suitable embodiment the further layer includes an alkali metal compound, such as LiF. The further layer is often a thin layer deposited to a suitable thickness in a range of 0.1-3.0 nm.

Additional electron-injecting layers, when present, include those described in U.S. Pat. Nos. 5,608,287; 5,776,622; 5,776,623; 6,137,223; 6,140,763, and U.S. Pat. No. 6,914,269. A useful additional electron-injecting layer generally consists of a material having a work function less than 4.0 eV. A thin-film containing low work-function alkaline metals or alkaline earth metals, such as Li, Cs, Ca, and Mg can be employed. In addition, an organic material doped with these low work-function metals can also be used effectively as the electron-injecting layer. Examples are Li- or Cs-doped $AlQ_3$. In one suitable embodiment an additional electron-injecting layer includes LiF. In practice, the additional electron-injecting layer is often a thin layer deposited to a suitable thickness in a range of 0.1-3.0 nm.

ETL and EIL Combinations for High Efficiency

As disclosed above and in U.S. Patent Publications 2006/0040131 and 2006/0141287 and application Ser. Nos. 11/293,656; 11/289,856; 11/290,214; 11/412,676; and 11/412,426, there are known ETL and EIL materials and device architectures that will reduce barriers for electron injection and improve electron conduction within an OLED. Improved OLED device performance is often observed as a result. For example, device drive voltage is reduced and device luminous efficiency is increased.

Cathode

When light emission is viewed solely through the anode, the cathode used in this invention can be comprised of nearly any conductive material. Desirable materials have good film-forming properties to ensure good contact with the underlying organic layer, promote electron injection at low voltage, and have good lifetime. Useful cathode materials often contain a low work function metal (<4.0 eV) or metal alloy. One cathode material is comprised of a Mg:Ag alloy wherein the percentage of silver is in the range of 1 to 20%, as described in U.S. Pat. No. 4,885,221. Another suitable class of cathode materials includes bilayers comprising the cathode and a thin electron-injecting layer (EIL) in contact with an organic layer (e.g., an electron-transporting layer (ETL), which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608,287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, U.S. Pat. No. 6,278,236, and U.S. Pat. No. 6,284,3936. Cathode materials are typically deposited by any suitable method such as evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Other Useful Organic Layers and Device Architecture

In some instances, layers 109 and 110 can optionally be collapsed into a single layer that serves the function of supporting both light emission and electron transportation. It also known in the art that emitting materials may be included in the hole-transporting layer, which may serve as a host. Multiple materials may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, EP 786 925, US 20020025419, EP 1 182 244, U.S. Pat. No. 5,683,823, U.S. Pat. No. 5,503,910, U.S. Pat. No. 5,405,709, U.S. Pat. No. 5,283,182, U.S. Pat. No. 6,696,177, U.S. Pat. No. 6,614,176, U.S. Pat. No. 6,627,333, and U.S. Pat. No. 7,037,601 and may be equipped with a suitable filter arrangement to produce color emission.

Additional layers such as electron or hole-blocking layers as taught in the art may be employed in devices of this invention. Hole-blocking layers may be used between the light-emitting layer and the electron-transporting layer. Electron-blocking layers may be used between the hole-transporting layer and the light-emitting layer. These layers are commonly used to improve the efficiency of emission, for example, as in US 20020015859.

This invention may be used in so-called stacked device architecture, for example, as taught in U.S. Pat. No. 5,703,436 and U.S. Pat. No. 6,337,492.

Deposition of Organic Layers

The organic materials mentioned above are suitably deposited by any means suitable for the form of the organic materials. In the case of small molecules, they are conveniently deposited through sublimation, but can be deposited by other means such as from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. No. 5,688,551, U.S. Pat. No. 5,851,709 and U.S. Pat. No. 6,066,357) and inkjet method (U.S. Pat. No. 6,066,357).

One preferred method for depositing the materials of the present invention is described in US 2004/0255857 and U.S. Ser. No. 10/945,941 where different source evaporators are used to evaporate each of the materials of the present invention. A second preferred method involves the use of flash evaporation where materials are metered along a material feed path in which the material feed path is temperature controlled. Such a preferred method is described in the following co-assigned patent applications: U.S. Ser. No. 10/784,585; U.S. Ser. No. 10/805,980; U.S. Ser. No. 10/945,940; U.S. Ser. No. 10/945,941; U.S. Ser. No. 11/050,924; and U.S. Ser. No. 11/050,934. Using this second method, each material may be evaporated using different source evaporators or the solid materials may be mixed prior to evaporation using the same source evaporator.

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

EXAMPLES

Example 1

Synthesis of 2-(4-methylphenyl)-9,10-di-2-naphthalenylanthracene (Inv-A46)

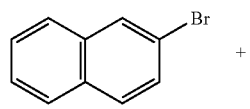

+

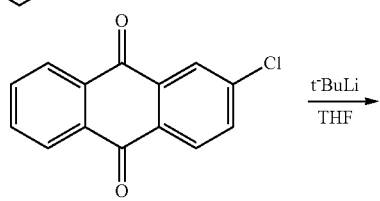

eq. 1

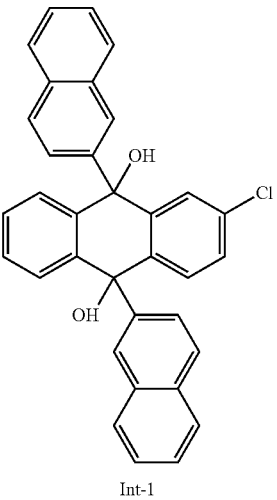

Int-1

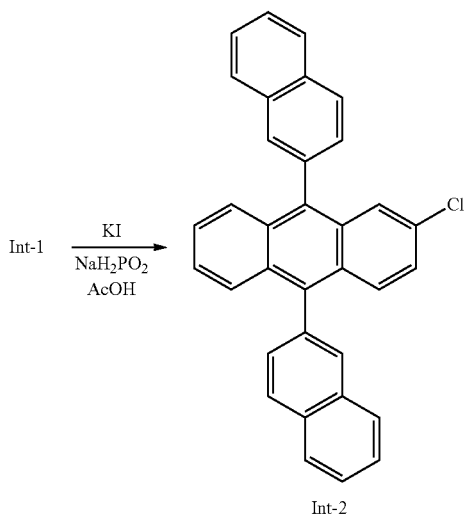

eq. 2

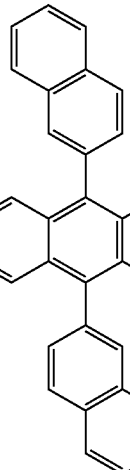 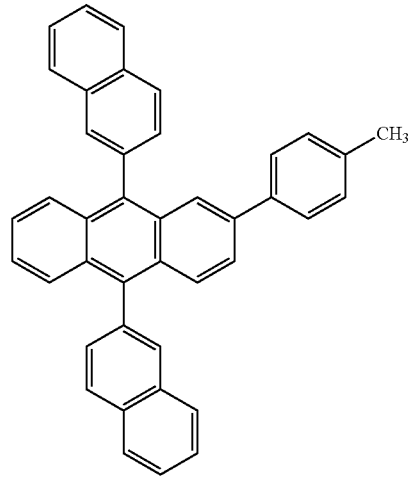

eq. 3

Inv-A46

Inv-A46, 2-(4-methylphenyl)-9,10-di-2-naphthalenylanthracene was prepared according to equation 1-equation 3. 2-Bromonaphthalene (9.2 g, 44.4 mmol) was dissolved in dry THF (118 ml) and cooled to −78° C. t-BuLi (1.7 M, 52.3 g, 89 mmol) was added in dropwise manner over 5 min, then the reaction was stirred at this temperature for another 5 min. Upon the addition of 2-chloroanthraquinone (4.3 g, 17.8 mmol), the reaction was removed from the acetone-dry ice bath and stirred at room temperature overnight. The reaction mixture was added to aqueous ammonium chloride solution and the product was extracted with methylene chloride. The organic phase was dried with magnesium sulfate, filtered, and concentrated. Purification by crystallization (85% ether/heptane) gave Int-1 (eq. 1).

Intermediate Int-2 was prepared by the following procedure (eq. 2). Potassium iodide (17.6 g, 106.02 mmol) and sodium hypophosphite hydrate (16.5 g, 188.1 mmol) were added to a mixture of Int-1 (5.7 g, 11.4 mmol) in acetic acid (181 mL). The mixture was heated to reflux for 3 h, then cooled to room temperature. The yellow solid was filtered and washed with water and methanol to yield Int-2.

The final synthetic procedure to synthesize Inv-A46 is the following (eq. 3). 4-tolylboronic acid (1.2 equivalents.), tris(dibenzylideneacetone)dipalladium (0) (0.03 equivalents), tricyclohexylphosphine (0.045 equivalents), and potassium phosphate (2 equivalents) were added to a mixture of Int-2 (1 equivalent) in degassed toluene under dry conditions. The reaction mixture was heated to reflux overnight. The reaction mixture was cooled, filtered through celite, and added to water. The product was extracted from methylene chloride, dried with magnesium sulfate, filtered, and concentrated. Column chromatography (silica gel with 95% heptane/methylene chloride eluent) yields Inv-A46. FD-MS (m/z): 520.

Example 2

Synthesis of N,N,N',N', 9,10-hexaphenyl-2,6-anthracenediamine (Inv-B1)

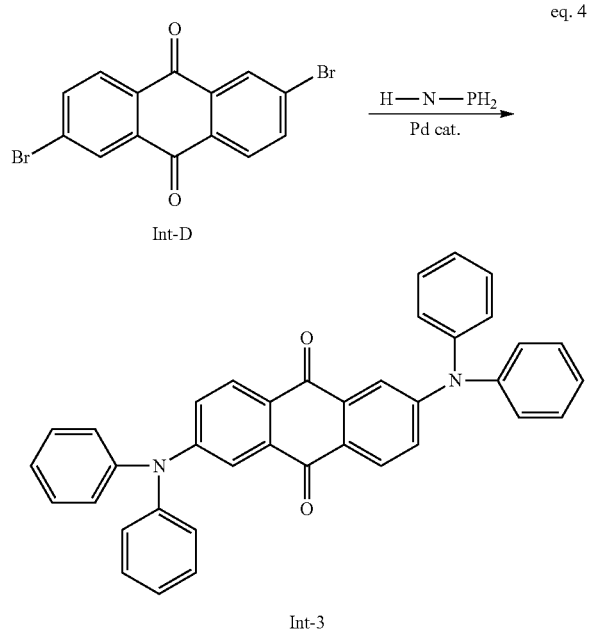

eq. 4

Int-D

Int-3

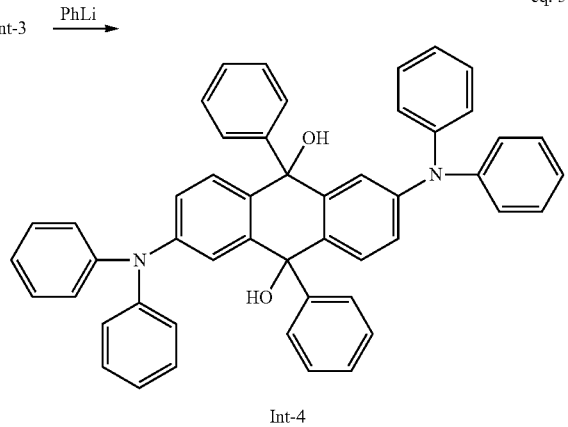

eq. 5

Int-4

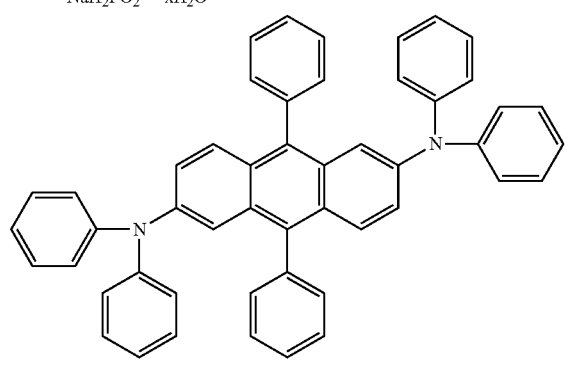

eq. 6

Inv-B1

Inv-B1, N,N,N',N', 9,10-hexaphenyl-2,6-anthracenediamine, was prepared according to equation 4-equation 6. Under a nitrogen atmosphere 2,6-dibromoanthraquinone (44 g, 0.12 mol), diphenylamine (42.5 g, 0.26 mol), sodium tert-butoxide (27 g, 0.27 mol), palladium(II) acetate (1.5 g, 0.007 mol), and 400 ml of toluene were added together. With stirring, tri-tert-butylphosphine (1.1 g, 0.005 mol) was added and the reaction was heated at 90° C. for 12 hours. Upon cooling, the reaction mixture was passed through a pad of silica gel, eluting with $CH_2Cl_2$. Solvents were removed and the crude solid was further purified by chromatography to yield 48.9 g (75% yield) of N,N,N',N'-tetraphenyl-2,6-diamino-9,10-anthracenedione (Int-1, eq. 1) as a red solid. FD-MS (m/z): 542

Compound (Int-1) (20 g, 0.036 moles) and 200 ml anhydrous tetrahydrofuran (THF) were placed under nitrogen and cooled to −78° C. with stirring. Phenyllithium (1.8 M in cyclohexane:ether [70:30], 45 ml, 0.081 mol) was added drop-wise and the reaction mixture was allowed to warm to room temperature overnight. The reaction mixture was then poured into water and 200 ml $CH_2Cl_2$ was added. The organic layer was separated from water layer, and the organic layer was then washed with water, dried over $Na_2SO_4$, and concentrated to yield crude N,N,N',N',9,10-hexaphenyl-2,6-diamino-9,10-dihydro-9,10-anthracenediol (Int-2).

Crude Int-2 was dissolved in 500 ml acetic acid. Sodium iodide (50 g), and sodium hypophosphite hydrate (50 g) were added with stirring. The mixture was heated to reflux for 60 minutes, cooled to room temperature and poured into water. The precipitated solid was collected by filtration, washed with water, washed with a small amount of methanol (~20 ml) and then dried. Purification by column chromatography yielded 14.0 g (57% yield) of pure N,N,N',N',9,10-hexaphenyl-2,6-anthracenediamine (Inv-B1) as an orange solid. This material was sublimed at a pressure of 600 mTorr and a temperature of 265° C. using train sublimation. FD-MS (m/z): 664.

Example 3

Synthesis of N,N,N',N'-tetrakis(4-methylphenyl)-9,10-diphenyl-2,6-anthracenediamine (Inv-B73)

Under a nitrogen atmosphere 2,6-dibromoanthraquinone (5 g, 13.7 mmol), di-tolylamine (5.6 g, 28.4 mmol), sodium tert-butoxide (3.1 g, 32.2 mmol), palladium(II) acetate (0.17 g, 0.75 mmol), and 50 ml of toluene were added together. With stirring, tri-tert-butylphosphine (0.13 g, 0.64 mmol) was added and the reaction was heated at 90° C. for 12 hours. Upon cooling, the reaction mixture was passed through a pad of silica gel, eluting with $CH_2Cl_2$. Solvents were removed and the crude solid was further purified by chromatography to yield 5.0 g (61% yield) of N,N,N',N'-tetrakis(4-methylphenyl)-2,6-diamino-9,10-anthracenedione as a red solid. FD-MS (m/z): 598

N,N,N',N'-tetrakis(4-methylphenyl)-2,6-diamino-9,10-anthracenedione (2.5 g, 41.8 mmol) and 50 ml anhydrous THF were placed under nitrogen and cooled to −78° C. with stirring. Phenyllithium (1.8 M in cyclohexane:ether [70:30], 6.0 ml, 10.8 mmol) was added drop-wise and the reaction was allowed to warm to room temperature overnight. The reaction mixture was poured into water and 50 ml $CH_2Cl_2$ was added. Organic layer separated from the water layer, and the organic layer was then washed with water, dried over $Na_2SO_4$, and concentrated to yield crude N,N,N',N'-tetrakis(4-methylphenyl)-2,6-diamino-9,10-dihydro-9,10-diphenyl-9,10-anthracenediol.

The crude N,N,N',N'-tetrakis(4-methylphenyl)-2,6-diamino-9,10-dihydro-9,10-diphenyl-9,10-anthracenediol was dissolved in 65 ml acetic acid. Sodium iodide (10 g), and sodium hypophosphite hydrate (10 g) were added with stirring. The mixture was heated to reflux for 60 minutes, cooled to room temperature and poured into water. The precipitated solid was collected by filtration, washed with water, washed with a small amount of methanol (~5 ml) and then dried. Purification by column chromatography yielded 2.3 g (76% yield) of pure N,N,N',N'-tetrakis(4-methylphenyl)-9,10-diphenyl-2,6-anthracenediamine (Inv-B73) as an orange solid. At a pressure of 600 mTorr, Inv-3 sublimed at 290° C. using train sublimation. FD-MS (m/z): 720.

Example 4

The synthesis of N,N'-di-2-naphthalenyl-N,N',9,10-tetraphenyl-2,6-anthracenediamine (Inv-B10)

Under a nitrogen atmosphere, 2,6-dibromoanthraquinone (11.0 g, 30.1 mmol), N-phenyl-2-naphthalenamine (15.0 g, 68.5 mmol), sodium tert-butoxide (6.75 g, 70.2 mmol), palladium(II) acetate (0.38 g, 1.7 mmol), and 100 ml of toluene were added together. With stirring, tri-tert-butylphosphine (0.28 g, 1.4 mmol) was added and the reaction was heated at 90° C. for 12 hours. Upon cooling, the reaction mixture was passed through a pad of silica gel, and eluted with $CH_2Cl_2$. Solvents were removed and the crude solid further purified by chromatography to yield 17.3 g (89.7% yield) of N,N,N',N'-tetrakis(4-methylphenyl)-2,6-diamino-9,10-anthracenedione as a red solid. FD-MS (m/z): 642

N,N,N',N'-tetrakis(4-methylphenyl)-2,6-diamino-9,10-anthracenedione (2.5 g, 3.1 mmol) and 50 ml anhydrous THF were placed under nitrogen and cooled to −78° C. with stirring. Phenyllithium (1.8 M in cyclohexane:ether [70:30], 5.0 ml, 9 mmol) was added drop-wise and the reaction was allowed to warm to room temperature overnight. The reaction mixture was poured into water and 50 ml $CH_2Cl_2$ was added. The organic layer was separated from the water layer, and the organic layer was then washed with water, dried over $Na_2SO_4$, and concentrated to yield crude N,N'-di-2-naphthalenyl-N,N',9,10-tetraphenyl-2,6-diamino-9,10-dihydro-9,10-anthracenediol.

The crude diol was dissolved in 65 ml of acetic acid. Sodium iodide (10 g), and sodium hypophosphite hydrate (10 g) were added with stirring. The mixture was heated to reflux for 60 minutes, cooled to room temperature and poured to water. The precipitated solid was collected by filtration, washed with water and then a small amount of methanol (~10 ml) and dried. Purification by column chromatography yielded 0.5 g (17% yield) of pure N,N'-di-2-naphthalenyl-N,N',9,10-tetraphenyl-2,6-anthracenediamine (Inv-B10) as an orange solid. At a pressure of 600 mTorr, Inv-4 sublimed at 300° C. using train sublimation. FD-MS (m/z): 764.

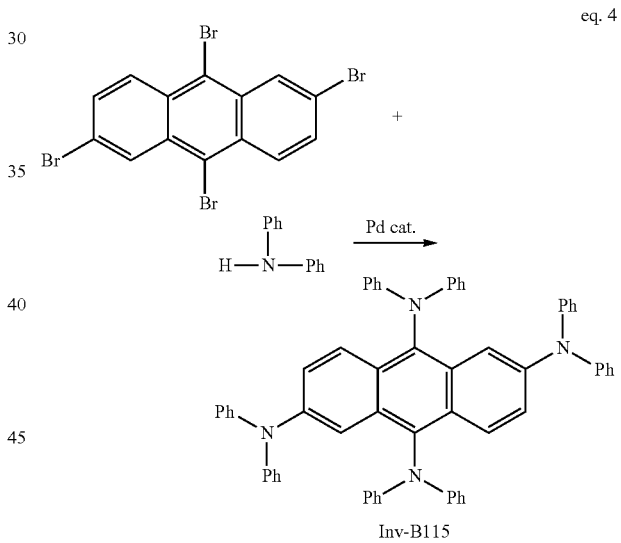

eq. 4

Inv-B115

Example 5

Synthesis of N,N,N',N',N'',N'',N''',N'''-octaphenyl-2,6,9,10-tetraminoanthracene (Inv-B115)

Inv-23 was prepared according to equation 4. Under a nitrogen atmosphere 2,6,9,10-tetrabromoanthracene (1.5 g, 3.0 mmol), diphenylamine (2.57 g, 15.2 mmol), sodium tert-butoxide (1.63 g, 16.3 mmol), palladium(II) acetate (90 mg, 0.4 mmol), and 25 ml of toluene were added together. With stirring, tri-tert-butylphosphine (67 mg, 0.3 mmol) was added and the reaction was heated at 90° C. for 12 hours. Upon cooling, the reaction mixture was passed through a pad of silica gel, eluting with $CH_2Cl_2$. Solvents were removed and the crude solid was further purified by chromatography to yield 1.1 g (43% yield) of N,N,N',N',N'',N'', N'''',N''''-octaphenyl-2,6,9,10-tetraminoanthracene (Inv-B115) as a red solid. FD-MS (m/z): 846

Example 6

Measurement of Oxidation Potentials

A Model CHI660 electrochemical analyzer (CH Instruments, Inc., Austin, Tex.) was employed to carry out the electrochemical measurements. Cyclic voltammetry (CV) and Osteryoung square-wave voltammetry (SWV) were used to characterize the redox properties of the compounds of interest. A glassy carbon (GC) disk electrode (A=0.071 cm$^2$) was used as working electrode. The GC electrode was polished with 0.05 um alumina slurry, followed by sonication cleaning in Milli-Q deionized water twice and rinsed with acetone in between water cleaning. The electrode was finally cleaned and activated by electrochemical treatment prior to use. A platinum wire served as counter electrode and a saturated calomel electrode (SCE) was used as a quasi-reference electrode to complete a standard 3-electrode electrochemical cell. Ferrocene (Fc) was used as an internal standard ($E_{Fc}$=0.50 vs.SCE in 1:1 acetonitrile/toluene. A mixture of acetonitrile and toluene (MeCN/Toluene, 1/1, v/v) was used as the organic solvent system. The supporting electrolyte, tetrabutylammonium tetrafluoroborate (TBAF) was recrystallized twice in isopropanol and dried under vacuum for three days. All solvents used were low water content (<20 ppm water). All compounds were analyzed as received. The testing solution was purged with high purity nitrogen gas for approximately 5 minutes to remove oxygen and a nitrogen blanket was kept on the top of the solution during the course of the experiments. All measurements were performed at ambient temperature of 25±1° C.

Sonication was used to aid the dissolution. The non-dissolved solids were filtered via a 0.45 um Whatman glass microfiber syringeless filter prior to the voltammetric measurements.

The oxidation potentials were determined either by averaging the anodic peak potential (Ep,a) and cathodic peak potential (Ep,c) for reversible or quasi-reversible electrode processes or on the basis of peak potentials (in SWV) for irreversible processes. The oxidation potentials reported refer to the first event electron transfer, i.e. generation of the radical-cation species, which is the process believed to occur in the solid-state. Results are reported in Table 1. The Eox of Inv-B122 relative to Inv-1 was calculated using the following equation:

$$Eox = -17.5 * Ehomo - 2.17.$$

Ehomo is the HOMO energy taken from a B3LYP/MIDI! geometry optimization using the PQS computer code (PQS v3.2, Parallel Quantum Solutions, Fayetteville, Ark.). The calculated oxidation potential of Inv-B122 was found to be 0.1 V less than that of Inv-B1 and is estimated to be 0.58 V vs. SCE.

TABLE 1

Oxidation Potentials

| Compound | Oxidation Potential (vs. SCE, V) |
|---|---|
| NPB[1] | 0.86 |
| m-TDATA[2] | 0.46 |
| CX-4 | 0.995 |
| CX-5 | 0.951 |

TABLE 1-continued

Oxidation Potentials

| Compound | Oxidation Potential (vs. SCE, V) |
|---|---|
| Inv-B1 | 0.68 |
| Inv-B73 | 0.60 |
| Inv-B115 | 0.67 |
| Inv-B122 | 0.58[3] |

[1]NPB: N,N'-di(1-naphthyl)-N,N'-diphenyl-4,4'-diaminobiphenyl.
[2]m-TDATA: 4,4',4''-tris[(3-methylphenyl)phenylamino]triphenylamine.
[3]Estimated from calculations

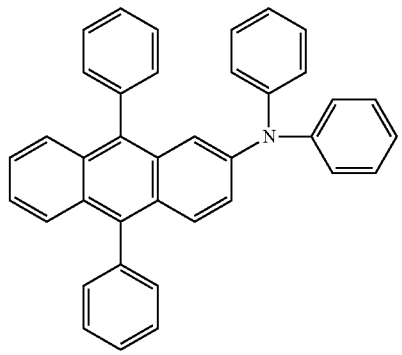

CX-4

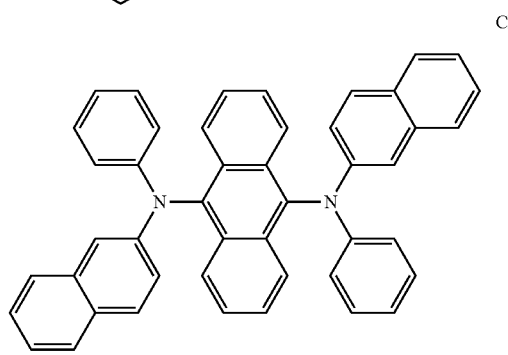

CX-5

It can be seen from Table 1 that Inventive light-emitting second anthracene compounds (b) have oxidation potentials that are below 0.8 V vs SCE while comparative aminoanthracene materials CX-4 and CX-5, which do not fulfill the requirements of the present invention, have oxidation potentials above 0.8 V vs. SCE.

Example 7

The Fabrication of Devices 1-1, 1-2, and 1-3

Inventive EL device 1-1, satisfying the requirements of the invention, was constructed in the following manner:

A ~1.1 mm thick glass substrate coated with a transparent ITO conductive layer was cleaned and dried using a commercial glass scrubber tool. The thickness of ITO is about 25 nm and the sheet resistance of the ITO is about 68 Ω/square. The ITO surface was subsequently treated with oxidative plasma to condition the surface as an anode. A layer of CFx, 1 nm thick, was deposited on the clean ITO surface by decomposing $CHF_3$ gas in an RF plasma treatment chamber. The substrate was then transferred into a vacuum deposition chamber for deposition of all other layers on top of the substrate. The following layers were deposited in the following sequence by sublimation from heated boats under a vacuum of approximately $10^{-6}$ Torr:

a) a 110 nm hole-transporting layer including N,N'-di(1-naphthyl)-N,N'-diphenyl-4,4'-diaminobiphenyl (NPB);
b) a 40 nm light-emitting layer including Inv-A5 as host and Inv-B1 as the light-emitting dopant (5.8% by volume);
c) a 35 nm electron-transporting layer of $AlQ_3$;
d) a 0.5 nm electron-injecting layer of lithium fluoride;
e) a 100 nm cathode of aluminum.

Following that the device was encapsulated in a nitrogen atmosphere along with calcium sulfate as a desiccant.

Comparative Device 1-2 was prepared in the same manner as Device 1-1 except that Inv-A5 was replaced with CX-1, and Inv-B1 was present at 5.9% by volume.

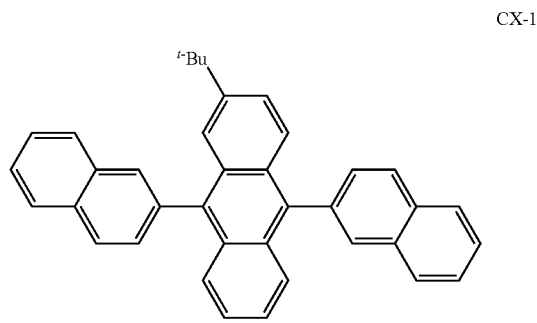 [SMILES: CC(C)(C)c1ccc2c(-c3ccc4ccccc4c3)c3ccccc3c(-c3ccc4ccccc4c3)c2c1]

CX-1

Comparative Device 1-3 was prepared in the same manner as Device 1-1, except that Inv-A5 was replaced with CX-2, and Inv-B1 was present at 6.1% by volume.

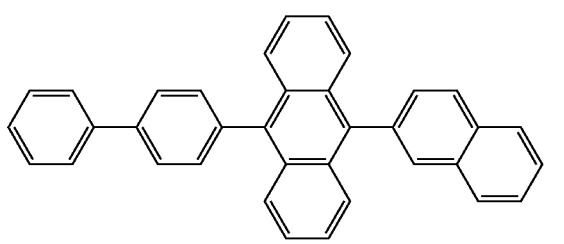

CX-2

Devices 1-1, 1-2, and 1-3 were tested for luminance and chromaticity ($CIE_{x,y}$) at a constant current of 20 mA/cm². Device lifetime, which is the time required for the initial luminance to drop by 50%, was measured at room temperature using a DC current of 80 mA/cm² and device performance results are reported in Table 2.

It can be seen from Table 2 that Inventive Device 1-1, which utilizes a host and dopant of the present invention, affords the combination of high luminance with excellent lifetime. Comparative Device 1-2, which replaced Inv-A5 with CX-1, has lower luminance and significantly lower lifetime compared to Inventive Device 1-1. Comparative Device 1-3, which replaced Inv-A5 with CX-2, has about the same luminance as Device 1-1, however the lifetime is significantly lower when compared to Device 1-1. Neither of the Comparative Devices utilizes an anthracene host material having aryl substitution in the 2 position of anthracene.

Example 8

Fabrication of Devices 2-1, 2-2, and 2-3

Inventive EL device 2-1, satisfying the requirements of the invention, was constructed in the following manner:

A ~1.1 mm thick glass substrate coated with a transparent ITO conductive layer was cleaned and dried using a commercial glass scrubber tool. The thickness of ITO is about 25 nm and the sheet resistance of the ITO is about 68 Ω/square. The ITO surface was subsequently treated with oxidative plasma to condition the surface as an anode. A layer of CFx, 1 nm thick, was deposited on the clean ITO surface by decomposing $CHF_3$ gas in an RF plasma treatment chamber. The substrate was then transferred into a vacuum deposition chamber for deposition of all other layers on top of the substrate. The following layers were deposited in the following sequence by sublimation from heated boats under a vacuum of approximately $10^{-6}$ Torr:

a) a 110 nm hole-transporting layer including NPB;
b) a 40 nm light-emitting layer including Inv-A5 as host and Inv-B1 as the light-emitting dopant (5.9% by volume);
c) a 25 nm electron-transporting layer of $AlQ_3$;
d) a 0.5 nm electron-injecting layer of lithium fluoride;
e) a 100 nm cathode of aluminum.

Following that the device was encapsulated in a nitrogen atmosphere along with calcium sulfate as a desiccant.

Inventive Device 2-2 was prepared in the same manner as Device 2-1 except that Inv-A5 was replaced with Inv-A65, and Inv-B1 was present at 5.8% by volume.

Inventive Device 2-3 was prepared in the same manner as Device 2-1, except that Inv-A5 was replaced with Inv-A55, and Inv-B1 was present at 6.0% by volume.

Devices 2-1, 2-2, and 2-3 were tested for luminance and chromaticity ($CIE_{x,y}$) at a constant current of 20 mA/cm². Device lifetime, which is the time required for the initial luminance to drop by 50%, was measured at room temperature using a DC current of 80 mA/cm² and device performance results are reported in Table 3.

TABLE 2

Performance data for Devices 1-1, 1-2, and 1-3

| Devices | Host Material | Inv-B1 Concentration | Lum. (cd/m²) | $CIE_x$, $CIE_y$ | Lifetime $t_{50}$@80 mA/cm² (hours) |
|---|---|---|---|---|---|
| 1-1 Inventive | Inv-A5 | 5.8% | 4281 | 0.255 0.663 | 1,029 |
| 1-2 Comparative | CX-1 | 5.9% | 3456 | 0.239 0.657 | 225 |
| 1-3 Comparative | CX-2 | 6.1% | 4270 | 0.262 0.661 | 387 |

TABLE 3

Performance data for Devices 2-1, 2-2, and 2-3

| Devices | Host Material | Inv-B1 Concentration | Lum. (cd/m²) | $CIE_x$, $CIE_y$ | Lifetime $t_{50}$@80 mA/cm² (hours) |
|---|---|---|---|---|---|
| 2-1 Inventive | Inv-A5 | 5.9% | 4049 | 0.262 0.660 | 970 |
| 2-2 Inventive | Inv-A65 | 5.8% | 3094 | 0.265 0.660 | 1,130 |
| 2-3 Inventive | Inv-A55 | 6% | 3657 | 0.243 0.664 | 950 |

It can be seen from Table 3 that Inventive Devices 2-1, 2-2, and 2-3 afford a combination of high luminance with excellent lifetime.

Example 9

Fabrication of Devices 3-1 and 3-2

Inventive EL device 3-1, satisfying the requirements of the invention, was constructed in the following manner:

A ~1.1 mm thick glass substrate coated with a transparent ITO conductive layer was cleaned and dried using a commercial glass scrubber tool. The thickness of ITO is about 25 nm and the sheet resistance of the ITO is about 68 Ω/square. The ITO surface was subsequently treated with oxidative plasma to condition the surface as an anode. A layer of CFx, 1 nm thick, was deposited on the clean ITO surface by decomposing $CHF_3$ gas in an RF plasma treatment chamber. The substrate was then transferred into a vacuum deposition chamber for deposition of all other layers on top of the substrate. The following layers were deposited in the following sequence by sublimation from heated boats under a vacuum of approximately $10^{-6}$ Torr:

a) a 113.5 nm hole-transporting layer including NPB;
b) a 40 nm light-emitting layer including Inv-A5 as host and Inv-B1 as the light-emitting dopant (7% by volume);
c) a 35 nm electron-transporting layer of $AlQ_3$;
d) a 0.5 nm electron-injecting layer of lithium fluoride;
e) a 100 nm cathode of aluminum.

Following that the device was encapsulated in a nitrogen atmosphere along with calcium sulfate as a desiccant.

Comparative Device 3-2 was prepared in the same manner as Device 2-1 except that Inv-A5 was replaced with CX-3.

CX-3

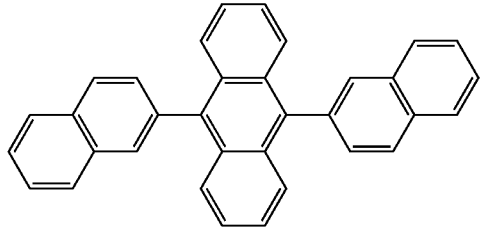

Devices 3-1 and 3-2 were tested for luminance and chromaticity ($CIE_{x,y}$) at a constant current of 20 mA/cm². Device lifetime, which is the time required for the initial luminance to drop by 50%, was measured at room temperature using an initial luminance of 5,000 cd/m² and device performance results are reported in Table 4.

TABLE 4

Performance data for Devices 3-1 and 3-2

| Devices | Host Material | Inv-B1 concentration | Lum. (cd/m²) | $CIE_x$, $CIE_y$ | Lifetime $t_{50}$@5,000 cd/m² (hours) |
|---|---|---|---|---|---|
| 3-1 Inventive | Inv-A5 | 7% | 5113 | 0.255 0.662 | 6,500 |
| 3-2 Comparative | CX-3 | 7% | 4650 | 0.250 0.664 | 3,500 |

It can be seen from Table 4 that Inventive Device 3-1, which contains host and dopant materials of the present invention, has superior luminance and lifetime compared to Comparative Device 3-2, which has the same light-emitting material as Device 3-1 but utilizes an anthracene host material that does not have aryl substitution in the 2 position.

Example 10

Fabrication of Devices 4-1, 4-2, and 4-3

Inventive EL device 2-1, satisfying the requirements of the invention, was constructed in the following manner:

A ~1.1 mm thick glass substrate coated with a transparent ITO conductive layer was cleaned and dried using a commercial glass scrubber tool. The thickness of ITO is about 25 nm and the sheet resistance of the ITO is about 68 Ω/square. The ITO surface was subsequently treated with oxidative plasma to condition the surface as an anode. A layer of CFx, 1 nm thick, was deposited on the clean ITO surface by decomposing $CHF_3$ gas in an RF plasma treatment chamber. The substrate was then transferred into a vacuum deposition chamber for deposition of all other layers on top of the substrate. The following layers were deposited in the following sequence by sublimation from heated boats under a vacuum of approximately $10^{-6}$ Torr:

a) a 110 nm hole-transporting layer including NPB;
b) a 40 nm light-emitting layer including Inv-A5 as host and Inv-B1 as the light-emitting dopant (6.1% by volume);
c) a 25 nm electron-transporting layer of $AlQ_3$;
d) a 0.5 nm electron-injecting layer of lithium fluoride;
e) a 100 nm cathode of aluminum.

Following that the device was encapsulated in a nitrogen atmosphere along with calcium sulfate as a desiccant.

Comparative Device 4-2 was prepared in the same manner as Device 4-1 except that Inv-B1 was replaced with CX-4 at a concentration of 6.1% by volume.

CX-4

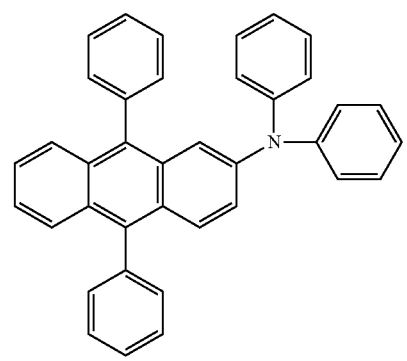

Comparative Device 4-3 was prepared in the same manner as Device 4-1 except that Inv-B1 was replaced with CX-5 at a concentration of 6.8% by volume.

CX-5

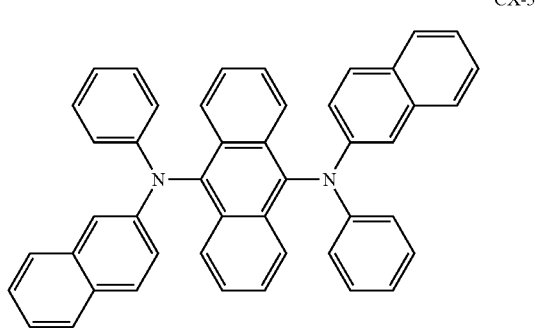

Devices 4-1, 4-2, and 4-3 were tested for luminance and chromaticity ($CIE_{x,y}$) at a constant current of 20 mA/cm². Device lifetime, which is the time required for the initial luminance to drop by 50%, was measured at room temperature using an initial luminance of 10,000 cd/m² and device performance results are reported in Table 5.

TABLE 5

Performance data for Device 4-1, 4-2, and 4-3

| Devices | Host Material | Dopant (concentration) | Lum. (cd/m²) | $CIE_x$, $CIE_y$ | Lifetime $t_{50}$@80 mA/cm² (hours) |
|---|---|---|---|---|---|
| 4-1 Inventive | Inv-A5 | Inv-B1 (6.1%) | 3892 | 0.253 0.661 | 3,600 |
| 4-2 Comparative | Inv-A5 | CX-4 (6.1%) | 1654 | 0.190 0.515 | 496 |
| 4-3 Comparative | Inv-A5 | CX-5 (6.8%) | 2211 | 0.301 0.635 | 794 |

It can be seen from Table 5 that Inventive Device 4-1, which contains host and dopant materials of the present invention, has far superior luminance and lifetime data compared to Devices 4-2 and 4-3, which have the same host materials as Device 4-1 but utilize different dopants. Additionally, Inventive Device 4-1 has improved green color compared to Comparative Devices 4-2 and 4-3. Comparative Devices 4-2 and 4-3 do not utilize a light-emitting anthracene compound having amino substitution at a minimum of two positions, wherein at least one amine is substituted at the 2 position of anthracene.

Example 11

Fabrication of Devices 5-1, 5-2, 5-3, 5-4, 5-5, and 5-6

Inventive EL device 5-1, satisfying the requirements of the invention, was constructed in the following manner:

A ~1.1 mm thick glass substrate coated with a transparent ITO conductive layer was cleaned and dried using a commercial glass scrubber tool. The thickness of ITO is about 25 nm and the sheet resistance of the ITO is about 68 Ω/square. The ITO surface was subsequently treated with oxidative plasma to condition the surface as an anode. A layer of CFx, 1 nm thick, was deposited on the clean ITO surface by decomposing $CHF_3$ gas in an RF plasma treatment chamber. The substrate was then transferred into a vacuum deposition chamber for deposition of all other layers on top of the substrate. The following layers were deposited in the following sequence by sublimation from heated boats under a vacuum of approximately $10^{-6}$ Torr:

a) a 120.2 nm hole-transporting layer including NPB;
b) a 40 nm light-emitting layer including Inv-A5 as host and Inv-B1 as the light-emitting dopant (6% by volume);
c) a 25 nm electron-transporting layer of A5;
d) a 5 nm electron-injecting layer of PH-1 (EIL);
e) a 0.5 nm further electron-injecting layer of LiF (EIL-2);
f) a 100 nm cathode of aluminum.

Following that the device was encapsulated in a nitrogen atmosphere along with calcium sulfate as a desiccant.

PH-1

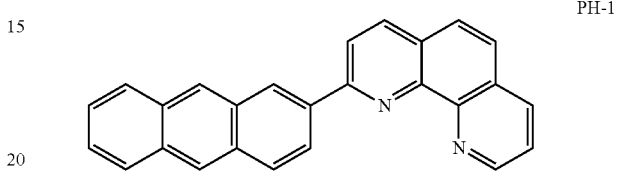

Comparative Device 5-2 was prepared in the same manner as Device 5-1 except that the following layers were deposited in the following sequence by sublimation from heated boats under a vacuum of approximately $10^{-6}$ Torr:

a) a 110 nm hole-transporting layer including NPB;
b) a 20 nm light-emitting layer including Inv-A5 as host and Inv-B1 as the light-emitting dopant (6% by volume);
c) a 35 nm electron-transporting layer of Inv-A5;
d) a 10 nm electron-injecting layer of PH-1 (EIL);
e) a 0.5 nm further electron-injecting layer of MC-3 (EIL-2);
f) a 100 nm cathode of aluminum.

Comparative Device 5-3 was prepared in the same manner as Device 5-1, except that layer d) was omitted and the following layers were deposited in the following sequence by sublimation from heated boats under a vacuum of approximately $10^{-6}$ Torr:

a) a 110 nm hole-transporting layer including NPB;
b) a 20 nm light-emitting layer including Inv-A5 as host and Inv-B1 as the light-emitting dopant (6% by volume);
c) a 45 nm electron-transporting layer of Inv-A5;
e) a 2.0 nm further electron-injecting layer of MC-3 (EIL-2);
f) a 100 nm cathode of aluminum.

Comparative Device 5-4 was prepared in the same manner as Device 5-3 except that layer c) included 2.5 nm of MC-7 instead of 2.0 nm of MC-3.

Comparative Device 5-5 was prepared in the same manner as Device 5-2 except that layer d) included 1% by volume of Li.

Comparative Device 5-6 was prepared in the same manner as Device 5-5 except that layer e) was omitted.

Devices 1-1, 5-1, 5-2, 5-3, 5-4, 5-5, and 5-6 were tested for luminance, voltage, and chromaticity ($CIE_{x,y}$) at a constant current of 20 mA/cm² and device performance results are reported in Table 6.

TABLE 6

Performance data for Devices 1-1, 5-1, 5-2, 5-3, 5-4, 5-5, and 5-6.

| Devices | ETL | EIL | EIL-2 | Lum. (cd/m²) | Voltage | $CIE_x$, $CIE_y$ |
|---|---|---|---|---|---|---|
| 1-1 Inventive | AlQ₃ | — | LiF | 4,281 | 7.6 | 0.255 0.663 |

TABLE 6-continued

Performance data for Devices 1-1, 5-1, 5-2, 5-3, 5-4, 5-5, and 5-6.

| Devices | ETL | EIL | EIL-2 | Lum. (cd/m²) | Voltage | CIE$_x$, CIE$_y$ |
|---|---|---|---|---|---|---|
| 5-1 Inventive | A5 | PH-1 | LiF | 6,258 | 4.1 | 0.274 0.657 |
| 5-2 Inventive | A5 | PH-1 | MC-3 | 5,739 | 3.8 | 0.252 0.654 |
| 5-3 Inventive | A5 | — | MC-3 | 6,000 | 3.7 | 0.250 0.660 |
| 5-4 Inventive | A5 | — | MC-7 | 5,750 | 3.4 | 0.255 0.658 |
| 5-5 Inventive | — | PH-1 + 1% Li | MC-3 | 5,805 | 3.6 | 0.252 0.655 |
| 5-6 Inventive | — | PH-1 + 1% Li | — | 5,949 | 3.7 | 0.250 0.655 |

It can be seen from Table 6 that by changing the ETL materials and the ETL device configurations, such as in Inventive Devices 5-1, 5-2, 5-3, 5-4, 5-5, and 5-6, the luminance can be increased and voltage can be lowered when compared to Inventive Device 1-1 which has AlQ$_3$ as the ETL and LiF as the EIL-2.

The entire contents of the patents and other publications referred to in this specification are incorporated herein by reference. The invention has been described in detail with particular reference to certain preferred embodiments thereof, but it will be understood that variations and modifications can be effected within the spirit and scope of the invention.

PARTS LIST

101 Substrate
103 Anode
105 Hole-Injecting layer (HIL)
107 Hole-Transporting Layer (HTL)
109 Light-Emitting layer (LEL)
110 Electron-Transporting layer (ETL)
111 Electron-Injecting layer (EIL)
112 Second Electron-Injecting layer
113 Cathode
150 Power Source
160 Conductor

The invention claimed is:

1. An OLED device comprising a cathode, an anode, and having therebetween a light-emitting layer, wherein the light-emitting layer comprises:
    (a) a 2-arylanthracene compound and
    (b) a light-emitting second anthracene compound having amino substitution at the 2,6-positions, represented by Formula [5]:

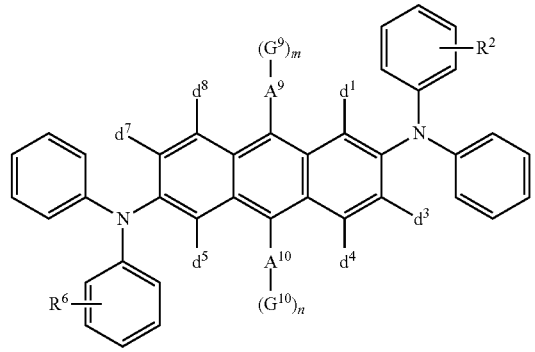

wherein:
    $d^1$, $d^3$-$d^5$ and $d^7$-$d^8$ each represent hydrogen;
    substituents $A^9$ and $A^{16}$ are phenyl rings;
    substituents $R^2$ and $R^6$ independently represent hydrogen or an alkyl group comprising from 1 to 10 carbon atoms;
    m and n are independently 1;
    substituents $G^9$ and $G^{10}$ are independently substituted or unsubstituted phenyl rings;
    substituent $G^9$ is joined together with substituent $A^9$ to form an additional fused ring group; and
    substituent $G^9$ is joined together with substituent $A^{16}$ to form an additional fused ring group.

2. The OLED device of claim 1 which contains an electron-transporting layer which comprises an anthracene derivative as an electron-transporting material.

3. The OLED device of claim 1 which contains an electron-transporting layer which comprises a mixture of an anthracene material and an organic alkali metal complex compound.

4. An OLED device comprising a cathode, an anode, and having therebetween a light-emitting layer, wherein the light-emitting layer comprises:
    (a) a 2-arylanthracene compound represented by Formula [2]:

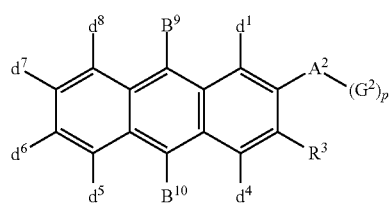

wherein in Formula [2]:
    $d^1$ and $d^4$-$d^8$ are hydrogen;
    $R^3$ is hydrogen or a substituent;
    substituents $B^9$ and $B^{10}$ are naphthyl groups;
    substituent $A^2$ is a phenyl ring;
    p is an integer from 1 to 4;
    substituent $G^2$ is a substituted or unsubstituted phenyl group;
    provided that two or more of the aforementioned substituents may be joined together to form one or more ring groups;
    provided that $A^2$ and $G^2$ are not joined as fused rings
(b) a light-emitting second anthracene compound having amino substitution at the 2,6-positions represented by Formula [5]:

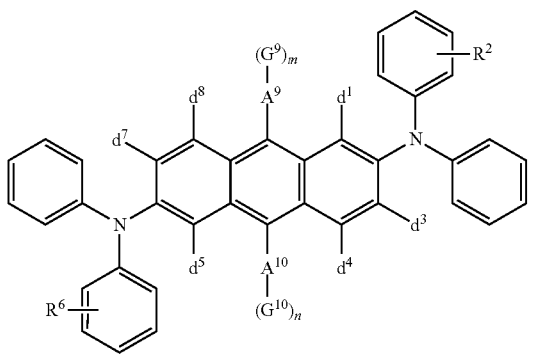

wherein in Formula [5]:
$d^1$, $d^3$-$d^5$ and $d^7$-$d^8$ each represent hydrogen;
substituents $A^9$ and $A^{10}$ are phenyl rings;
substituents $R^2$ and $R^6$ are alkyl groups comprising from 1 to 10 carbon atoms;
m and n are independently integers from 0 to 4;
substituents $G^9$ and $G^{10}$ are independently substituted or unsubstituted phenyl rings;
provided that two or more of the aforementioned substituents may be joined together to form one or more ring groups.

5. The OLED device of claim 4, wherein in Formula [2] substituents $R^3$ and $A^2$ are joined to form a ring group.

6. The OLED device of claim 4, wherein $B^9$ and $B^{10}$ are each a 2-naphthyl group.

7. The OLED device of claim 4 which contains an electron-transporting layer which comprises an anthracene derivative as an electron-transporting material.

8. The OLED device of claim 4 which contains an electron-transporting layer which comprises a mixture of an anthracene material and an organic alkali metal complex compound.

9. An OLED device comprising a cathode, an anode, and having therebetween a light-emitting layer, wherein the light-emitting layer comprises:
(a) a 2-arylanthracene compound and
(b) a light-emitting second anthracene compound having amino substitution at the 2,6-positions, represented by Formula [5]:

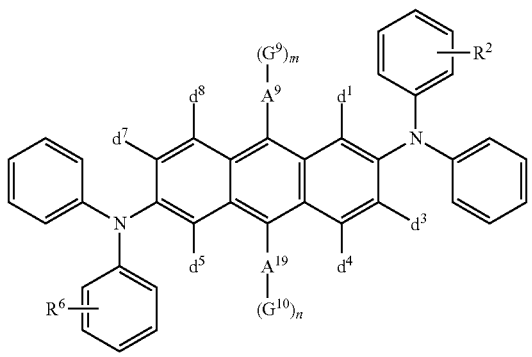

wherein:
$d^1$, $d^3$-$d^5$ and $d^7$-$d^8$ each represent hydrogen;
substituents $A^9$ and $A^{16}$ are phenyl rings;
substituents $R^2$ and $R^6$ independently represent hydrogen or an alkyl group comprising from 1 to 10 carbon atoms;
m and n are independently 1;
substituents $G^9$ and $G^{10}$ are independently substituted or unsubstituted phenyl rings;
substituent $G^9$ is joined together with substituent $A^9$ to form an additional fused ring group.

* * * * *